(12) United States Patent
Oh et al.

(10) Patent No.: US 11,183,620 B2
(45) Date of Patent: Nov. 23, 2021

(54) LIGHT EMITTING DIODE HAVING A PLURALITY OF LIGHT EMITTING CELLS

(71) Applicants: SEOUL VIOSYS CO., LTD., Gyeonggi-do (KR); SEOUL VIOSYS CO., LTD., Gyeonggi-do (KR)

(72) Inventors: Se Hee Oh, Gyeonggi-do (KR); Hyun A Kim, Gyeonggi-do (KR); Jong Kyu Kim, Gyeonggi-do (KR); Jong Hyeon Chae, Gyeonggi-do (KR)

(73) Assignee: SEOUL VIOSYS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/424,178

(22) Filed: May 28, 2019

(65) Prior Publication Data

US 2019/0280178 A1  Sep. 12, 2019

Related U.S. Application Data

(63) Continuation of application No. PCT/KR2017/012294, filed on Nov. 2, 2017.

(30) Foreign Application Priority Data

Nov. 30, 2016 (KR) ........................ 10-2016-0161006
Feb. 9, 2017 (KR) ........................ 10-2017-0017980
Oct. 27, 2017 (KR) ........................ 10-2017-0141407

(51) Int. Cl.
*H01L 33/62* (2010.01)
*H01L 33/32* (2010.01)
(Continued)

(52) U.S. Cl.
CPC .............. *H01L 33/62* (2013.01); *H01L 33/08* (2013.01); *H01L 33/10* (2013.01); *H01L 33/32* (2013.01);
(Continued)

(58) Field of Classification Search
CPC ....... H01L 33/08; H01L 33/38; H01L 33/382; H01L 33/405; H01L 33/60; H01L 33/44; H01L 27/15; H01L 27/153; H01L 27/156
See application file for complete search history.

(56) References Cited

U.S. PATENT DOCUMENTS

2011/0266579 A1* 11/2011 Nagai .................. H01L 27/156
257/98
2012/0049236 A1* 3/2012 Kamiya ............... H01L 33/382
257/99
(Continued)

FOREIGN PATENT DOCUMENTS

KR    10-1115535 B1    1/2008
KR    10-1423717 B1    3/2013
(Continued)

OTHER PUBLICATIONS

International Search Report for International Application PCT/KR2017/012294, dated Feb. 9, 2018.
(Continued)

*Primary Examiner* — Jesse Y Miyoshi
(74) *Attorney, Agent, or Firm* — Burris Law, PLLC

(57) ABSTRACT

A light emitting diode having a plurality of light emitting cells is provided. The light emitting diode according to an exemplary embodiment includes a lower insulation layer covering an ohmic reflection layer, connectors disposed on the lower insulation layer to connect the light emitting cells, and an upper insulation layer covering the connectors and the lower insulation layer. An edge of the lower insulation layer is spaced apart farther from an edge of the upper insulation layer than an edge of the light emitting cell. The lower insulation layer susceptible to moisture may be protected and reliability of the light emitting diode may improve.

18 Claims, 35 Drawing Sheets

(51) Int. Cl.
*H01L 33/10* (2010.01)
*H01L 33/64* (2010.01)
*H01L 33/44* (2010.01)
*H01L 33/08* (2010.01)
*H01L 33/38* (2010.01)
*H01L 33/40* (2010.01)
*H01L 33/60* (2010.01)
*F21S 41/141* (2018.01)
*F21Y 115/10* (2016.01)

(52) U.S. Cl.
CPC .......... *H01L 33/382* (2013.01); *H01L 33/405* (2013.01); *H01L 33/44* (2013.01); *H01L 33/60* (2013.01); *H01L 33/64* (2013.01); *F21S 41/141* (2018.01); *F21Y 2115/10* (2016.08); *H01L 2933/0066* (2013.01)

(56) References Cited

U.S. PATENT DOCUMENTS

2015/0333241 A1 11/2015 Chen et al.
2017/0186915 A1* 6/2017 Emura .................... H01L 33/62

FOREIGN PATENT DOCUMENTS

KR 10-2091842 B1 2/2015
KR 1020160036862 4/2016

OTHER PUBLICATIONS

First Exam Report issued in corresponding IN Application 201917013724, dated Feb. 8, 2021.

* cited by examiner

LIGHT EMITTING DIODE HAVING A PLURALITY OF LIGHT EMITTING CELLS

PRIORITY

The present application is a continuation of PCT Application No. PCT/KR2017/012294, filed Nov. 2, 2017, which claims priority to Korean Application No. 10-2017-0141407, filed Oct. 27, 2017, Korean Application No. 10-2017-0017980, filed Feb. 9, 2017 and Korean Application No. 10-2016-0161006, filed Nov. 30, 2016, all of which are hereby incorporated in their entirety by reference.

TECHNICAL FIELD

The present disclosure relates to a light emitting diode, more specifically to a light emitting diode having a plurality of light emitting cells.

BACKGROUND

Generally, group III-based nitrides, such as gallium nitride (GaN), aluminum nitride (AlN), and the like, have been spotlighted as materials for light sources in the visible light range and the ultraviolet light range. Particularly, blue and green light emitting diodes using indium gallium nitride (InGaN) are used in various fields including large full color flat panel displays, signal lamps, interior lighting, high density light sources, high resolution output systems, optical communication, and the like.

Light emitting diodes are generally used in the form of a package fabricated through a packaging process. In recent years, however, various studies have been made to develop a chip-scale package type light emitting diode, for which the packaging process is performed at a chip level. Such a light emitting diode has a smaller size than typical packages and does not require a separate packaging process, thereby reducing in time and cost through process simplification. The chip-scale package type light emitting diode generally has a flip chip-shaped electrode structure and can dissipate heat through bump pads to secure good heat dissipation.

Meanwhile, a light emitting diode including a plurality of light emitting cells connected to each other in series has been developed in the related art. Such a light emitting diode can reduce the droop phenomenon through operation of a single light emitting diode at a higher voltage and a lower current.

However, a morphology of a substrate formed by the light emitting cell may influence connectors that connect a plurality of light emitting cells in series and thus, the connectors may experience disconnection. Damaged connectors may experience moisture penetration from the outside.

In addition, since each bump pad is electrically connected to one of the light emitting cells connected in series, heat dissipation from the rest of the light emitting cells may be limited because the bump pads are not electrically connected to such light emitting cells.

Further, when the bump pads are disposed over the light emitting cells that are not electrically connected, a high potential difference may be generated between the bump pad and electrodes of the light emitting cell, thereby causing a device failure such as insulation breakdown.

SUMMARY

Exemplary embodiments of the present disclosure provide a light emitting diode having a plurality of light emitting cells connected in series and improved reliability.

Exemplary embodiments of the present disclosure provide a flip-chip shaped light emitting diode having a plurality of light emitting cells in the form of a chip scale package.

Exemplary embodiments of the present disclosure provide a light emitting diode capable of preventing damage to connectors formed along a morphology of a substrate formed by light emitting cells.

Exemplary embodiments of the present disclosure provide a light emitting diode having high reliability and high light extraction efficiency.

Exemplary embodiments of the present disclosure provide a light emitting diode capable of effectively preventing diffusion of a bonding material such as solder without complicated change of a structure of the light emitting diode, thereby improving reliability.

Exemplary embodiments of the present disclosure provide a light emitting diode having a plurality of light emitting cells connected in series and improved in heat dissipation performance.

Exemplary embodiments of the present disclosure provide a flip-chip shaped light emitting diode in the form of a chip scale package capable of preventing insulation breakdown by adjusting a potential difference between light emitting cells and bump pads.

In accordance with one exemplary embodiment of the present disclosure, a light emitting diode includes: a substrate; a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having a first opening exposing the first conductivity type semiconductor layer and a second opening exposing the ohmic reflection layer of each of the light emitting cells; one or more connectors disposed on the lower insulation layer and electrically connecting adjacent light emitting cells to each other to form a series array of light emitting cells; a first pad metal layer electrically connected to the first conductivity type semiconductor layer of a last light emitting cell disposed at a last terminal of the series array through the opening of the lower insulation layer; a second pad metal layer electrically connected to the ohmic reflection layer of a first light emitting cell disposed at a first terminal of the series array through the opening of the lower insulation layer; an upper insulation layer covering the one or more connectors and the first and second pad metal layers, the upper insulation layer having a plurality of openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the one or more connectors comprise a first connector associated with the first light emitting cell which is connected in series with a second light emitting cell and the first connector passes one edge of the first light emitting cell and extends to an upper region of the second light emitting cell adjacent to the first light emitting cell.

In accordance with another exemplary embodiment of the present disclosure, a light emitting diode includes: a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having a first opening exposing the first conductivity type semiconductor layer and a second opening exposing the ohmic reflection layer of each of the light emitting cells; a plurality of connectors disposed on the lower insulation layer and electrically connecting adjacent light emitting cells to each other to form a series array of light emitting cells; wherein the plurality of light emitting cells comprises a first light emitting cell disposed at the first terminal of the series array and a last light emitting cell disposed at the last terminal of the series array; a first pad metal layer electrically connected to the first conductivity type semiconductor layer of the last light emitting cell through the first opening of the lower insulation layer; a second pad metal layer electrically connected to the ohmic reflection layer of a first light emitting cell through the second opening of the lower insulation layer; an upper insulation layer covering the connectors, and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein each of the light emitting cells at least partially overlaps at least one of the first and second bump pads, a potential difference between one of the first conductivity type semiconductor layer and the second conductivity type semiconductor layer of each light emitting cell and an overlapping bump pad of each light emitting cell is 5 Vf or less, and, herein, Vf is a value obtained by dividing a forward voltage applied between the first bump pad and the second bump pad by the number of light emitting cells.

In accordance with another exemplary embodiment of the present disclosure, a light emitting diode includes: seven or eight light emitting cells each including a first conductivity type semiconductor layer, an active layer, and a second conductivity type semiconductor layer; a lower insulation layer covering the light emitting cells; connectors disposed on the lower insulation layer and electrically connected to the light emitting cells through openings of the lower insulation layer to electrically connect adjacent light emitting cells in series; an upper insulation layer covering the connectors; and a first bump pad and a second bump pad disposed on the upper insulation layer and electrically connected to one of the light emitting cells, respectively, wherein each of the light emitting cells at least partially overlaps one of the first and second bumps, and the first bump pad and the second bump pad are disposed over three or four light emitting cells connected in series, respectively.

In accordance with another exemplary embodiment of the present disclosure, a light emitting diode includes: a substrate; a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having opening exposing the first conductivity type semiconductor layer and the ohmic reflection layer of each of the light emitting cells; a connector(s) disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to the ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the light emitting cells include a light emitting cell having an edge disposed near one edge of the substrate, a portion of an edge of the upper insulation layer is placed between one edge of the substrate and the edge of the light emitting cell, and a portion of an edge of the lower insulation layer is placed on the light emitting cell.

According to embodiments of the present disclosure, a plurality of light emitting cells may be connected in series by using a connector(s), and in particular, the connector(s) may extend through one edge of the light emitting cells to an adjacent light emitting cell, thereby minimizing a weak portion of the connector(s). As a result, reliability of a light emitting diode may be improved.

Further, it is possible to provide a flip chip-shaped light emitting diode in the form of a chip scale package having a plurality of light emitting cells by sealing the light emitting cells with a lower semiconductor layer and an upper semiconductor layer and disposing first and second bump pads.

In addition, with the structure where the bump pads are disposed over each of the light emitting cells, heat generated in the plurality of light emitting cells may be dissipated using the bump pads, thereby improving the heat dissipation characteristics of the light emitting diode. Further, by controlling a potential difference between the bump pad and the light emitting cells, it is possible to prevent a device failure due to the insulation breakdown, thereby improving the reliability of the flip chip-shaped light emitting diode in the form of a chip scale package.

Further, with the structure where a lower insulation layer is disposed apart from an edge of an upper insulation layer, damage to the light emitting diode may be prevented even when the lower insulation layer vulnerable to moisture or the like is used.

Other advantages and effects of the exemplary embodiments of the present disclosure will become apparent from the following detailed description.

BRIEF DESCRIPTION OF THE DRAWINGS

FIGS. 4A, 5A, 6A, 7A, 8A and 9A illustrate plan views

DETAILED DESCRIPTION OF THE EMBODIMENTS

Figure 1:
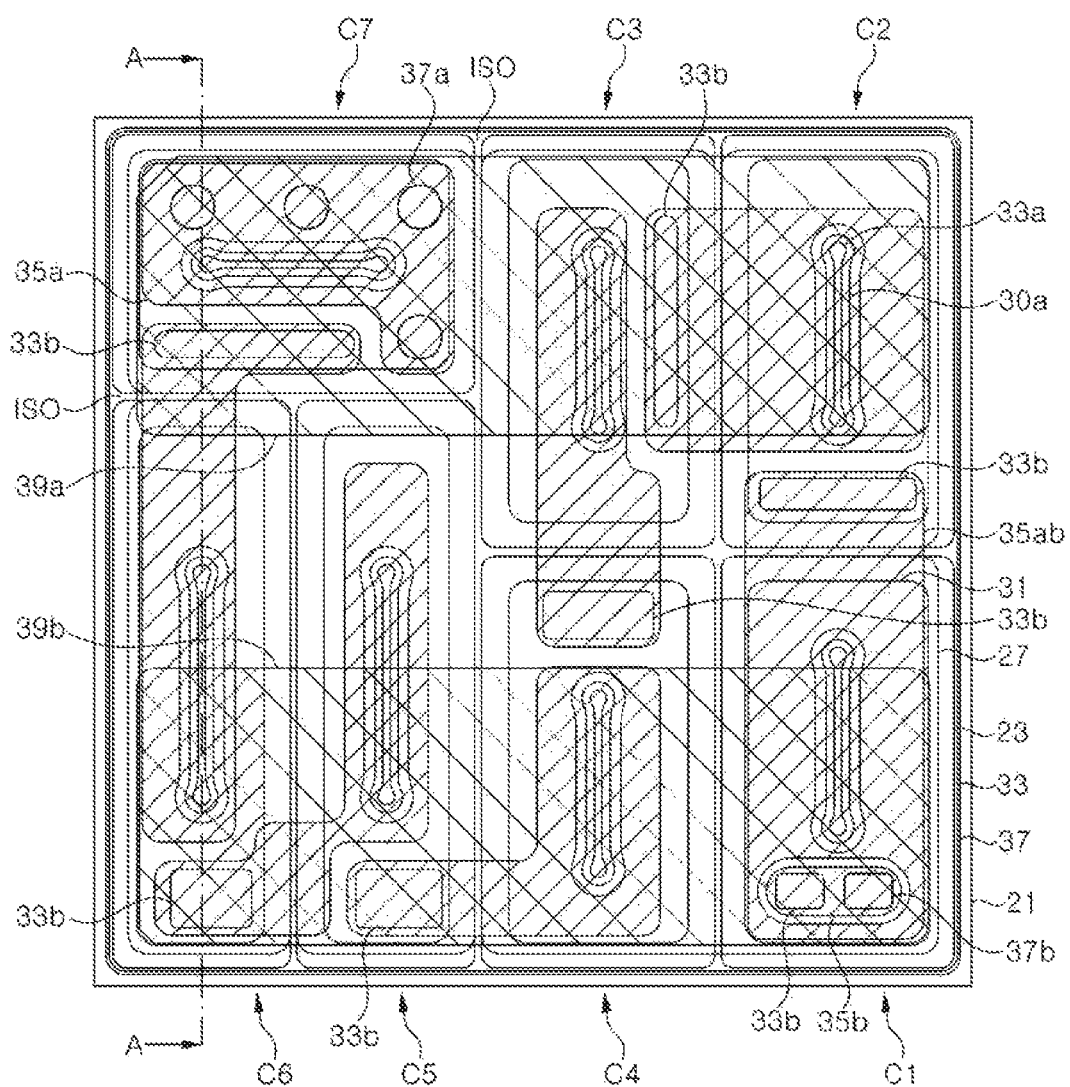
FIG. 1 is a schematic plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In accordance with one exemplary embodiment of the present disclosure, a light emitting diode includes: a substrate; a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having a first opening exposing the first conductivity type semiconductor layer and a second opening exposing the ohmic reflection layer of each of the light emitting cells; one or more connectors disposed on the lower insulation layer and electrically connecting adjacent light emitting cells to each other to form a series array of light emitting cells; a first pad metal layer electrically connected to the first conductivity type semiconductor layer of a last light emitting cell disposed at the last terminal of the series array through the opening of the lower insulation layer; a second pad metal layer electrically connected to the ohmic reflection layer of a first light emitting cell disposed at a first terminal of the series array through the opening of the lower insulation layer; an upper insulation layer covering the connector(s) and the first and second pad metal layers, the upper insulation layer having a plurality of openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the one or more connectors comprise a first connector associated with the first light emitting cell which is connected in series with a second light emitting cell and the first connector passes one edge of the first light emitting cell and extends to an upper region of the second light emitting cell adjacent to the first light emitting cell.

With the structure where the plurality of light emitting cells is disposed on the substrate and openings are formed in the lower insulation layer, the lower insulation layer has various morphologies. Particularly, a serious elevation difference in regions between the light emitting cells or in edge regions of the light emitting cells may occur. The connectors are formed on these morphologies, and thus have elevation differences according to their location. The exemplary embodiment of the present disclosure ensures the reliability of the light emitting diode by getting the connectors having various elevations not to pass through other edges of the light emitting cell excluding a minimum segment necessary for the function as the connectors.

The first pad metal layer may be disposed within an upper region of the last light emitting cell, and the second pad metal layer may be disposed within an upper region of a first light emitting cell. Furthermore, the second pad metal layer may be surrounded by a connector electrically connected to the first conductivity type semiconductor layer of the first light emitting cell. In addition, the connector(s) may be formed of the same material and be placed at the same level as the first and second pad metal layers.

Herein, the "same level" means the same process step rather than the same elevation. In one embodiment, the connector and the first and second pad metal layers are formed on the same morphology of the substrate after the morphology of the substrate is determined. Accordingly, the connectors and the first and second pad metal layers can be regarded as being placed at the same level so long as the connector and the first and second pad metal layers can be formed by the same process despite different elevations thereof. Accordingly, a certain portion may be formed at a lower location or a higher location than other portions. After the lower insulation layer is formed, the connector(s) and the first and second pad metal layers may be formed substantially at the same time by the same process, and thus are placed at the same level.

In some exemplary embodiments, the connector(s) may be electrically connected to the first conductivity type semiconductor layer of one light emitting cell and may be divided into at least two segments to pass through an upper edge of the first conductivity type semiconductor layer. The two segments may be electrically connected to an ohmic reflection layer of an adjacent light emitting cell in the separated state, respectively. Alternatively, the two segments may be joined together to electrically connect to the ohmic reflection layer of the adjacent light emitting cell.

The openings of the lower insulation layer exposing the ohmic reflection layer may be spaced apart from the openings of the upper insulation layer exposing the second pad metal layer in the lateral direction so as not to overlap each other. Accordingly, it is possible to block solders from diffusing into the ohmic reflection layer upon mounting of the first and second bump pads on a submount or a printed circuit board via the solders.

The ohmic reflection layer may be formed of only a metal layer without being limited thereto. For example, the ohmic reflection layer may include a transparent ohmic contact layer; a transparent insulation layer covering the ohmic contact layer and having openings exposing the ohmic contact layer; and a metal reflection layer disposed on the transparent insulation layer and connected to the ohmic contact layer through the openings.

In some exemplary embodiments, the first bump pad and the second bump pad may be disposed over upper regions of two or more light emitting cells, respectively. Accordingly, the first and second bump pads may be formed in a relatively large size to facilitate mounting of the light emitting diode.

In other exemplary embodiments, the first bump pad and the second bump pad may be limitedly disposed over one light emitting cell, respectively.

In some exemplary embodiments, at least one light emitting cell may include a via-hole formed through the second conductivity type semiconductor layer and the active layer to expose the first conductivity type semiconductor layer, and the connector may be electrically connected to the first conductivity type semiconductor layer of the light emitting cell through the via-hole.

In other exemplary embodiments, a first conductivity type semiconductor layer of at least one light emitting cell may have a region exposed around the second conductivity type semiconductor layer and the active layer, and the connector may be electrically connected to the exposed region.

The upper insulation layer may cover a region between an edge of the substrate and the light emitting cells and a distance from an edge of the upper insulation layer to the connector may be 15 μm or more. With the structure where the connector is sufficiently spaced apart from the edge of the upper insulation layer, the light emitting diode may protect the connector from moisture penetration through the edge of the upper insulation layer.

Meanwhile, the light emitting diode may further include at least one floating reflection layer disposed on the lower insulation layer and covered by the upper insulation layer, wherein each floating reflection layer is insulated from the first pad metal layer, the second pad metal layer and the connector(s). With the floating reflection layer, the light emitting diode may improve light extraction efficiency by reflecting light generated from the active layer.

Herein, the "floating" reflection layer means that the metal layer is electrically insulated from metallic material layers, such as the first and second pad metal layers and the connector, which form a current path. The floating reflection layer is also insulated from a semiconductor stack and the ohmic reflection layer by the lower insulation layer.

The at least one floating reflection layer may be formed of the same material as the connector and the first and second pad metal layers. Further, the floating reflection layer may be placed at the same level as the connector, the first and second pad metal layers.

Furthermore, the at least one floating reflection layer may include a floating reflection layer covering a region between two adjacent light emitting cells. The region between two adjacent light emitting cells exhibits a relatively high elevation difference on the substrate, and thus the connectors are susceptible to be damaged when the connectors are formed. However, by arranging the electrically floating reflection layer at a location where the morphology is significant, it is possible to prevent damage to the connector while reflecting light.

Meanwhile, the connector(s) may be electrically connected to the first conductivity type semiconductor layer of one light emitting cell, and may be divided into at least two segments to pass through an upper edge of the first conductivity type semiconductor layer. The floating reflection layer covering the region between the two light emitting cells may be disposed between the two segments.

In some exemplary embodiments, the at least one floating reflection layer may include a floating reflection layer disposed along an edge of the substrate and covering the first conductivity type semiconductor layer of at least one light emitting cell. Furthermore, the floating reflection layer disposed along the edge of the substrate may surround three sides of any one of the light emitting cells.

In addition, the floating reflection layer disposed along the edge of the substrate may be arranged in a ring shape along the edge of the substrate to surround the plurality of light emitting cells on the substrate.

The connector(s) may directly contact the first conductivity type semiconductor layer and the ohmic reflection layer exposed through the opening of the lower insulation layer. Accordingly, a lower surface of the connector(s) is not flat and has protrusions.

The lower insulation layer may have morphologies different in elevation depending on locations by the light emitting cells, and the connector(s) may be arranged to have different elevations along a morphology of the lower insulation layer. In addition, a portion electrically connected to the first conductivity type semiconductor layer among portions of the connector(s) may be placed at a lowest elevation.

In accordance with another exemplary embodiment of the present disclosure, a light emitting diode includes: a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having openings exposing the first conductivity type semiconductor layer and the ohmic reflection layer of each of the light emitting cells; a plurality of connectors disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to the ohmic reflection layer of a first light emitting cell disposed at the first terminal of the series array through the opening of the lower insulation layer; an upper insulation layer covering the connectors, and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein each of the light emitting cells at least partially overlaps at least one of the first and second bump pads, a potential difference between the first conductivity type semiconductor layer and the second conductivity type semiconductor layer of each light emitting cell and the bump pad overlapping the corresponding light emitting cell among the first and second bump pads is 5 Vf or less, and, herein, Vf is a value obtained by dividing a forward voltage applied between the first bump pad and the second bump pad by the number of light emitting cells.

A forward voltage of the light emitting diode means a voltage applied between the first bump pad and the second bump pad at a specific driving current for driving the light emitting diode. The forward voltage of the light emitting diode in which the plurality of light emitting cells are connected in series can be represented by a sum of a voltage drop between electrodes connected to the light emitting cells and a voltage drop by the connectors connecting adjacent light emitting cells. However, the voltage drop by the connectors is considerably weaker than the voltage drop between the electrodes connected to the respective light emitting cells, and may be ignored. Accordingly, a potential difference between the first bump pad and the second bump pad can be represented by the sum of the voltage drops by the respective light emitting cells, and an average value of the voltages applied between the electrodes of one light emitting cell can be regarded as Vf. The voltage drop by one light emitting cell is generally about 3V, and thus 5 Vf may be about 15V. Actually, Vf may be obtained by measuring a voltage applied between the first bump pad and the second bump pad under a driving current for driving the light emitting diode, and dividing the voltage by the number of the light emitting cells.

Meanwhile, with the structure where the bump pads are arranged to overlap with each light emitting cell, heat may be dissipated from all the light emitting cells through the bump pads. Furthermore, by controlling the potential difference between each light emitting cell and the bump pads, it is possible to prevent the insulation breakdown of the lower insulation layer and the upper insulation layer, thereby improving the electrical reliability of the light emitting diode.

Each of the first and second bump pads may be disposed over at least two light emitting cells. Accordingly, heat generated from the light emitting cells may be distributed to the first and second bump pads instead of being concentrated on one bump pad. In addition, the first and second bump pads may be formed in a relatively large size to facilitate mounting of the light emitting diode.

In some exemplary embodiments, one of the first and second bump pads may be disposed over four different light emitting cells.

In addition, a potential difference between one of the first conductivity type semiconductor layer and the second conductivity type semiconductor layer of each light emitting cell and the overlapping bump pad may be 4 Vf or less. Furthermore, the number of the plurality of light emitting cells may be seven or eight, and the first bump pad and the second bump pad may be disposed over different light emitting cells, respectively.

The first pad metal layer may be disposed within an upper region of the last light emitting cell and the second pad metal layer may be disposed within an upper region of the first light emitting cell.

In some exemplary embodiments, the second pad metal layer may be surrounded by a connector associated with the first light emitting cell.

The connectors, the first and second pad metal layers may be formed of the same material and placed at the same level.

In particular, the connectors and the first and second pad metal layers may include portions disposed in an upper region of the ohmic reflection layer, and, in this case, they may be placed at the same elevation.

The openings of the lower insulation layer exposing the ohmic reflection layer may be spaced apart from the openings of the upper insulation layer exposing the second pad metal layer in the lateral direction so as not to overlap each other. Accordingly, it is possible to efficiently block solders from diffusing into the ohmic reflection layer upon mounting of the first and second bump pads on a submount or a printed circuit board via the solders.

In some exemplary embodiments, at least one light emitting cell may include a via-hole formed through the second conductivity type semiconductor layer and the active layer to expose the first conductivity type semiconductor layer, and the one or more connectors associated with the at least one light emitting cell are be electrically connected to the first conductivity type semiconductor layer of the light emitting cell through the via-hole.

The upper insulation layer may cover a region between an edge of the substrate and the light emitting cells and a distance from an edge of the upper insulation layer to the connector may be 15 μm or more. With the structure where the connector is sufficiently spaced apart from the edge of the upper insulation layer, the light emitting diode can protect the connector from moisture penetration through the edge of the upper insulation layer.

The connectors may directly contact the first conductivity type semiconductor layer and the ohmic reflection layer exposed through the opening of the lower insulation layer.

In one exemplary embodiment, the connectors may contact the first conductivity type semiconductor layers near edges of the light emitting cells.

Further, portions of the first bump pad and the second bump pad may be disposed together over at least one light emitting cell among the plurality of light emitting cells.

In accordance with another exemplary embodiment of the present disclosure, a light emitting diode includes: seven or eight light emitting cells each including a first conductivity type semiconductor layer, an active layer, and a second conductivity type semiconductor layer; a lower insulation layer covering the light emitting cells; connectors disposed on the lower insulation layer and electrically connected to the light emitting cells through openings of the lower insulation layer to electrically connect adjacent light emitting cells in series; an upper insulation layer covering the connectors; and a first bump pad and a second bump pad disposed on the upper insulation layer and electrically connected to one of the light emitting cells, respectively, wherein each of the light emitting cells at least partially overlaps one of the first and second bumps, and the first bump pad and the second bump pad are disposed over a first group of three or four light emitting cells connected in series, and the second bump pad is disposed over a second group of three or four light emitting cells connected in series.

Furthermore, a potential difference between one of the first conductivity type semiconductor layer and the second conductivity type semiconductor layer of each light emitting cell and the first bump pad overlapping the first group of light emitting cells may be 4 Vf or less. Herein, Vf is a value obtained by dividing a forward voltage applied between the first bump pad and the second bump pad by the number of light emitting cells.

Meanwhile, at least one of the light emitting cell of the first group may have a potential difference of 4 Vf from the first bump pad, and the connector connected to the first conductivity type semiconductor layer of at least one corresponding light emitting cell of the first group may be arranged so as not to overlap with the first bump pad and the second bump pad. Accordingly, it is possible to better prevent the insulation breakdown of the upper insulation layer.

In accordance with another exemplary embodiment of the present disclosure, a light emitting diode includes: a substrate; a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layers, the lower insulation layer having openings exposing the first conductivity type semiconductor layer and the ohmic reflection layer of each of the light emitting cells; a connector disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to the ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the light emitting cells include a light emitting cell having an edge disposed near one edge of the substrate, a portion of an edge of the upper insulation layer is placed between one side edge of the substrate and the edge of the light emitting cell near the edge of the substrate, and a portion of an edge of the lower insulation layer is placed on the light emitting cell.

With the structure where an edge of the lower insulation layer is further separated from an edge of the upper insulation layer, the lower insulation layer may be prevented from being damaged due to moisture penetration from the outside, thereby improving the reliability of the light emitting diode.

A portion of the edge of the lower insulation layer may be placed on the first conductivity type semiconductor layer of the light emitting cell. However, the present disclosure is not limited thereto, the portion of the edge of the lower insulation layer may be placed over the second conductivity type semiconductor layer.

Further, an edge of the connector(s) is covered with the lower insulation layer. Accordingly, with the structure where the edge of the connector(s) is also spaced apart from the edge of the upper insulation layer, damage due to moisture or the like may be prevented.

Particularly, the connector(s) may pass only one edge of edges of one light emitting cell and may extend to an upper region of an adjacent light emitting cell.

Meanwhile, the lower insulation layer may include a distributed Bragg reflector. In a case that the lower insulation layer includes the distributed Bragg reflector, it is vulnerable to moisture penetration from the outside. However, with the structure where the lower insulation layer is spaced apart from the edge of the upper insulation layer as in the present embodiment, damage to the lower insulation layer may be prevented.

The ohmic reflection layer includes a transparent ohmic contact layer; a transparent insulation layer covering the ohmic contact layer and having openings exposing the ohmic contact layer; and a metal reflection layer disposed on the transparent insulation layer and connected to the ohmic contact layer through the openings. With this structure, the reflectance of the ohmic reflection layer may be further increased, thereby improving the luminous efficacy of the light emitting diode.

Further, the transparent insulation layer may include a recessed region, and the metal reflection layer may be disposed in the recessed region. Moreover, the metal reflection layer may be disposed within an upper region of the recessed region.

Hereinafter, exemplary embodiments of the present disclosure will be described in detail with reference to the accompanying drawings.

First Embodiment

Figure 2:
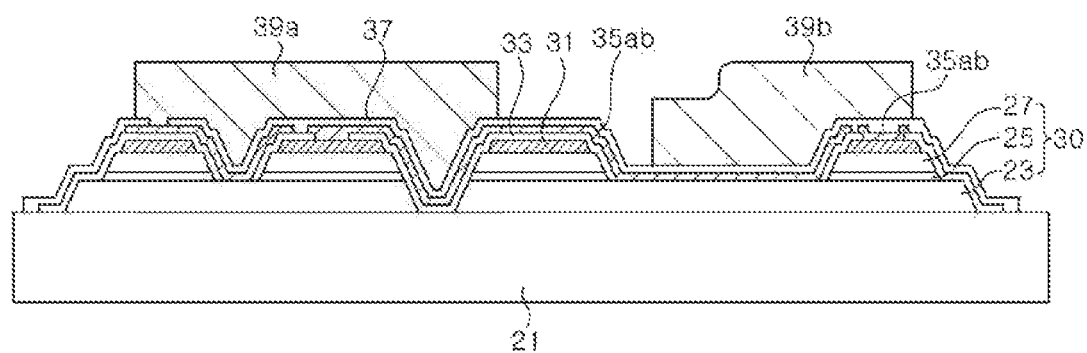
FIG. 2 is a schematic cross-sectional view taken along the line A-A of FIG. 1.
Figure 3:
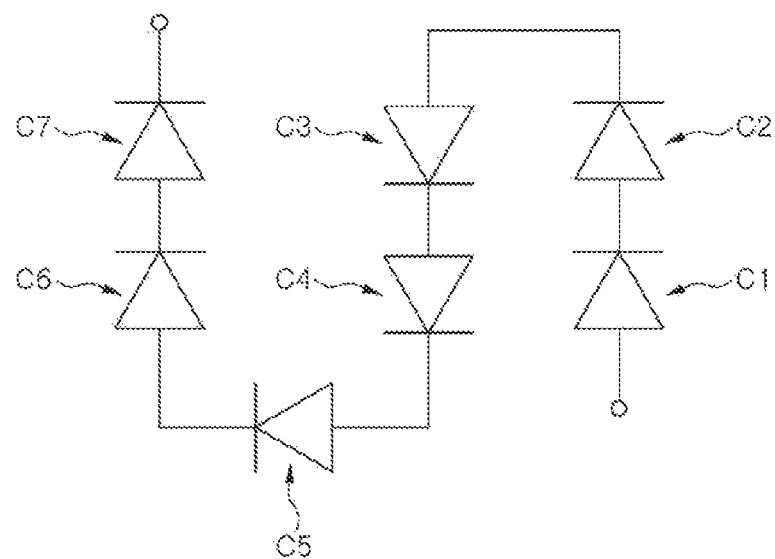
FIG. 3 is a schematic circuit diagram of the light emitting diode of FIG. 1.

FIG. 1 is a schematic plan view of a light emitting diode according to a first exemplary embodiment of the present disclosure, FIG. 2 is a schematic cross-sectional view taken along the line A-A of FIG. 1, and FIG. 3 is a schematic circuit diagram of the light emitting diode of FIG. 1.

Referring to FIG. 1, FIG. 2 and FIG. 3, the light emitting diode includes a substrate 21, a plurality of light emitting cells C1 to C7, an ohmic reflection layer 31, a lower insulation layer 33, a first pad metal layer 35a, a second pad metal layer 35b, connectors 35ab, an upper insulation layer 37, a first bump pad 39a, and a second bump pad 39b. Each of the light emitting cells C1 to C7 includes a semiconductor stack 30 which includes a first conductivity type semiconductor layer 23, an active layer 25, and a second conductivity type semiconductor layer 27.

The substrate 21 may be selected from any substrates suitable for growth of gallium nitride semiconductor layers thereon. The substrate 21 may include, for example, a sapphire substrate, a gallium nitride substrate, a SiC substrate, or others, and may be a patterned sapphire substrate. The substrate 21 may have a rectangular or square shape, as shown in FIG. 1, without being limited thereto. The size of the substrate 21 is not particularly limited and various dimensions are available.

The light emitting cells C1 to C7 are disposed apart from each other on the substrate 21. Although seven light emitting cells C1 to C7 are shown in the first embodiment, the first embodiment is not limited thereto and a light emitting cells number may be adjusted.

Each of the light emitting cells C1 to C7 includes the first conductivity type semiconductor layer 23. The first conductivity type semiconductor layer 23 is disposed on the substrate 21. The first conductivity type semiconductor layer 23 may be a gallium nitride semiconductor layer grown on the substrate 21 and doped with dopants, for example Si.

The active layer 25 and the second conductivity type semiconductor layer 27 are disposed on the first conductivity type semiconductor layer 23. The active layer 25 is interposed between the first conductivity type semiconductor layer 23 and the second conductivity type semiconductor layer 27. The active layer 25 and the second conductivity type semiconductor layer 27 may have a smaller area than the first conductivity type semiconductor layer 23. The active layer 25 and the second conductivity type semiconductor layer 27 may be formed in a mesa shape on the first conductivity type semiconductor layer 23 through mesa etching. In other embodiments, other shapes are available and vary based on etching methods.

Among edges of the light emitting cells C1 to C7, some edges of the light emitting cells C1 to C7 are adjacent to an edge of the substrate 21. With respect to the light emitting cells having the edges adjacent to the edge of the substrate 21, an edge of the first conductivity type semiconductor layer 23 may be spaced apart from an edge of the mesa, for example, from the edges of the active layer 25 and the second conductivity type semiconductor layer 27. That is, an upper surface of the first conductivity type semiconductor layer 23 is partially exposed outside the mesa. The active layer 25 is spaced apart farther from the edge of the substrate 21 than the first conductivity type semiconductor layer 23, and thus potential damage may be prevented during a process of separating the substrate with laser beams.

Meanwhile, with respect to the light emitting cells having the edges adjacent to the edge of the substrate 21, the edge of the first conductivity type semiconductor layer 23 and the edges of the active layer 25 and the second conductivity type semiconductor layer 27 may be placed on the same inclined surface toward the edge of the substrate 21. Accordingly, the upper surface of the first conductivity type semiconductor layer 23 may not be exposed on a side where the light emitting cells face each other. As a result, light emitting areas of the light emitting cells C1 to C7 may be secured.

The active layer 25 may have a single quantum well structure or, alternatively, a multiple-quantum well structure. In the active layer 25, the compositions and thicknesses of well layers determine the wavelength of light generated in the active layer. In particular, the active layer can generate UV light, blue light or green light through adjustment of the compositions of the well layers.

The second conductivity type semiconductor layer 27 may be a gallium nitride semiconductor layer doped with p-type dopants, for example, Mg. Each of the first conductivity type semiconductor layer 23 and the second conductivity type semiconductor layer 27 may be composed of a single layer or multiple layers and may include super-lattice layers. The first conductivity type semiconductor layer 23, the active layer 25 and the second conductivity type semiconductor layer 27 may be grown on the substrate in a chamber by a well-known method, such as metal organic chemical vapor deposition (MOCVD) or molecular beam epitaxy (MBE).

Each of the light emitting cells C1 to C7 includes via-holes 30a formed through the second conductivity type semiconductor layer 27 and the active layer 25 to expose the first conductivity type semiconductor layer 23. The via-holes 30a are surrounded by the second conductivity type semiconductor layer 27 and the active layer 25. As shown in the drawings, the via-holes 30a may be disposed in a center region of the light emitting cells C1 to C7, and may have an elongated shape. However, this embodiment is not limited thereto, and one or more of the light emitting cells may include a plurality of via-holes.

The ohmic reflection layer 31 is disposed on the second conductivity type semiconductor layer 27 and is electrically connected to the second conductivity type semiconductor layer 27. The ohmic reflection layer 31 may be disposed over substantially the entire region of the second conductivity type semiconductor layer 27 in an upper region thereof. For example, the ohmic reflection layer 31 may cover 80% or more, and more specifically, 90% or more of the upper region of the second conductivity type semiconductor layer 27. Here, in order to prevent damage to the ohmic reflection layer 31 due to moisture penetration through a cell isolation (ISO) region or the edge of the substrate, the edge of the ohmic reflection layer 31 may be disposed farther inside a cell region than the edge of the second conductivity type semiconductor layer 27.

The ohmic reflection layer 31 may include a metal layer having reflectivity and thus may reflect light generated from the active layer 25 and travelling to the ohmic reflection layer 31, toward the substrate 21. For example, the ohmic reflection layer 31 may be composed of a single reflection metal layer, but it is not limited thereto. Alternatively, the ohmic reflection layer 31 may include both an ohmic layer and a reflection layer. The ohmic layer may be a metal layer such as a Ni layer or a transparent oxide layer such as an ITO layer, and the reflection layer may be a metal layer having high reflectance such as an Ag or Al layer.

The lower insulation layer 33 covers the light emitting cells C1 to C7 and the ohmic reflection layer 31. The lower insulation layer 33 may cover not only upper surfaces of the light emitting cells C1 to C7, but also side surfaces of the light emitting cells C1 to C7 along the peripheries thereof, and may partially cover the substrate around the light emitting cells C1 to C7. Particularly, the lower insulation layer 33 may cover a cell isolation (ISO) region between the light emitting cells C1 to C7, and may further cover a portion of the first conductivity type semiconductor layer 23 exposed in the via-holes 30a.

The lower insulation layer 33 includes first openings 33a exposing the first conductivity type semiconductor layer and second openings 33b exposing the ohmic reflection layer 31. The first opening 33a may expose the first conductivity type semiconductor layers 23 in the via-holes 30a, and may also expose an upper surface of the substrate 21 along the edge of the substrate 21.

The second opening 33b is disposed over the ohmic reflection layer 31 to expose the ohmic reflection layer 31. Locations and shapes of the second openings 33b may be modified in various ways for arrangement and electrical connection of the light emitting cells C1 to C7. In addition, although one second opening 33b is disposed on each of the light emitting cells in FIG. 1, it should be understood that a plurality of second openings 33b may be disposed on each of the light emitting cells, as needed.

The lower insulation layer 33 may be formed of a single layer of $SiO_2$ or $Si_3N_4$, without being limited thereto. For example, the lower insulation layer 33 may have a multi-layer structure which includes a silicon oxide layer and a silicon nitride layer, and may include a distributed Bragg reflector in which material layers having different indices of refraction, such as $SiO_2$ layers, $TiO_2$ layers, $ZrO_2$ layers, $MgF_2$ layers, or $Nb_2O_5$ layers, are alternately stacked one above another. In addition, the lower insulation layer 33 may have the same stack structure therethrough. Alternatively, some portion of the lower insulation layer 33 may include more layers than the other portion thereof. Particularly, a portion of the lower insulation layer 33 on the ohmic reflection layer 31 may have a greater thickness than the thickness of a portion of the lower insulation layer 33 around the ohmic reflection layer 31.

Meanwhile, the first pad metal layer 35a, the second pad metal layer 35b, and the connectors 35ab are disposed on the lower insulation layer 33. The second pad metal layer 35b is disposed over a first light emitting cell C1 and the first pad metal layer 35a is disposed over the last light emitting cell, that is, on a seventh light emitting cell C7. The connectors 35ab are disposed over two adjacent light emitting cells and electrically connect the light emitting cells C1 to C7 in series. Accordingly, as shown in FIG. 3, the seven light emitting cells C1 to C7 of FIG. 1 are connected to one another in series by the connectors 35ab to form a series array of light emitting cells. Herein, the first light emitting cell C1 is placed at the first terminal of the series array and the seventh light emitting cell C7 corresponding to the last light emitting cell is placed at the last terminal of the series array.

Referring again to FIG. 1, the first pad metal layer 35a may be limitedly disposed in an upper region of the last light emitting cell C7, specifically in an upper region of the second conductivity type semiconductor layer 27 of the last light emitting cell C7. The first pad metal layer 35a is electrically connected to the first conductivity type semiconductor layer 23 of the last light emitting cell C7 through the first opening 33a of the lower insulation layer 33. The first pad metal layer 35a may directly contact the first conductivity type semiconductor layer 23 through the first opening 33a.

In addition, the second pad metal layer 35b as shown in FIG. 1 may be limitedly disposed in an upper region of the first light emitting cell C1, specifically in an upper region of the second conductivity type semiconductor layer 27 of the first light emitting cell C1. The second pad metal layer 35b is electrically connected to the ohmic reflection layer 31 on the first light emitting cell C1 through the second opening 33b of the lower insulation layer 33. The second pad metal layer 35b may directly contact the ohmic reflection layer 31 through the second opening 33b.

Meanwhile, the second pad metal layer 35b may be surrounded by the connector 35ab, and thus a boundary region surrounding the second pad metal layer 35b may be formed between the second pad metal layer 35b and the connector 35ab. This boundary region exposes the lower insulation layer 33.

The connectors 35ab electrically connect adjacent light emitting cells to each other. In other embodiments, connectors 35ab may electrically connect some of adjacent light emitting cells. Each of the connectors 35ab is electrically connected to the first conductivity type semiconductor layer 23 of one light emitting cell and is also electrically connected to the ohmic reflection layer 31 of another light emitting cell adjacent thereto and thus to the second conductivity type semiconductor layer 27 thereof to connect the light emitting cells to each other in series. Specifically, each of the connectors 35ab may be electrically connected to the first conductivity type semiconductor layer 23 exposed through the first opening 33a of the lower insulation layer 33 and may also be electrically connected to the ohmic reflection layer 31 exposed through the second opening 33b thereof. Furthermore, the connectors 35ab may directly contact the first conductivity type semiconductor layer 23 and the ohmic reflection layer 31.

Each of the connectors 35ab passes the cell isolation (ISO) region between the light emitting cells. In the present embodiment, the connectors 35ab are disposed to be protected from moisture that is externally introduced. In particular, the connectors 35ab are disposed farther from the edge of the substrate 21 than edges of the light emitting cells C1 to C7.

In particular, each of the connectors 35ab may pass an upper region of only one edge of a plurality of edges of the first conductivity type semiconductor layer 23. Accordingly, an area of the connector 35ab disposed on the cell isolation (ISO) region may be reduced. Furthermore, to connect adjacent light emitting cells to each other, all of other segments of the connector 35ab, excluding the segment of the connector 35ab passing the cell isolation (ISO) region, are limitedly disposed over the light emitting cells. For example, each of the light emitting cells C1 to C7 may have a rectangular shape, as shown in FIG. 1, and thus has four edges. The connector 35ab passes an upper region of one light emitting cell at one edge of the four edges thereof and is spaced apart from upper regions of the light emitting cell at the remaining edges.

The cell isolation (ISO) region is a region, in which the substrate 21 is exposed through removal of the semiconductor stack 30 by etching, and which has a greater depth than the light emitting cells C1 to C7 to undergo significant variation in morphology. Accordingly, the lower insulation layer 33 and the connector 35ab covering the cell isolation (ISO) region undergo significant variation in morphology, that is, a significant elevation variation, near the cell isolation (ISO) region. The connector 35ab passes the cell isolation (ISO) region, which undergoes significant variation in morphology, to connect two adjacent light emitting cells. As a result, the connector 35ab may be affected by external environments. Accordingly, reliability of the light emitting diode may be improved by reducing the area of the connector 35ab disposed on the cell isolation (ISO) region. Moreover, the connectors 35ab are spaced apart from the edge of the short substrate 21, which may be a path of moisture penetration from the outside, and damage to the connectors 35ab due to moisture may be prevented.

In some embodiments, the first pad metal layer 35a, the second pad metal layer 35b, and the connectors 35ab may be formed of the same material by the same process substantially at the same time after formation of the lower insulation layer 33, and thus may be placed at the same level. It is not necessarily limited thereto, but each of the first pad metal layer 35a, the second pad metal layer 35b, and the connectors 35ab may include a portion disposed on the lower insulation layer 33.

Each of the first and second pad metal layers 35a, 35b and the connector 35ab may include a reflection layer, such as an Al layer, which may be formed on a bonding layer, such as a Ti, Cr or Ni layer. Further, a protection layer may be formed in a single layer or composite layer structure of Ni, Cr, or Au on the reflection layer. The first and second pad metal layers 35a, 35b and the connectors 35ab may have a multilayer structure of, for example, Cr/Al/Ni/Ti/Ni/Ti/Au/Ti.

The upper insulation layer 37 covers the first and second pad metal layers 35a and 35b and the connectors 35ab. In addition, the upper insulation layer 37 may cover an edge of the lower insulation layer 33 along the periphery of each of the light emitting cells C1 to C7. However, the upper insulation layer 37 may expose the upper surface of the substrate 21 along the edge of the substrate 21. Accordingly, an edge of the upper insulation layer 37 is disposed between the edges of the light emitting cells and the edge of the substrate 21. Meanwhile, a shortest distance from the edge of the upper insulation layer 37 to the connector 35ab is set to be as long as possible so as to prevent damage to the connectors 35ab due to moisture penetration, and may be about 15 μm or more. If the shortest distance therebetween is less than about 15 μm, the connectors 35ab are likely to be damaged due to moisture upon operation of the light emitting diode at low current, for example, 25 mA.

The upper insulation layer 37 includes first openings 37a exposing the first pad metal layer 35a and second openings 37b exposing the second pad metal layer 35b. The first openings 37a and the second openings 37b are disposed in upper regions of the last light emitting cell C7 and the first light emitting cell C1, respectively. The other regions of the light emitting cells C1 to C7 excluding the first and second openings 37a and 37b may be covered by the upper insulation layer 37. Accordingly, upper and side surfaces of the connectors 35ab may be covered by the upper insulation layer 37 to be sealed thereby.

In one exemplary embodiment, the second openings 37b of the upper insulation layer 37 are disposed apart from the second openings 33b of the lower insulation layer 33 in the lateral direction so as not to overlap each other, as shown in FIG. 1. With this structure, even when solders enter the second openings 37b of the upper insulation layer 37, the solders may be prevented from diffusing into the second openings 33b of the lower insulation layer 33, thereby preventing contamination of the ohmic reflection layer 31 by the solders. Alternatively, the second openings 37b of the upper insulation layer 37 may be disposed to overlap with the second openings 33b of the lower insulation layer 33.

The upper insulation layer 37 may be formed of a single layer of $SiO_2$ or $Si_3N_4$. Particularly, $Si_3N_4$ layer is excellent in blocking capacity against moisture and is suitable for use as the upper insulation layer 37. However, the present disclosure is not limited to the upper insulation layer 37 of a single layer. For example, the upper insulation layer 37 may have a multilayer structure which includes a silicon oxide layer and a silicon nitride layer, and may include a distributed Bragg reflector in which material layers having different indices of refraction, such as $SiO_2$ layers, $TiO_2$ layers, $ZrO_2$ layers, $MgF_2$ layers, or $Nb_2O_5$ layers, are alternately stacked one above another.

Meanwhile, the first bump pad 39a electrically contacts the first pad metal layer 35a exposed through the first openings 37a of the upper insulation layer 37, and the second bump pad 39b electrically contacts the second pad metal layer 35b exposed through the second openings 37b. As shown in FIG. 1, the first bump pad 39a covers and seals all of the first openings 37a of the upper insulation layer 37, and the second bump pad 39b covers and seals all of the second openings 37b of the upper insulation layer 37.

In addition, the first and second bump pads 39a and 39b may be disposed over the plurality of light emitting cells as shown in FIG. 1. Referring to FIG. 1, the first bump pad 39a is disposed over upper regions of the second, third, fifth, sixth and seventh light emitting cells C2, C3, C5, C6, and C7, and the second bump pad 39b is disposed over upper regions of the first, fourth, fifth, and sixth light emitting cells C1, C4, C5, and C6. Accordingly, it is possible to form the first and second bump pads 39a and 39b relatively large, thereby assisting a mounting process of the light emitting diode. Furthermore, heat generated in each light emitting cell may be dissipated to the outside using the first and second bump pads 39a and 39b.

The first bump pad 39a and the second bump pad 39b are portions of the light emitting diode bonded to a submount or a printed circuit board and are formed of a material suitable for bonding. For example, the first and second bump pads 39a, 39b may include an Au layer or an AuSn layer.

Although the light emitting diode having seven light emitting cells C1 to C7 has been described above, the number of light emitting cells may be larger or smaller. Further, the structure of the light emitting diode will become more apparent through a method of manufacturing the light emitting diode described below.

FIGS. 4A to 9B are plan views and cross-sectional views illustrating a method of manufacturing the light emitting diode according to the first exemplary embodiment of FIG. 1. In each of the drawings, drawings labeled "A" illustrate a plan view and drawings labeled "B" illustrate a cross-sectional view taken along the line A-A of each plan view for convenience of explanation.

Figure 4A:
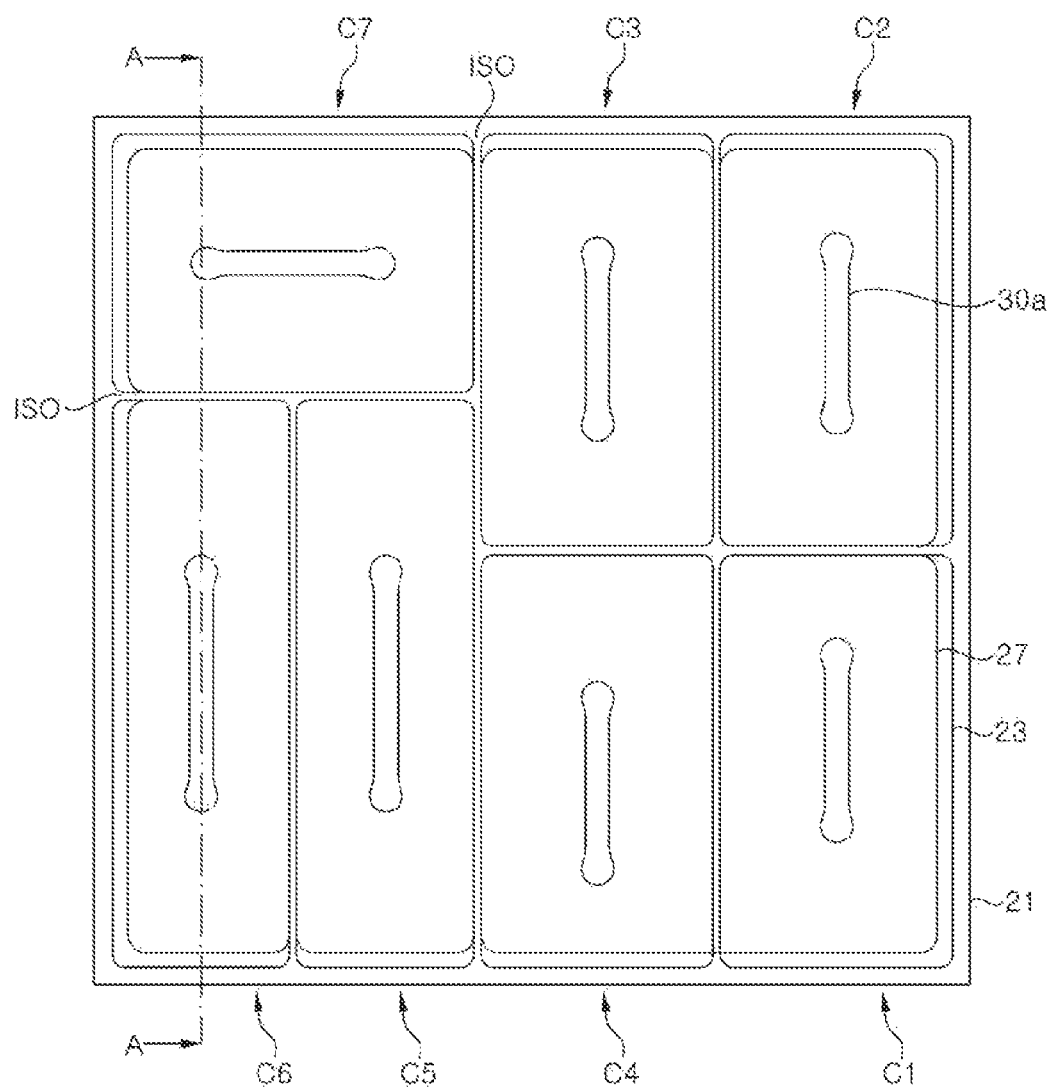
FIGS. 4A, 5A, 6A, 7A, 8A and 9A are plan views and cross-sectional views illustrating different processes of a method of manufacturing the light emitting diode according to a first exemplary embodiment of the present disclosure, where
Figure 4B:
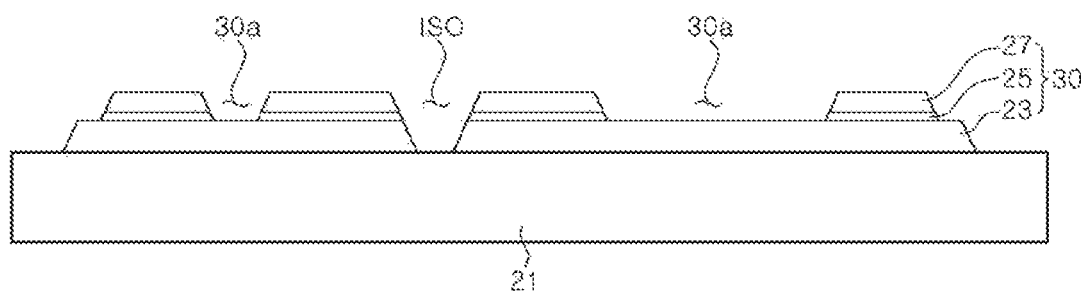
FIGS. 4B, 5B, 6B, 7B, 8B and 9B illustrate cross-sectional views corresponding to FIGS. 4A, 5A, 6A, 7A, 8A and 9A, respectively.

First, referring to FIG. 4A and FIG. 4B, a semiconductor stack 30 including a first conductivity type semiconductor layer 23, an active layer 25 and a second conductivity type semiconductor layer 27 is grown on a substrate 21. The substrate 21 may be selected from any substrates suitable for growth of gallium nitride semiconductor layers thereon and may include, for example, a sapphire substrate, a silicon carbide substrate, a gallium nitride (GaN) substrate, a spinel substrate, and the like. Particularly, the substrate may be a patterned substrate, such as a patterned sapphire substrate.

The first conductivity type semiconductor layer 23 may include, for example, an n-type gallium nitride layer, and the second conductivity type semiconductor layer 27 may include a p-type gallium nitride layer. In addition, the active layer 25 may have a single quantum well structure or a multiple-quantum well structure and may include a well layer and a barrier layer. The composition of the well layer may be determined depending upon the wavelength of light to be emitted and may include, for example, AlGaN, GaN or InGaN.

Then, a plurality of light emitting cells C1 to C7 are formed by patterning the semiconductor stack 30. For example, a mesa formation process to expose an upper surface of the first conductivity type semiconductor layer 23 and a cell separation process to form the cell isolation region ISO may be performed by photolithography and etching.

The light emitting cells C1 to C7 are separated from each other by the cell isolation region ISO and have via-holes 30a, respectively. As shown in FIG. 4B, sidewalls of the cell isolation region ISO and sidewalls of the via-holes 30a may be formed to be inclined.

Meanwhile, an upper surface of the first conductivity type semiconductor layer 23 of each light emitting cell is exposed by the mesa etching process. The via-holes 30a may be formed together in the mesa etching process. However, the upper surface of the first conductivity type semiconductor layer 23 may be exposed in a ring shape along peripheries of the second conductivity type semiconductor layer 27 and the active layer 23, but the present disclosure is not limited thereto. As shown in FIGS. 4A and 4B, the upper surface of the first conductivity type semiconductor layer 23 may be exposed near edges of the light emitting cells C1 to C7 disposed near an edge of the substrate 21. However, the second conductivity type semiconductor layer 27, the active layer 23 and the first conductivity type semiconductor layer 23 may form continuously inclined surfaces near other edges of the first conductivity type semiconductor layer 23, and thus the upper surface of the first conductivity type semiconductor layer 23 may not be exposed. In a certain embodiment, there may be an isolated light emitting cell surrounded by the light emitting cells, wherein edges of the isolated light emitting cell are spaced apart from the edge of the substrate 21. In this case, the first conductivity type semiconductor layer 23 of the isolated light emitting cell may form the continuously inclined surface together with the second conductivity type semiconductor layer 27 and the active layer 25, and may never have the exposed surface near the edge thereof. However, the present disclosure is not limited thereto, and the upper surface of the first conductivity type semiconductor layer 23 may be exposed at the edges of each light emitting cell.

As the plurality of light emitting cells C1 to C7 is formed on the substrate 21 to be separated from each other by the cell isolation (ISO) region, the substrate has morphology with different elevation profiles thereon. In this morphology, an upper surface of the second conductivity type semiconductor layer 27 of each of the light emitting cells has the greatest elevation and the substrate 21 exposed through the cell isolation (ISO) region has the lowest elevation.

Figure 5A:
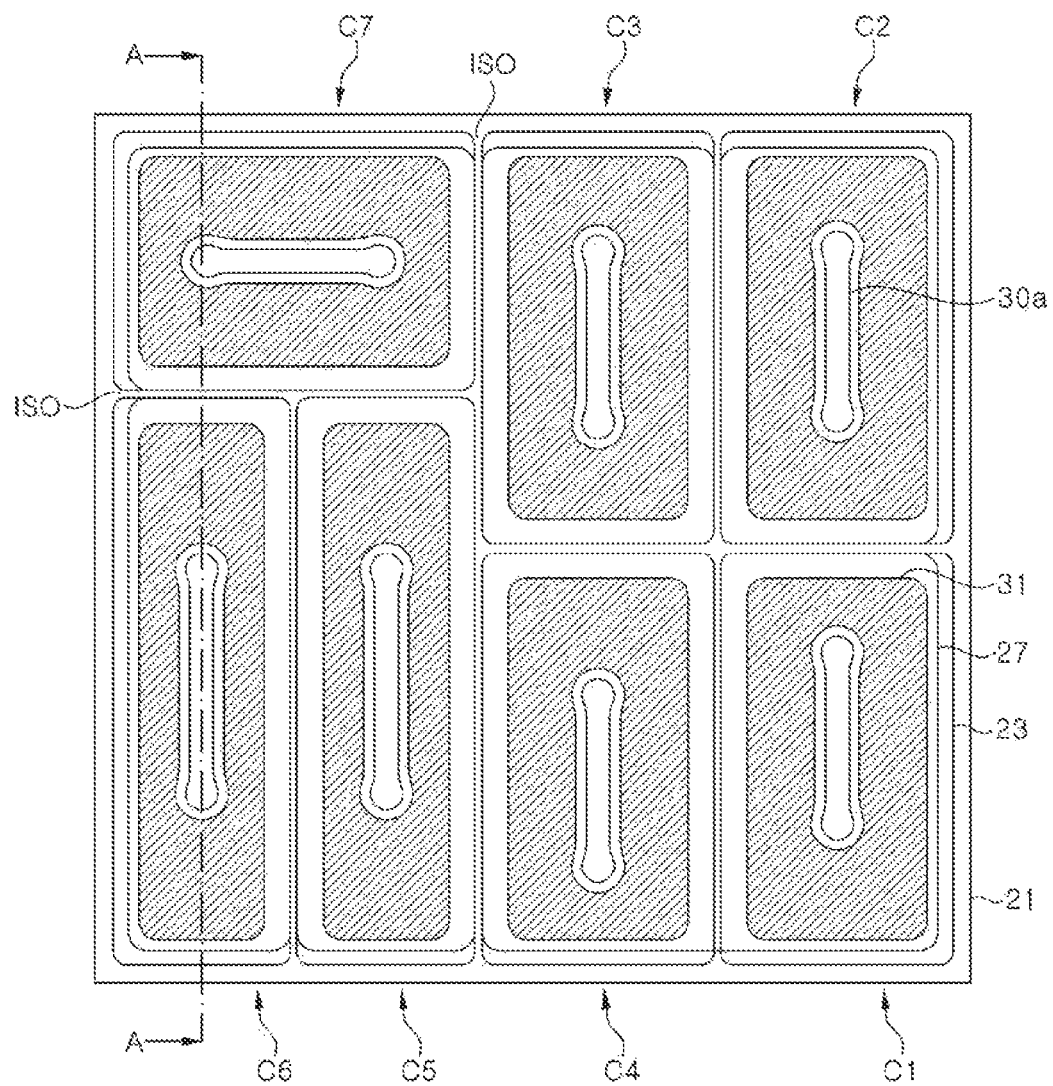
Figure 5B:
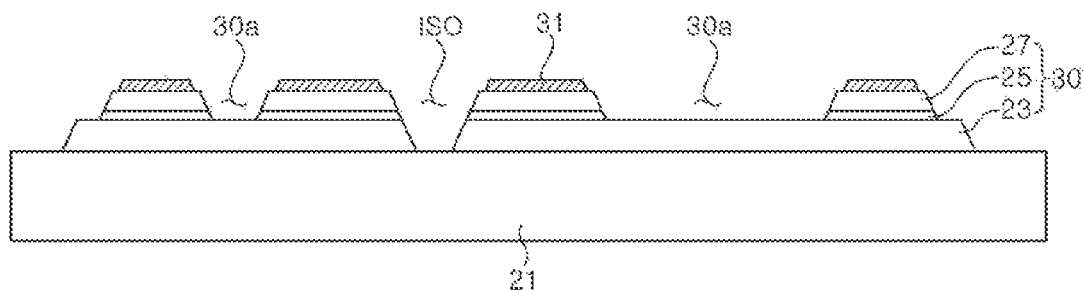

Referring to FIG. 5A and FIG. 5B, ohmic reflection layers 31 are formed on the light emitting cells C1 to C7. The ohmic reflection layer 31 may be formed by, for example, a lift-off technique. The ohmic reflection layer 31 may be composed of a single layer or multiple layers and may include, for example, an ohmic layer and a reflection layer. These layers may be formed by, for example, e-beam evaporation. Before formation of the ohmic reflection layer 31, a preliminary insulation layer (not shown) having openings may be formed in regions in which the ohmic reflection layer 31 will be formed.

Although the ohmic reflection layers 31 are formed after formation of the light emitting cells C1 to C7 in this exemplary embodiment, it is not limited thereto. For example, the ohmic reflection layers 31 may be formed first and then the light emitting cells C1 to C7 may be formed. Further, after a metal layer for the ohmic reflection layer 31 is deposited on the semiconductor stack 30, the ohmic reflection layers 31 and the light emitting cells C1 to C7 may be formed at the same time by patterning the metal layer and the semiconductor stack 30 at the same time.

Figure 6A:
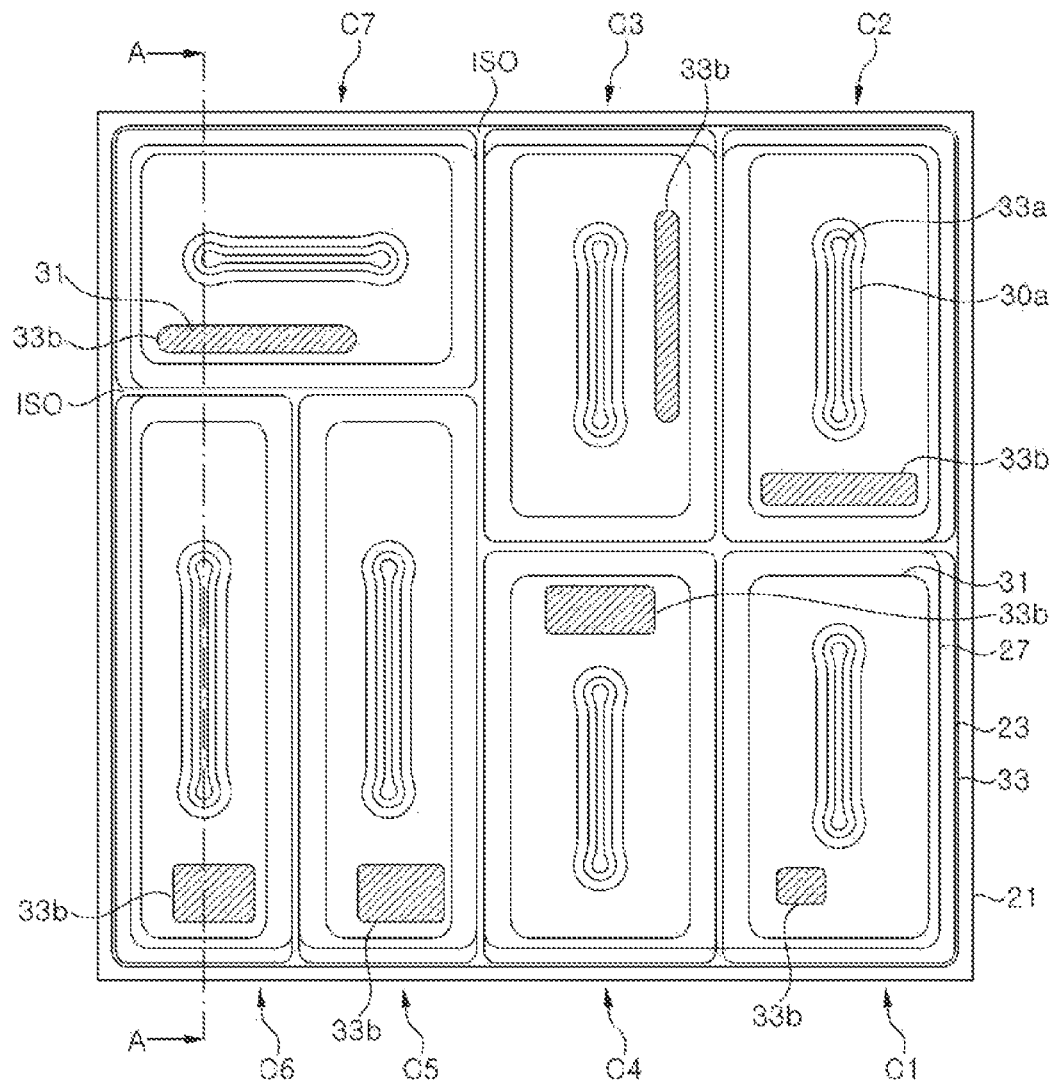
Figure 6B:
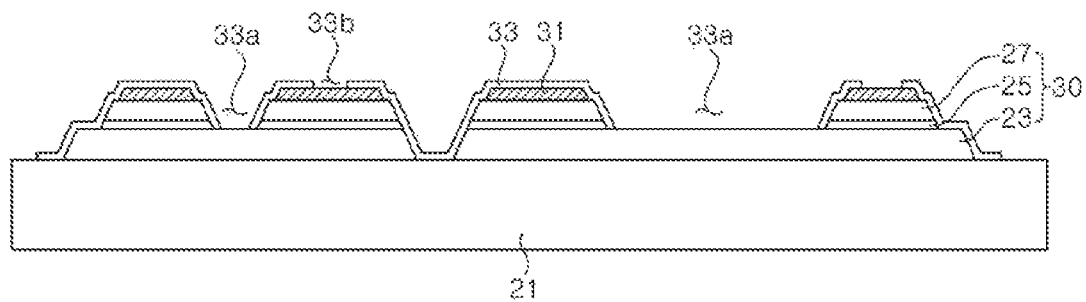

Referring to FIG. 6A and FIG. 6B, a lower insulation layer 33 is formed to cover the ohmic reflection layers 31 and the light emitting cells C1 to C7. The lower insulation layer 33 may be formed of an oxide layer such as $SiO_2$, a nitride layer such as $SiN_x$, or an insulation layer such as $MgF_2$ by chemical vapor deposition (CVD) or the like. The lower insulation layer 33 may be composed of a single layer or multiple layers. Further, the lower insulation layer 33 may include a distributed Bragg reflector in which high-refractive material layers and low-refractive material layers are alternately stacked one above another. For example, an insulation reflective layer having high reflectivity may be formed by laminating $SiO_2/TiO_2$ layers, $SiO_2/Nb_2O_5$ layers, $SiO_2/ZrO_2$ layers, or $MgF_2/TiO_2$ layers. The preliminary insulation layer (not shown) described above may be integrated with the lower insulation layer 33. Thus, the lower insulation layer 33 may have an uneven thickness due to the preliminary insulation layer formed around the ohmic reflection layer 31. That is, a portion of the lower insulation layer 33 on the ohmic reflection layer 31 may have a smaller thickness than a portion of the lower insulation layer 33 around the ohmic reflection layer 31.

The lower insulation layer 33 may be patterned through photolithography and etching processes. Accordingly, the lower insulation layer 33 has first openings 33a exposing the first conductivity type semiconductor layer 23 in the via-holes 30a, and second openings 33b exposing the ohmic reflection layer 31 on each of the light emitting cells. Further, the lower insulation layer 33 may expose the upper surface of the substrate 21 near the edge of the substrate 21.

Figure 7A:
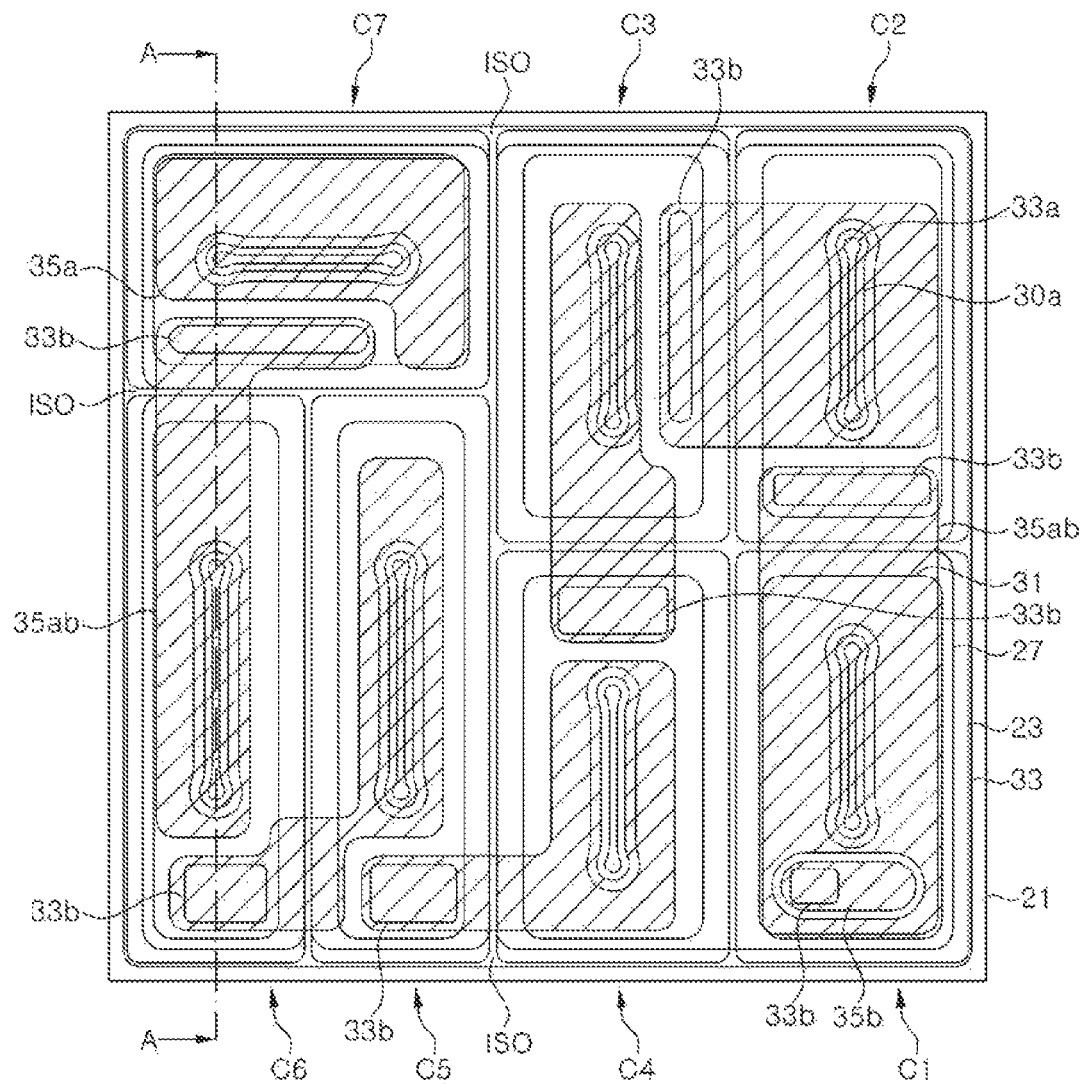
Figure 7B:
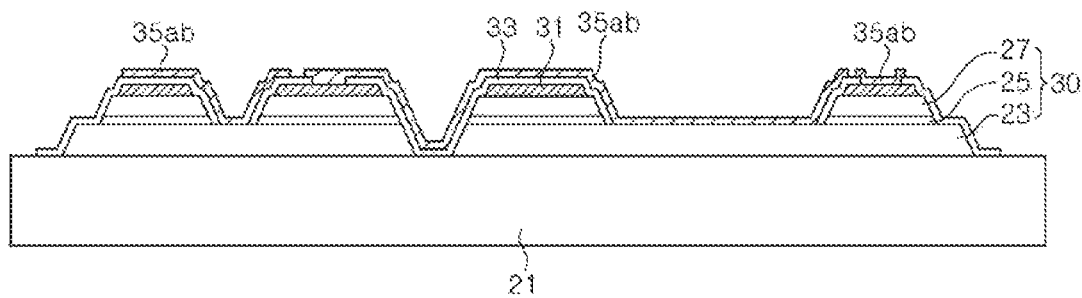

Referring to FIG. 7A and FIG. 7B, a first pad metal layer 35a, a second pad metal layer 35b, and connectors 35ab are formed on the lower insulation layer 33.

The connectors 35ab electrically connect the first light emitting cell C1 to the seventh light emitting cell C7 to one another to form a series array of the light emitting cells C1 to C7. The first light emitting cell C1 is placed at the first terminal of the series array and the seventh light emitting cell C7 is placed at the last terminal of the series array.

In particular, each of the connectors 35ab electrically connects the first conductivity type semiconductor layer 23 of one light emitting cell to the second conductivity type semiconductor layer 27 of another light emitting cell adjacent to the one light emitting cell. The connectors 35ab may be electrically connected to the first conductivity type semiconductor layer 23 exposed in the via-holes 30a through the first openings 33a of the lower insulation layer 33, and may be electrically connected to the ohmic reflection layer 31 exposed through the second openings 33b of the lower insulation layer 33. Further, the connectors 35ab may directly connect the first conductivity type semiconductor layer 23 and the ohmic reflection layer 31.

The connectors 35ab pass the cell isolation (ISO) region to connect adjacent light emitting cells to each other. As shown in FIG. 7A, each of the connectors 35ab may pass an upper region of only one edge of edges of the first conductivity type semiconductor layer 23 of one light emitting cell so as to reduce influence of the morphology on the substrate 21. That is, in the present exemplary embodiment, the first conductivity type semiconductor layer 23 of each of the light emitting cells has four edges and the connectors 35ab passes only one of these edges of the first conductivity type semiconductor layer 23. This structure may prevent the connectors 35ab from unnecessarily passing the cell isolation (ISO) region in electrical connection, thereby preventing damage to the connectors 35ab due to influence of the morphology.

Meanwhile, the first pad metal layer 35a is disposed on the last light emitting cell C7 placed at the last terminal of the series array of light emitting cells and the second pad metal layer 35b is disposed on the first light emitting cell C1 placed at the first terminal thereof. The first pad metal layer 35a may be limitedly disposed in an upper region of the second conductivity type semiconductor layer 27 of the last light emitting cell C7 and the second pad metal layer 35b may be limitedly disposed in an upper region of the first light emitting cell C1.

The first pad metal layer 35a is electrically connected to the first conductivity type semiconductor layer 23 through the first openings 33a of the lower insulation layer 33 on the last light emitting cell C7. The first pad metal layer 35a may directly contact the first conductivity type semiconductor layer 23. Accordingly, the first pad metal layer 35a may include an ohmic layer that forms ohmic contact with the first conductivity type semiconductor layer 23.

Meanwhile, the second pad metal layer 35b is electrically connected to the ohmic reflection layer 31 through the second opening 33b of the lower insulation layer 33 on the first light emitting cell C1. The second pad metal layer 35b may directly contact the ohmic reflection layer 31. Further, as shown in FIG. 7A, the second pad metal layer 35b may be surrounded by the connector 35ab. Accordingly, a boundary region may be formed between the second pad metal layer 35b and the connector 35ab, and the lower insulation layer 33 may be exposed to the boundary region.

The first pad metal layer 35a, the second pad metal layer 35b, and the connectors 35ab may be formed of the same material at the same time by the same process. For example, the first pad metal layer 35a, the second pad metal layer 35b, and the connectors 35ab may include Ti, Cr, or Ni as a bonding layer and may further include Al as a metallic reflection layer. Furthermore, the first pad metal layer 35a, the second pad metal layer 35b, and the connectors 35ab may further include an anti-diffusion layer for preventing diffusion of a metallic element, such as Sn, and an anti-oxidation layer for preventing oxidation of the anti-diffusion layer. The anti-diffusion layer may include, for example, Cr, Ti, Ni, Mo, TiW or W, and the anti-oxidation layer may include Au.

In the present exemplary embodiment, the first pad metal layer 35a, the second pad metal layer 35b, and the connectors 35ab may be formed by the same process, thereby simplifying the manufacturing process. Additionally, or alternatively, the first pad metal layer 35a, the second pad metal layer 35b, and the connectors 35ab may be formed substantially at the same time. In other embodiments, the first pad metal layer 35a, the second pad metal layer 35b, and the connectors 35ab may be formed by the same process for one or more of light emitting cells. For the rest of light emitting cells, an additional, or a subsequent process may be performed to form the connectors 35ab.

Figure 8A:
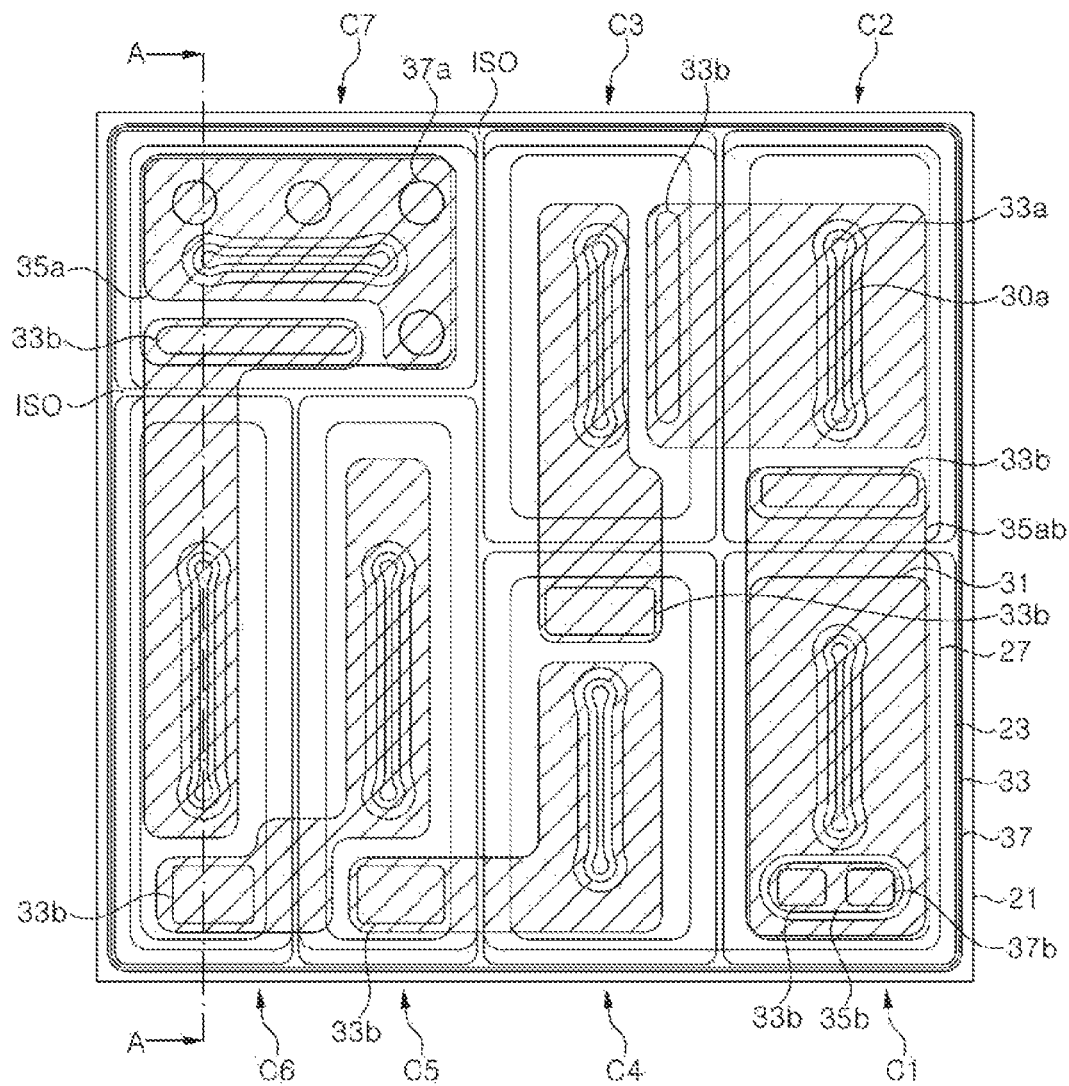
Figure 8B:
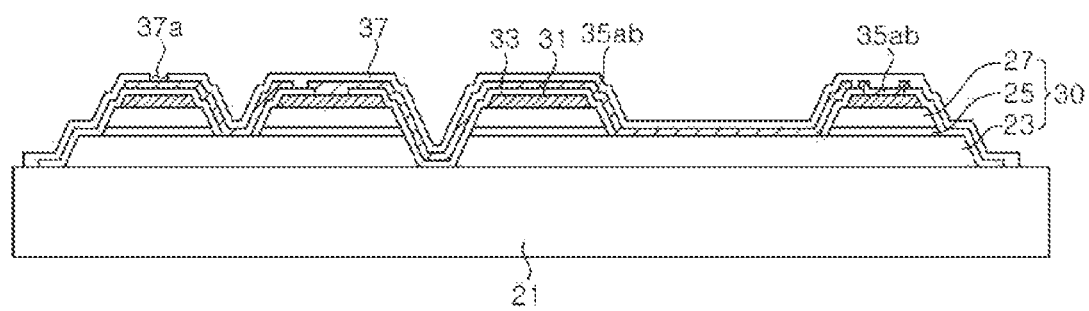

Referring to FIG. 8A and FIG. 8B, an upper insulation layer 37 is formed to cover the first pad metal layer 35a, the second pad metal layer 35b, and the connectors 35ab. The upper insulation layer 37 includes openings 37a exposing the first pad metal layer 35a and openings 37b exposing the second pad metal layer 35b. Although a plurality of openings 37a is illustrated in the drawings, it should be understood that the upper insulation layer 37 may include one opening 37a in other exemplary embodiments. In addition, although one opening 37b is illustrated in the drawings, it should be understood that the upper insulation layer 37 may include a plurality of openings 37b.

The openings 37b of the upper insulation layer 37 may be disposed to be spaced apart from the seconds opening 33b of the lower insulation layer 33 in the lateral direction. With the structure wherein the openings 37b of the upper insulation layer 37 are spaced apart from the second openings 33b of the lower insulation layer 33 so as not to overlap each other, the ohmic reflection layer 31 may be prevented from being contaminated by solders. Alternatively, the second openings 33b of the lower insulation layer 33 may overlap with the openings 37b of the upper insulation layer 37.

The upper insulation layer 37 may also cover the edge of the lower insulation layer 33 along the peripheral edge of the substrate 21 and may expose some region thereof near the peripheral edge of the substrate 21. The edge of the upper insulation layer 37 may be spaced apart from the connectors 35ab by a distance of at least 15 μm.

The upper insulation layer 37 may be formed of a silicon oxide layer or a silicon nitride layer and may include a distributed Bragg reflector.

Figure 9A:
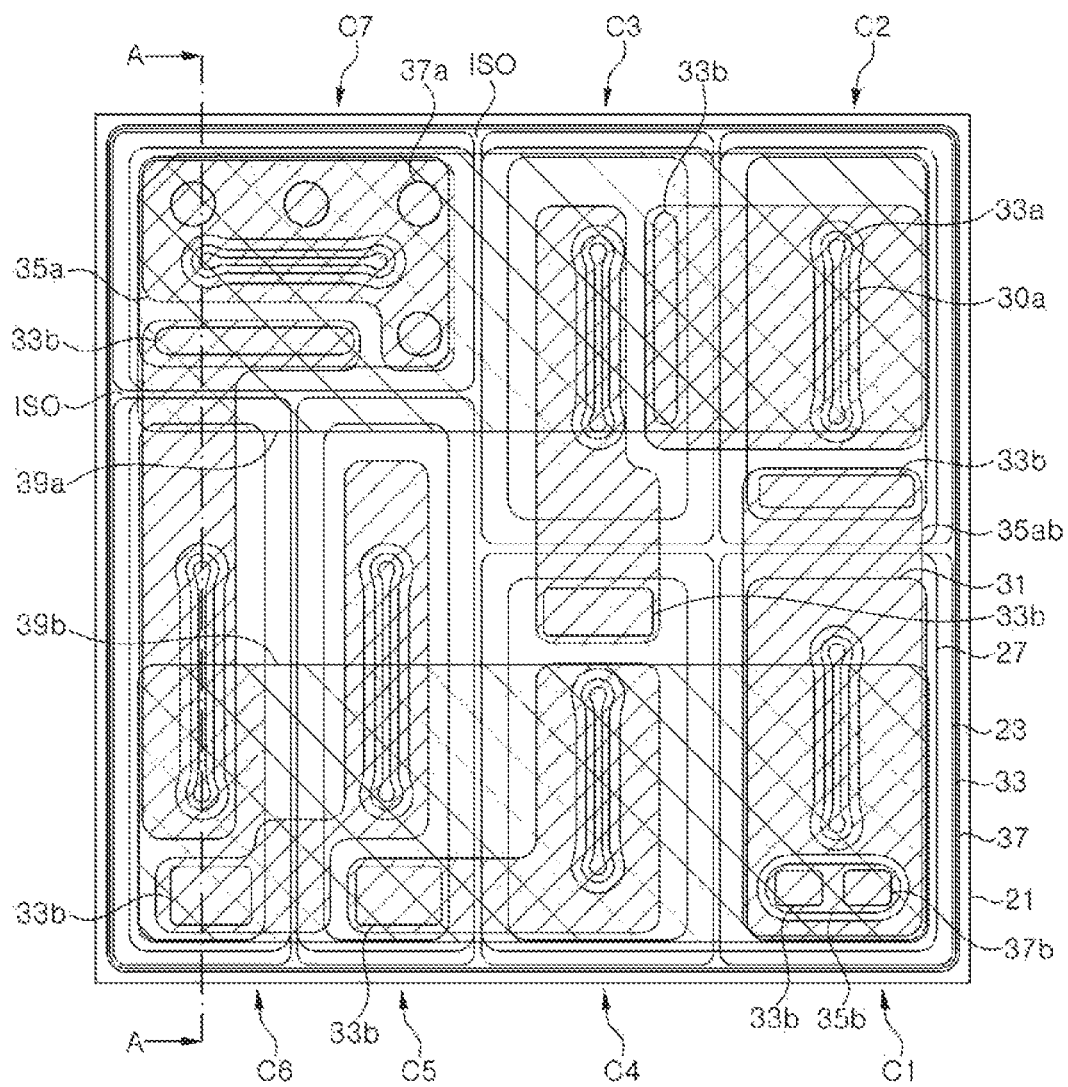
Figure 9B:
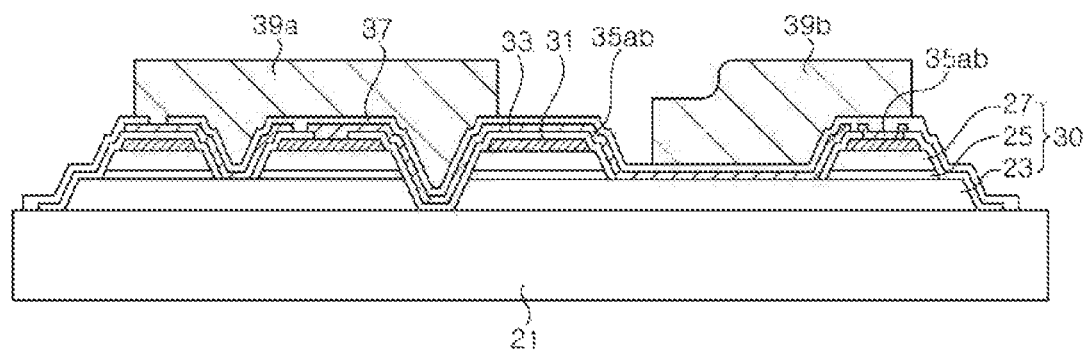

Referring to FIG. 9A and FIG. 9B, a first bump pad 39a and a second bump pad 39b are formed on the upper insulation layer 37.

The first bump pad 39a is electrically connected to the first pad metal layer 35a through the openings 37a of the upper insulation layer 37, and the second bump pad 39b is electrically connected to the second pad metal layer 35b through the openings 37b of the upper insulation layer 37.

As shown in FIG. 9A, the first and second bump pads 39a and 39b are formed over the plurality of light emitting cells. The upper insulation layer 37 prevents an electrical short circuit between the light emitting cells and the first and second bump pads 39a and 39b.

After the first and second bump pads 39a and 39b are formed, a thickness of the substrate 21 may be reduced by partially removing a lower surface of the substrate 21 through grinding and/or lapping. Thereafter, the substrate 21 is divided into individual chip units, thereby providing light emitting diodes separated from each other. In this case, the substrate 21 may be divided by laser scribing.

Second Embodiment

Figure 10A:
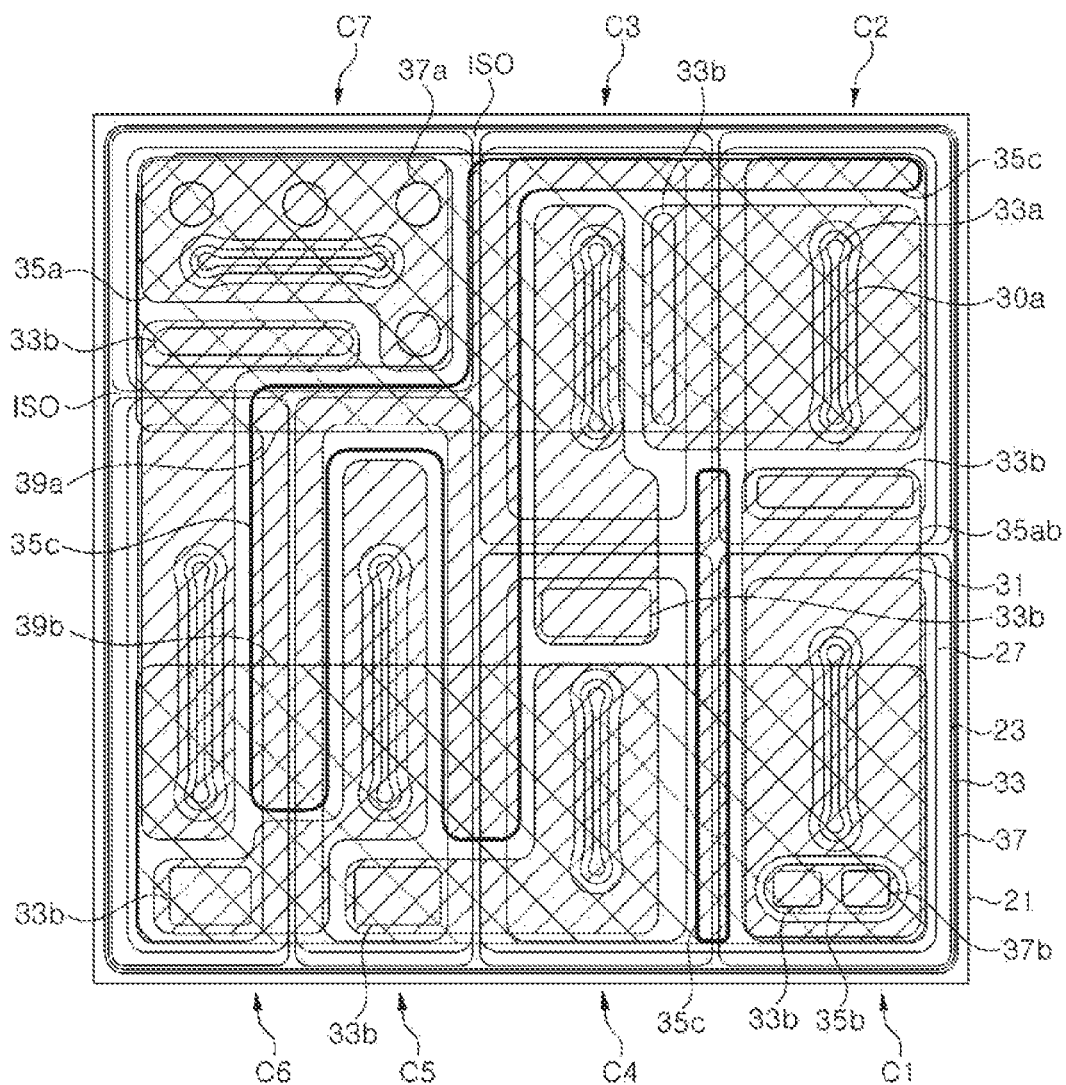
FIGS. 10A and 10B are schematic plan views of a light emitting diode according to a second exemplary embodiment of the present disclosure.
Figure 10B:
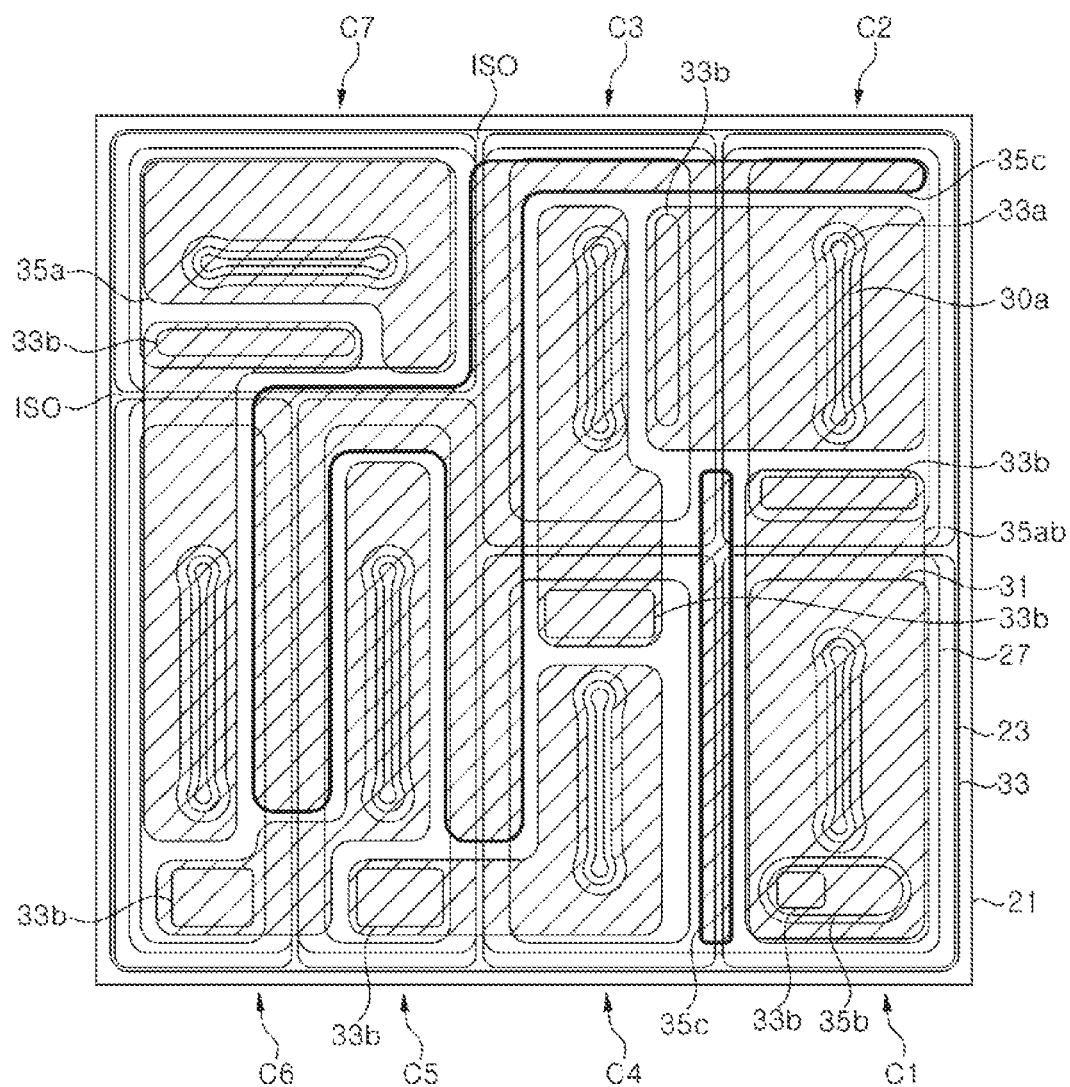

FIGS. 10A and 10B are schematic plan views of a light emitting diode according to a second exemplary embodiment of the present disclosure. To illustrate a first pad metal layer 35a, a second pad metal layer 35b and connectors 35ab, first and second bump pads 39a and 39b and an upper insulation layer 32a shown in FIG. 10A are omitted in FIG. 10B Referring to FIG. 10A and FIG. 10B, the light emitting diode according to the present exemplary embodiment is generally similar to the light emitting diode described with reference to FIGS. 1 to 3 except for a floating reflection layer 35c. In FIGS. 10A and 10B, an area of the floating reflection layer 35c is indicated by a bolded line.

The floating reflection layer 35c covers an upper region of the cell isolation region ISO between the light emitting cells C1 to C7. In addition, the floating reflection layer 35c may partially cover upper regions of adjacent light emitting cells. Accordingly, the floating reflection layer 35c is formed on regions in which significant variation in morphology occurs. The floating reflection layer 35c is formed in a region in which the connectors 35ab are not formed, and reflects light generated from the active layer 25. With this structure, the floating reflection layer 35c improves luminous efficacy of the light emitting diode by preventing light loss of the light emitting diode.

The floating reflection layer 35c is formed on the lower insulation layer 33 and may be placed at the same level as the connectors 35ab. Accordingly, the floating reflection layer 35c may be formed of the same material as the first and second pad metal layers 35a, 35b and the connectors 35ab by the same process upon formation of the first and second pad metal layers 35a and 35b and the connectors 35ab. In other embodiments, different materials may be used by the same process, or by a different process.

The floating reflection layer 35c is insulated from the first pad metal layer 35a, the second pad metal layer 35b and the connectors 35ab. In addition, the floating reflection layer 35c is insulated from the ohmic reflection layer 31 and the semiconductor stack 30, and is thus electrically floated.

Since the floating reflection layer 35c is electrically floated, no current flows through the floating reflection layer 35c while the light emitting diode is in operation, and thus the floating reflection layer 35c does not generate an electric force. Accordingly, the floating reflection layer 35c does not attract external moisture and is therefore not easily damaged even when there is a crack or the like in the upper insulation layer 37 or the like.

Third Embodiment

Figure 11A:
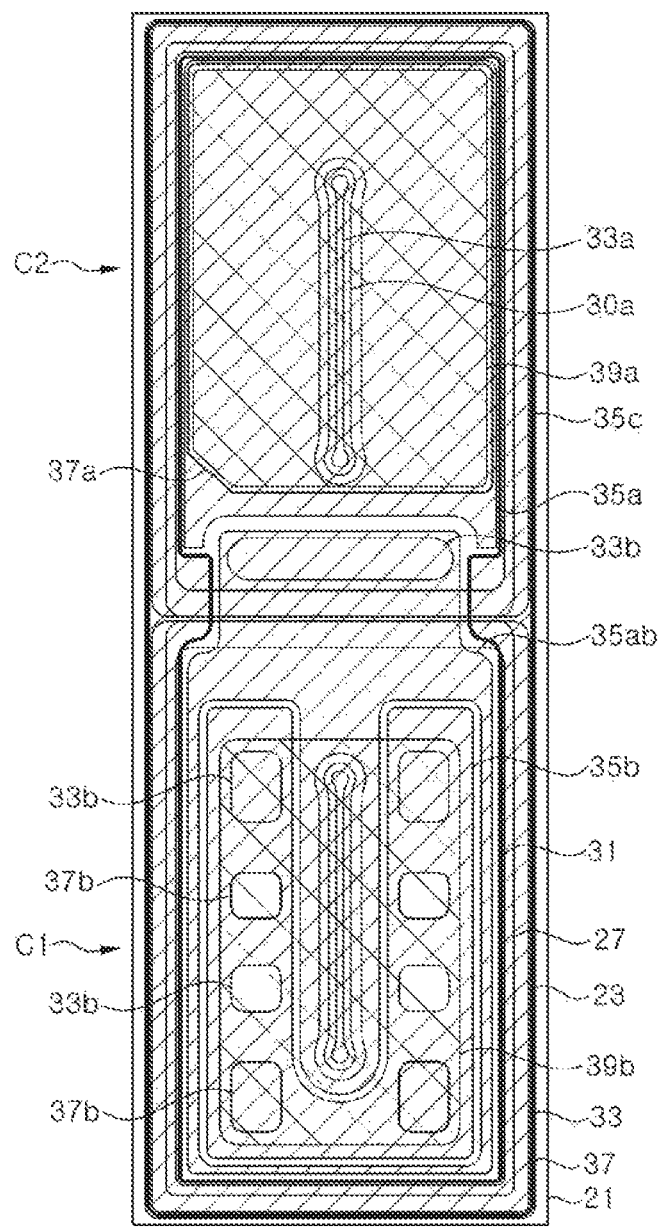
FIGS. 11A and 11B are schematic plan views of a light emitting diode according to a third exemplary embodiment of the present disclosure.
Figure 11B:
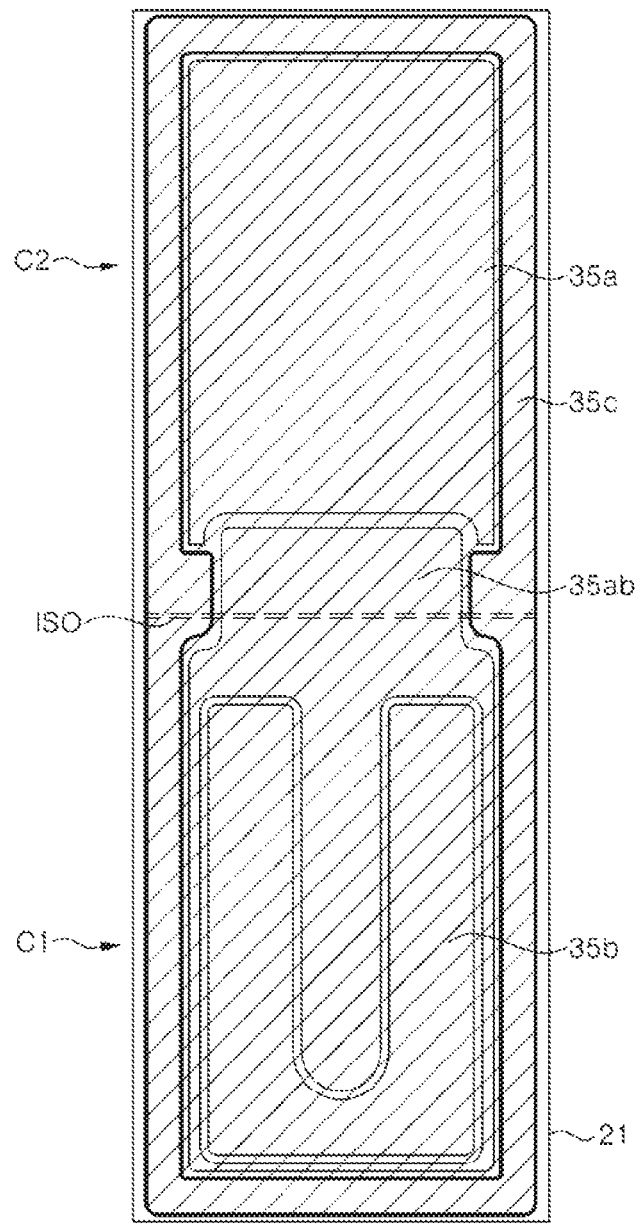

FIGS. 11A and 11B are schematic plan views of a light emitting diode according to a third exemplary embodiment of the present disclosure. To illustrate a first pad metal layer 35a, a second pad metal layer 35b, a floating reflection layer 35c and connectors 35ab, first and second bump pads 39a and 39b, a lower insulation layer 33 and an upper insulation layer 37 shown in FIG. 11A are omitted and simplified in FIG. 11B.

Referring to FIG. 11A and FIG. 11B, the light emitting diode according to the present exemplary embodiment is generally similar to the light emitting diode described with reference to FIGS. 1 and 2 except that it includes two light emitting cells C1 and C2, and a floating reflection layer 35c is disposed along an edge of the substrate 21. An area of the floating reflection layer 35c is indicated by a bolded line. In the following, differences will be described in detail to avoid redundancy.

First, the light emitting cells C1 and C2 are disposed on the substrate 21 in the longitudinal direction. The light emitting cells C1 and C2 have via-holes 30a exposing a first conductivity type semiconductor layer 23. The ohmic reflection layers 31 are in ohmic contact with the second conductivity type semiconductor layers 27 on the light emitting cells C1 and C2.

The lower insulation layer 33 covers the light emitting cells C1 and C2 and partially covers the substrate 21 around the light emitting cells C1 and C2. In addition, the lower insulation layer 33 has first openings 33a exposing the first conductivity type semiconductor layer 23 in the via-holes 30a and second openings 33b exposing the ohmic reflection layer 31 on each of the light emitting cells C1 and C2. A plurality of second openings 33b are formed on the light emitting cell C1 without being limited thereto, but a single second opening 33b may be formed. However, the plurality of second openings 33b helps to disperse the current evenly.

The first pad metal layer 35a and the second pad metal layer 35b are disposed on the second light emitting cell C2 and the first light emitting cell C1, respectively, and electrically connected to the first conductivity type semiconductor layer 23 and the ohmic reflection layer 31. The first pad metal layer 35a may directly contact the first conductivity type semiconductor layer 23, and the second pad metal layer 35b may directly contact the ohmic reflection layer 31. The second pad metal layer 35b is electrically connected to the second conductivity type semiconductor layer 27 through the ohmic reflection layer 31.

The connector 35ab is electrically connected to the first conductivity type semiconductor layer 23 of the first light emitting cell C1 and the ohmic reflection layer 31 of the second light emitting cell C2. The connector 35ab may directly contact the first conductivity type semiconductor layer 23 of the first light emitting cell C1 and the ohmic reflection layer 31 of the second light emitting cell C2. In addition, the connector 35ab may surround the second pad metal layer 35b.

Meanwhile, the floating reflection layer 35c may surround the first and second light emitting cells C1 and C2 in a ring shape along the edges of the substrate 21. In addition, as shown in FIGS. 11A and 11B, a portion of the floating reflection layer 35c may be disposed in a region between the light emitting cells C1 and C2. The floating reflection layer 35c is disposed on the lower insulation layer 33 and is insulated from the first and second pad metal layers 35a and 35b and the connector 35ab. Moreover, the floating reflection layer 35c is insulated from the first and second light emitting cells C1 and C2. In the present embodiment, the floating reflection layer 35c is disposed on the lower insulation layer 33 and is spaced apart from the substrate 21. However, in a case that the substrate 21 is insulative, the floating reflection layer 35c may partially contact the substrate 21.

The first and second pad metal layers 35a and 35b, the connector 35ab and the floating reflection layer 35c may be formed of the same material and placed at the same level. In other embodiments, different material may be available.

Meanwhile, the upper insulation layer 37 covers the first and second pad metal layers 35a and 35b, the connector 35ab and the floating reflection layer 35c. The upper insulation layer 37 has an opening 37a exposing the first pad metal layer 35a and an opening 37b exposing the second pad metal layer 35b. The connector 35ab and the floating reflection layer 35c are covered with the upper insulation layer 37 and sealed.

The opening 37a of the upper insulation layer 37 is disposed over the second light emitting cell C2 to expose the first pad metal layer 35a, and the opening 37b is disposed over the first light emitting cell to expose the second pad metal layer 35b.

A plurality of the openings 37b may be disposed over the first light emitting cells C1. These openings 37b may be spaced apart from the second openings 33b of the lower insulation layer 33 in the lateral direction.

Meanwhile, the first bump pad 39a and the second bump pad 39b are disposed over the second light emitting cell C2 and the first light emitting cell C1, and electrically connected to the first pad metal layer 35a and the second pad metal layer 35b through the openings 37a and 37b of the upper insulation layer 37, respectively.

Although the floating reflection layer 35c surrounds the light emitting cells C1 and C2 in the ring shape along the edge of the substrate 21 in the present embodiment, the floating reflection layer 35c may be partially or completely omitted.

Fourth Embodiment

Figure 12A:
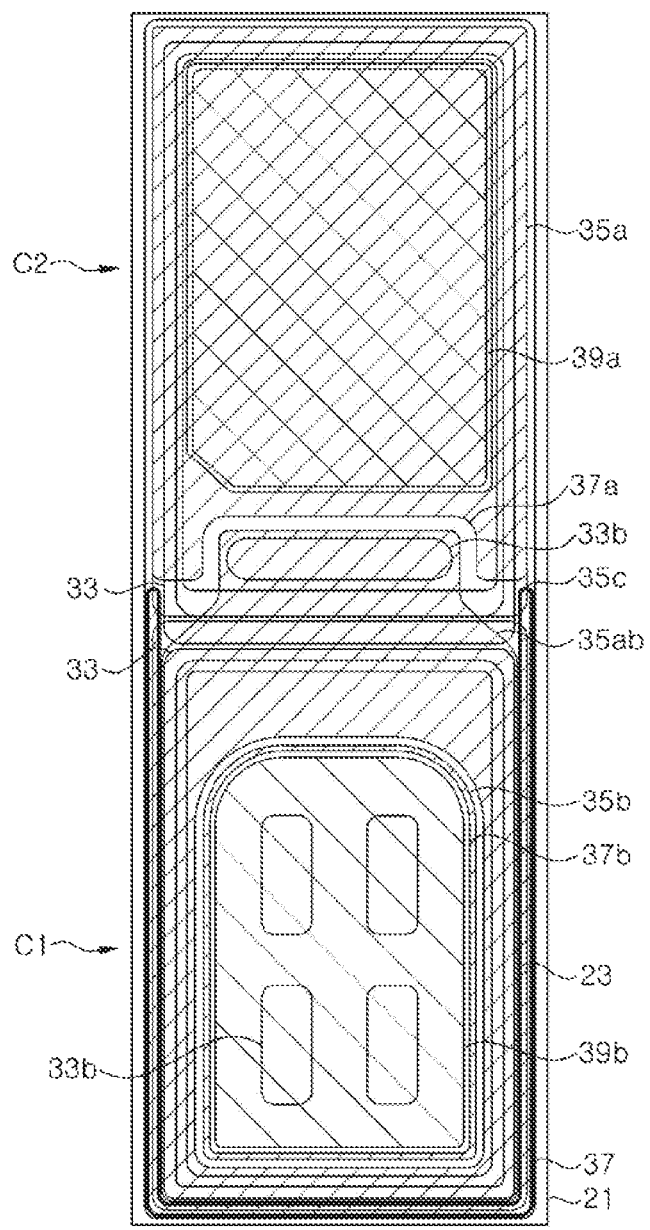
FIGS. 12A and 12B are schematic plan views of a light emitting diode according to a fourth exemplary embodiment of the present disclosure.
Figure 12B:
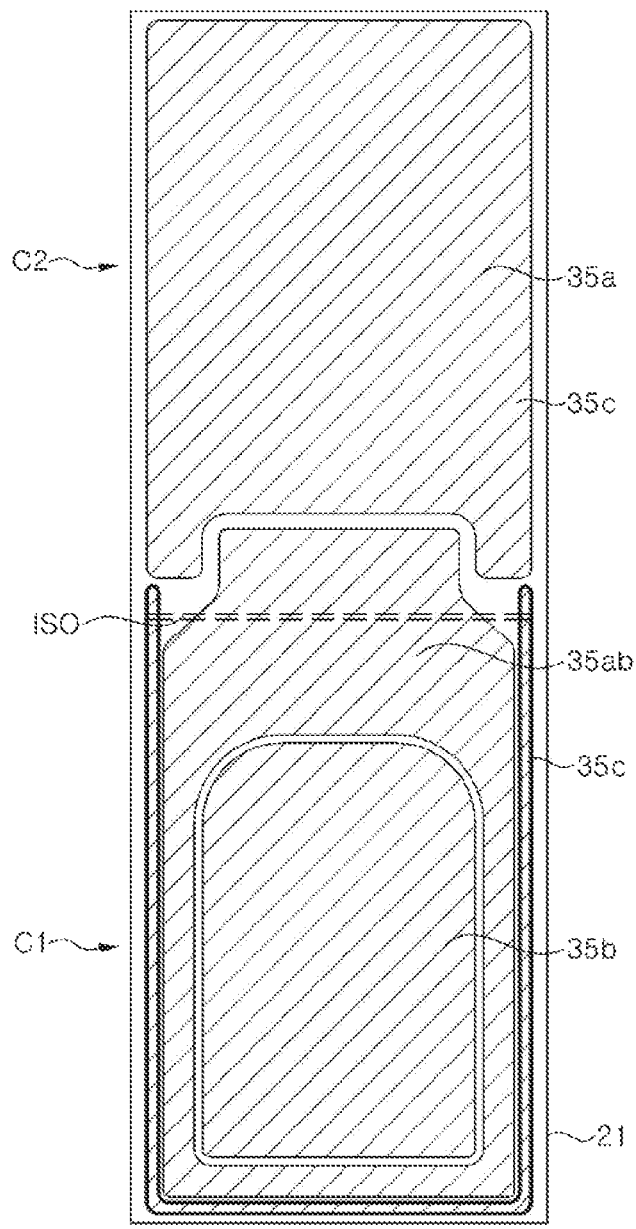

FIGS. 12A and 12B are schematic plan views of a light emitting diode according to a fourth exemplary embodiment of the present disclosure. FIG. 12B is a simplified view of the drawing of FIG. 12A to clearly illustrate a first pad metal layer 35a, a second pad metal layer 35b, a floating reflection layer 35c, and connectors 35ab.

Referring to FIG. 12A and FIG. 12B, the light emitting diode according to the present exemplary embodiment is generally similar to the light emitting diode described with reference to FIGS. 11A and 11B except that the light emitting cells C1 and C2 do not have the via-holes 30a, and the floating reflection layer 35c is partially disposed along the edge of the substrate 21.

Since the light emitting cells C1 and C2 do not have the via-holes 30a, the lower insulation layer 30 does not have the opening 33a exposing the first conductivity type semiconductor layer 23 in the via-holes 30a. However, the lower insulation layer 30 exposes the first conductivity type semiconductor layers 23 around the light emitting cells C1 and C2. The lower insulation layer 30 may expose the first conductivity type semiconductor layer 23 in various ways. As shown in FIG. 12A, edges of the lower insulation layer 23 covering the light emitting cells C1 and C2 may be placed on the first conductivity type semiconductor layer 23, and the first conductivity type semiconductor layer 23 may be exposed to outside of the lower insulation layer 23. The lower insulation layer 23 may be formed to partially cover the substrate 21 around the light emitting cells C1 and C2, and may be formed to have openings exposing the first conductivity type semiconductor layers 23.

The first pad metal layer 35a may be connected to the first conductivity type semiconductor layer 23 along an edge of the second light emitting cell C2 through the opening formed in the lower insulation layer 33. The connector 35ab may be connected to the first conductivity type semiconductor layer 23 along an edge of the first light emitting cell C1.

The second pad metal layer 35b may be electrically connected to the ohmic reflection layer 31 through the openings 33b of the lower insulation layer 33, and may be surrounded by the connector 35ab.

Meanwhile, the floating reflection layer 35c may be formed along three sides of the first light emitting cell C1, and a portion of the reflection layer 35c may extend to the second light emitting cell C2. The floating reflection layer 35c may be disposed over the substrate 21 and the first conductivity type semiconductor layer 23, and the lower insulation layer 33 may be disposed under the floating reflection layer 35c to insulate the floating reflection layer 35c from the first conductivity type semiconductor layer.

In the present exemplary embodiment, the upper insulation layer 37 has openings 37a and 37b which expose the first pad metal layer 35a and the second pad metal layer 35b, respectively. First and second bump pads 39a and 39b may be formed in the openings 37a and 37b and connected to the first and second pad metal layers 35a and 35b, respectively. In the present exemplary embodiment, the opening 37b of the upper insulation layer 37 is formed to overlap with the second openings 33b of the lower insulation layer, but the present disclosure is not limited thereto. Similar to the embodiments above, the opening 37b may be spaced apart in the lateral direction not to overlap with the second openings 33b of the lower insulation layer 33.

Fifth Embodiment

Figure 13:
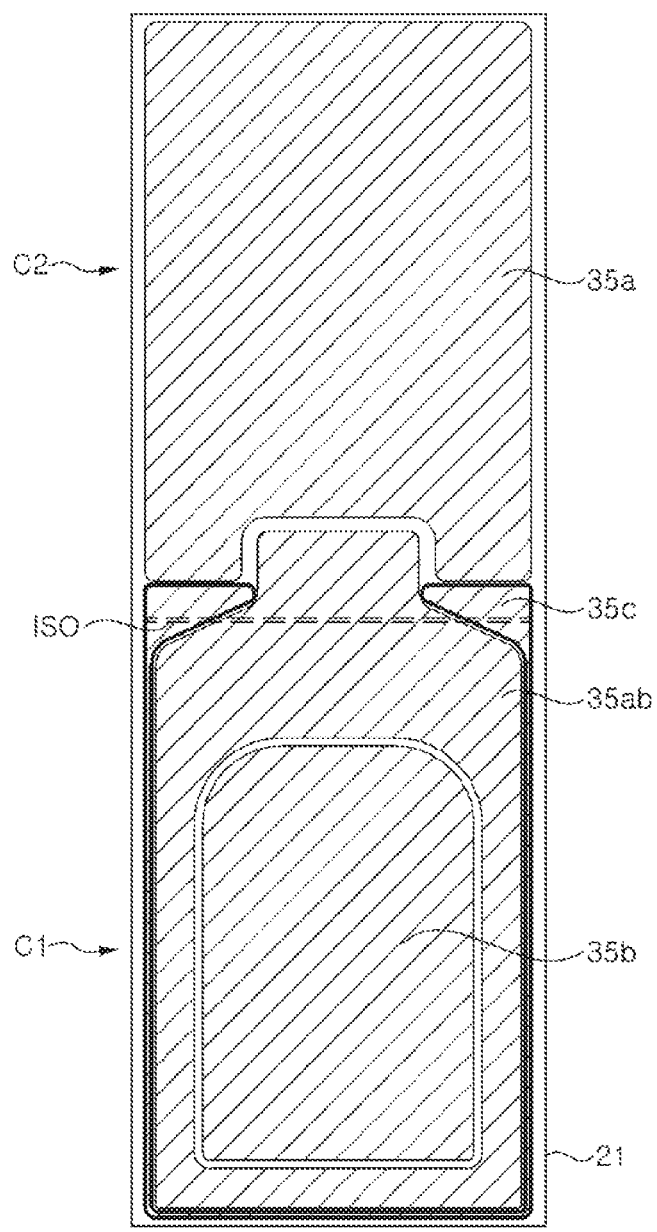
FIG. 13 is a schematic plan view of a light emitting diode according to a fifth exemplary embodiment of the present disclosure.

FIG. 13 is a schematic plan view of a light emitting diode according to a fifth exemplary embodiment of the present disclosure. Herein, a substrate 21, a first pad metal layer 35a, a second pad metal layer 35b, a connector 35ab, and a floating reflection layer 35c are shown, and other components are omitted to avoid redundancy with the previous embodiments.

Referring to FIG. 13, the light emitting diode according to the present exemplary embodiment is generally similar to the light emitting diode described with reference to FIGS. 12A and 12B except that a portion of the floating reflection layer 35c is further extended to the region between the light emitting cells C1 and C2.

A width of the connector 35ab passing through the region between the light emitting cells C1 and C2 is set to be relatively smaller than that of the connector in FIG. 12A, for the floating reflection layer 35c so as to extend to the region between the light emitting cells C1 and C2. For example, the width of the connector 35ab disposed in the cell isolation region may be half or less of a width of the cell isolation region.

The floating reflection layer 35c is spaced apart from the first and second pad metal layers 35a and 35b and the connector 35ab as in the embodiments described above, and is also insulated from the first conductivity type semiconductor layer, the active layer, and the second conductivity type semiconductor. The floating reflection layer 35c may be insulated from the first conductivity type semiconductor layer 23 by the lower insulation layer 33 as in the embodiment described above.

Sixth Embodiment

Figure 14:
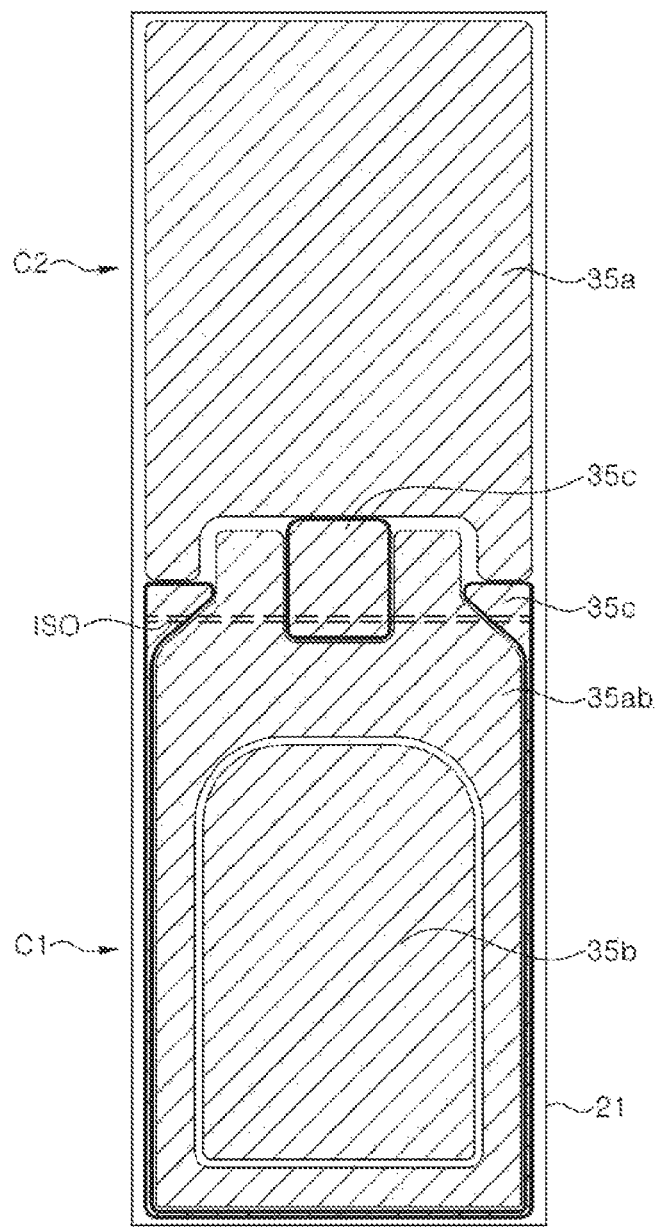
FIG. 14 is a schematic plan view of a light emitting diode according to a sixth exemplary embodiment of the present disclosure.

FIG. 14 is a schematic plan view of a light emitting diode according to a sixth exemplary embodiment of the present disclosure. Herein, a substrate 21, a first pad metal layer 35a, a second pad metal layer 35b, a connector 35ab, and a floating reflection layer 35c are shown, and other components are omitted to avoid redundancy with the previous embodiments.

Referring to FIG. 14, the light emitting diode according to the present exemplary embodiment is generally similar to the light emitting diode described with reference to FIG. 13 except for the connector 35ab and the floating reflection layer 35c.

The connector 35ab is divided into two segments on the first light emitting cell C1 to extend to the second light emitting cell C2. Accordingly, the two segments of the connector 35ab will be electrically connected to the ohmic reflection layer 31 of the second light emitting cell C2, respectively.

Meanwhile, in addition to the floating reflection layer 35c described with reference to FIG. 13, a floating reflection layer 35c is added between two segments of the connector 35ab. The added floating reflection layer 35c is also insulated from the first conductivity type semiconductor layer 23, the active layer 27, the second conductivity type semiconductor layer 27 and the ohmic reflection layer 31 by the lower insulation layer 33, and the added floating reflection layer 35c is spaced apart from the first and second pad metal layers 35a and 35b and the connector 35ab. With this structure, the added floating reflection layer 35c is electrically floated and is surrounded by the connector 35ab and the first pad metal layer 35a.

In the present exemplary embodiment, the connector 35ab is divided into two segments and the floating reflection layer 35c is disposed between the two segments, thereby improving the reliability of the electrical connection by the connector 35ab without reducing the light extraction efficiency.

Although various light emitting diodes having two light emitting cells have been described with reference to FIGS. 11A to 14, the present disclosure is not limited thereto, and various modifications are available. Further, in the embodiments above, the floating reflection layer 35c may be omitted.

Seventh Embodiment

Figure 15:
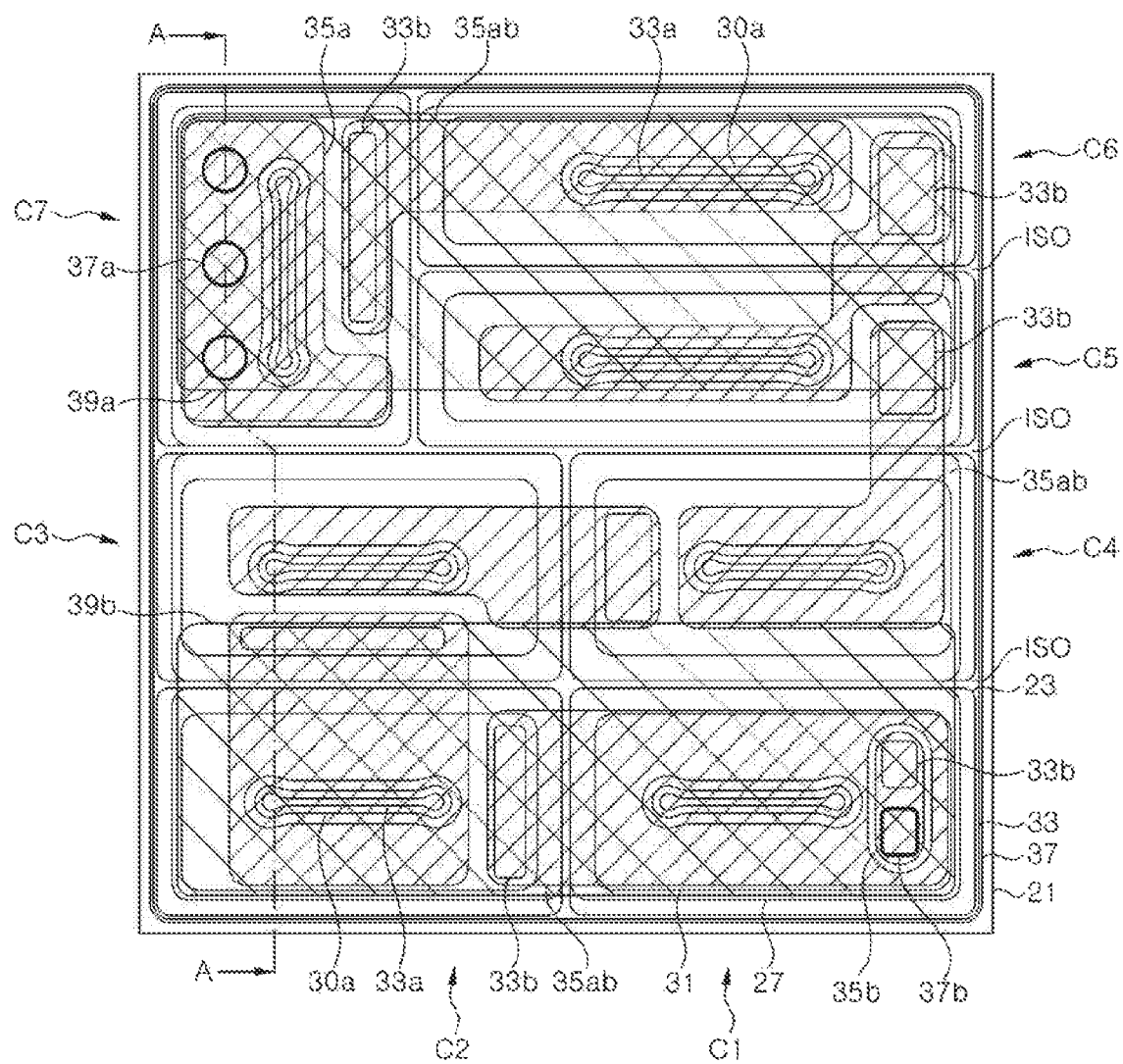
FIG. 15 is a schematic plan view of a light emitting diode according to a seventh exemplary embodiment of the present disclosure.
Figure 16:
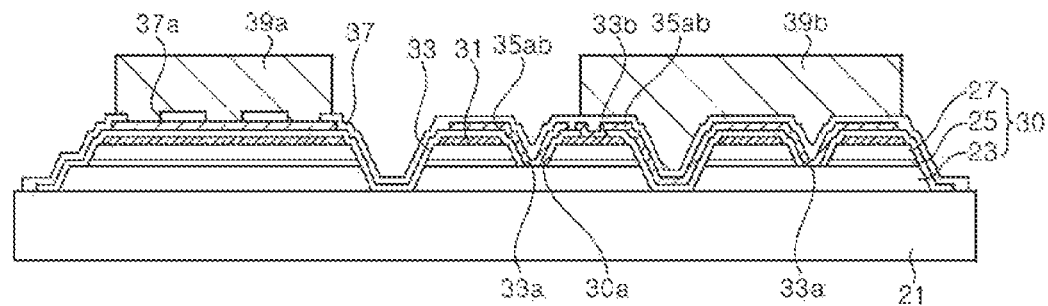
FIG. 16 is a schematic cross-sectional view taken along the line A-A of FIG. 15.
Figure 17:
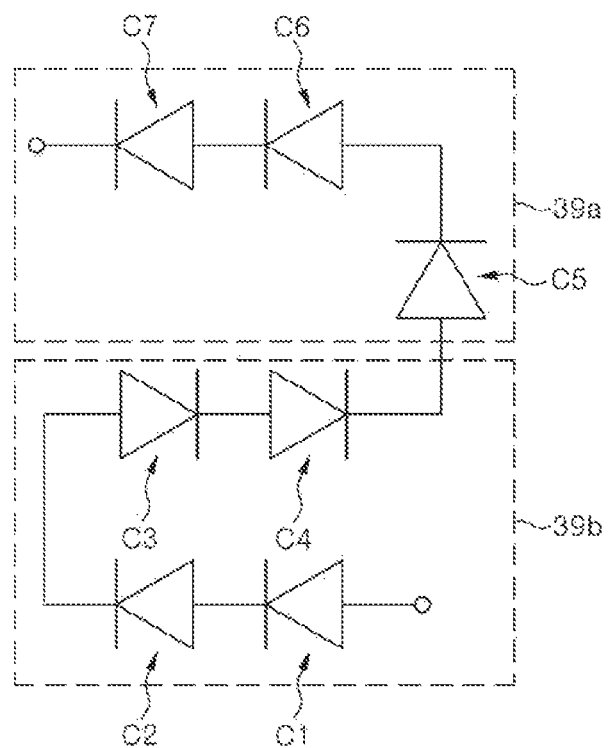
FIG. 17 is a schematic circuit diagram of the light emitting diode of FIG. 15.
Figure 18A:
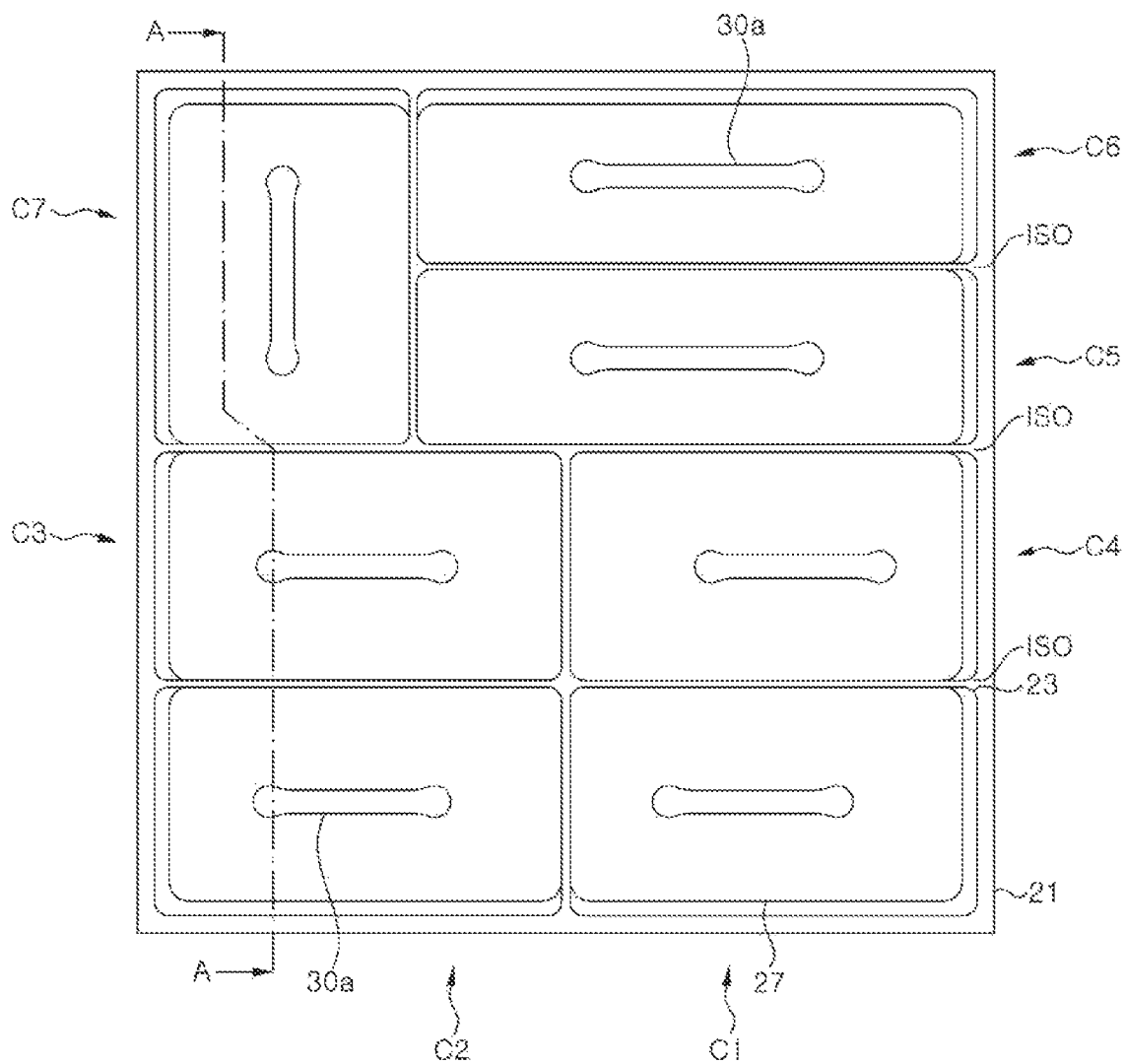
FIGS. 18A to 23B are plan views and cross-sectional views illustrating a method of manufacturing the light emitting diode according to an eighth exemplary embodiment of the present disclosure.
Figure 18B:
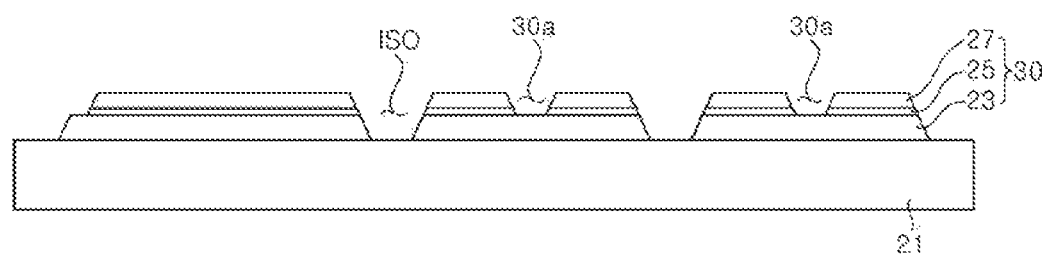
Figure 19A:
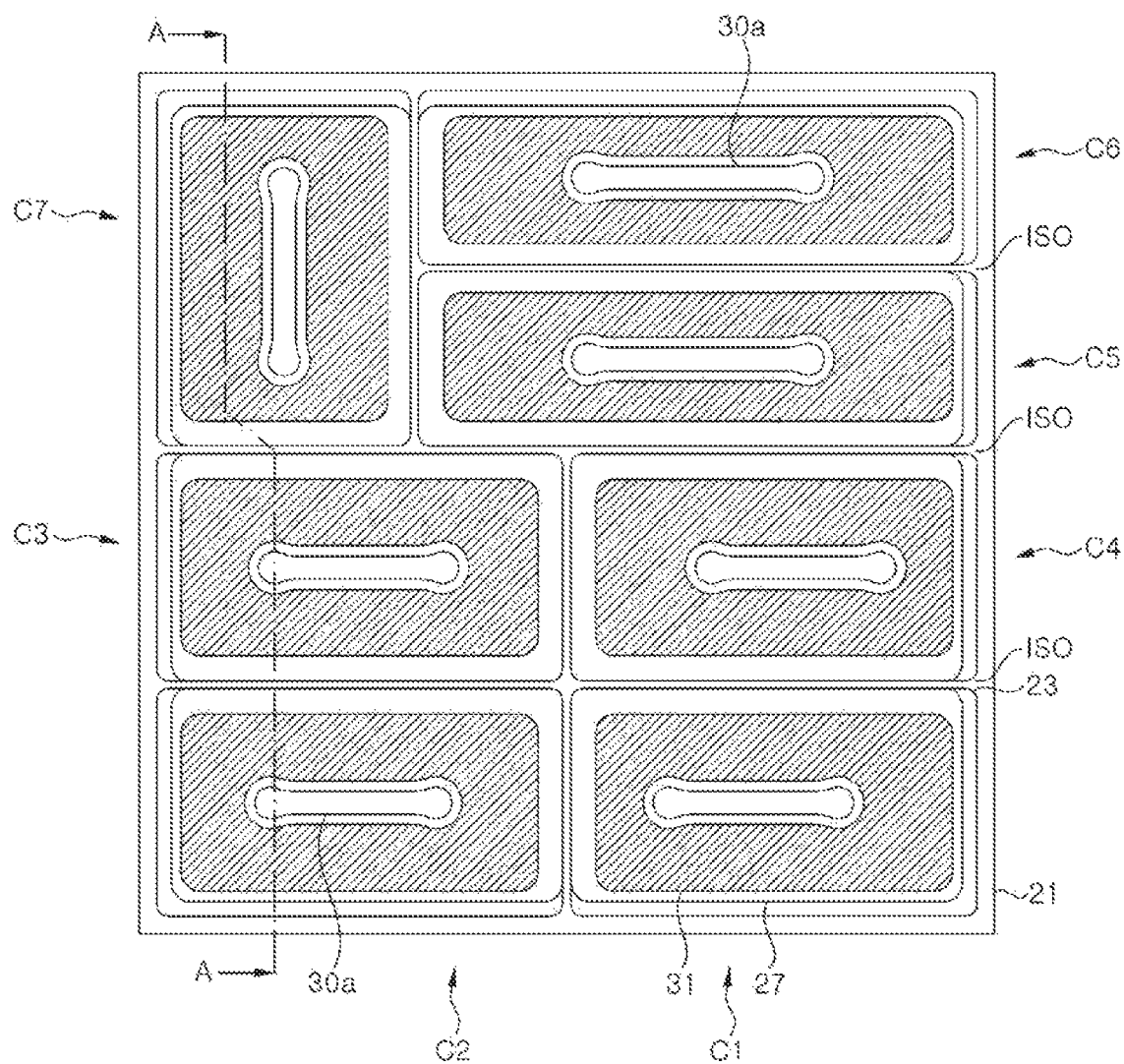
Figure 19B:
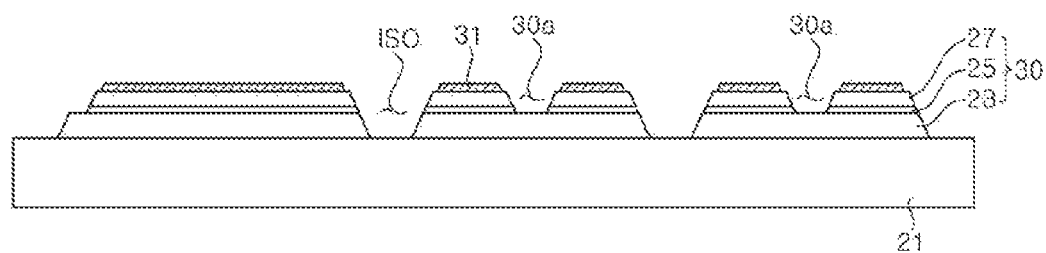
Figure 20A:
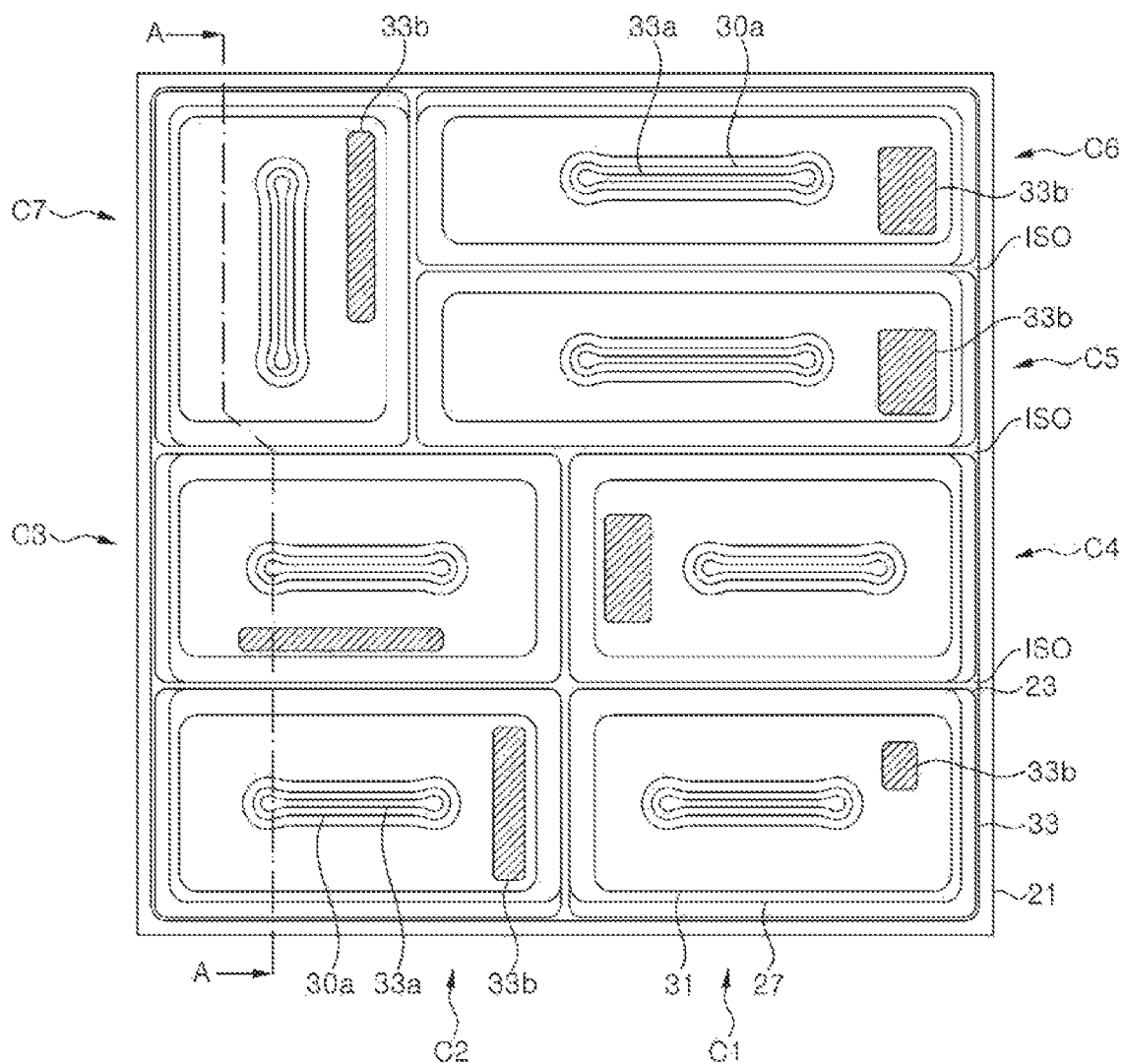
Figure 20B:
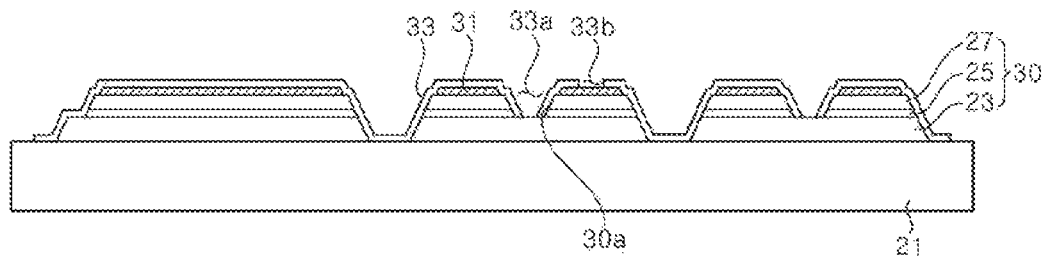
Figure 21A:
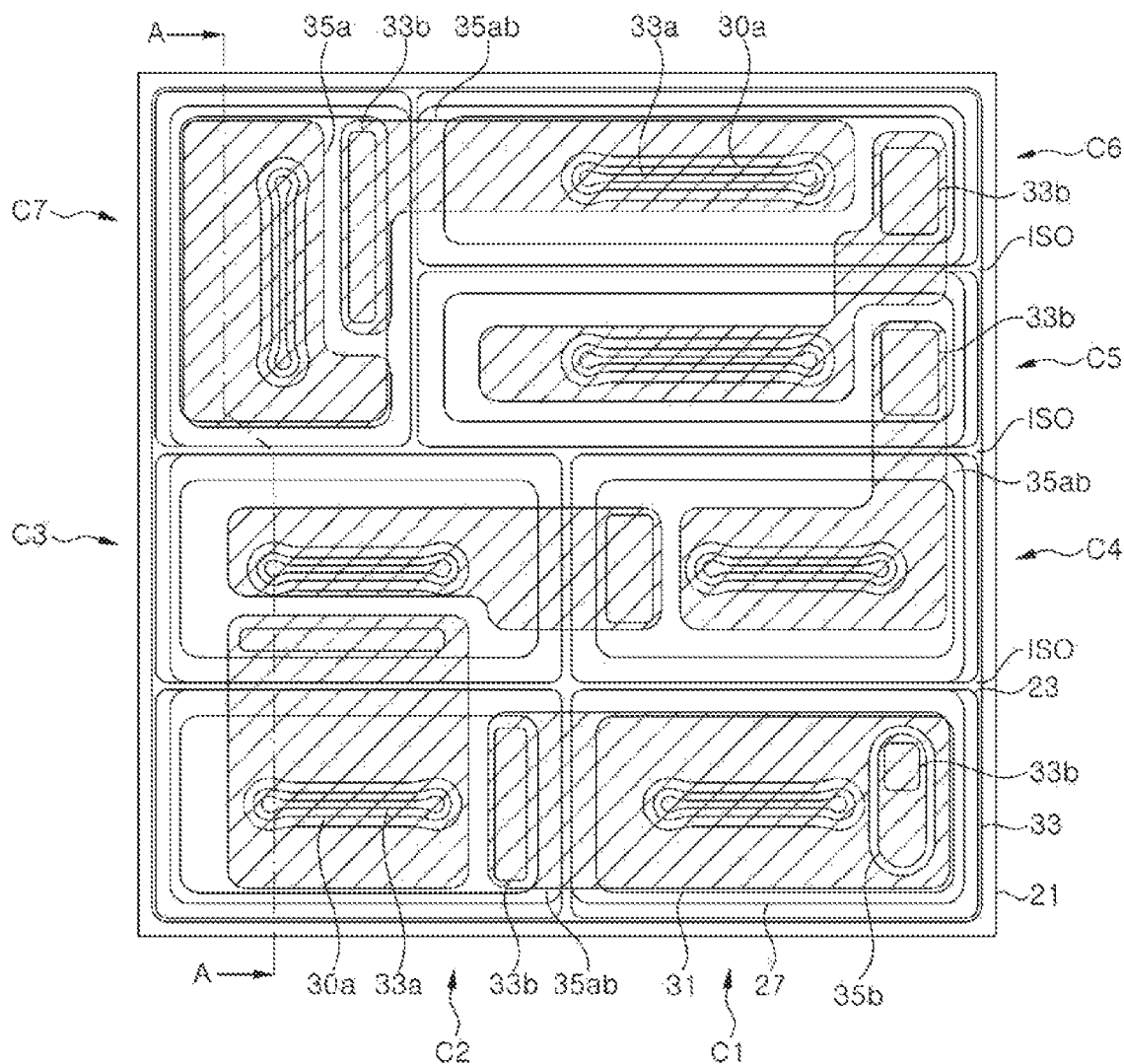
Figure 21B:
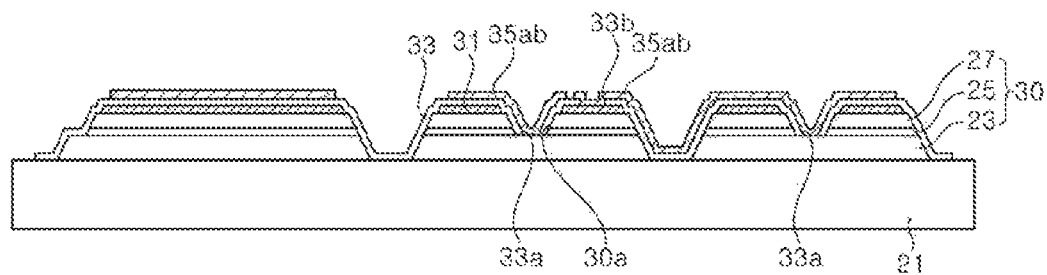
Figure 22A:
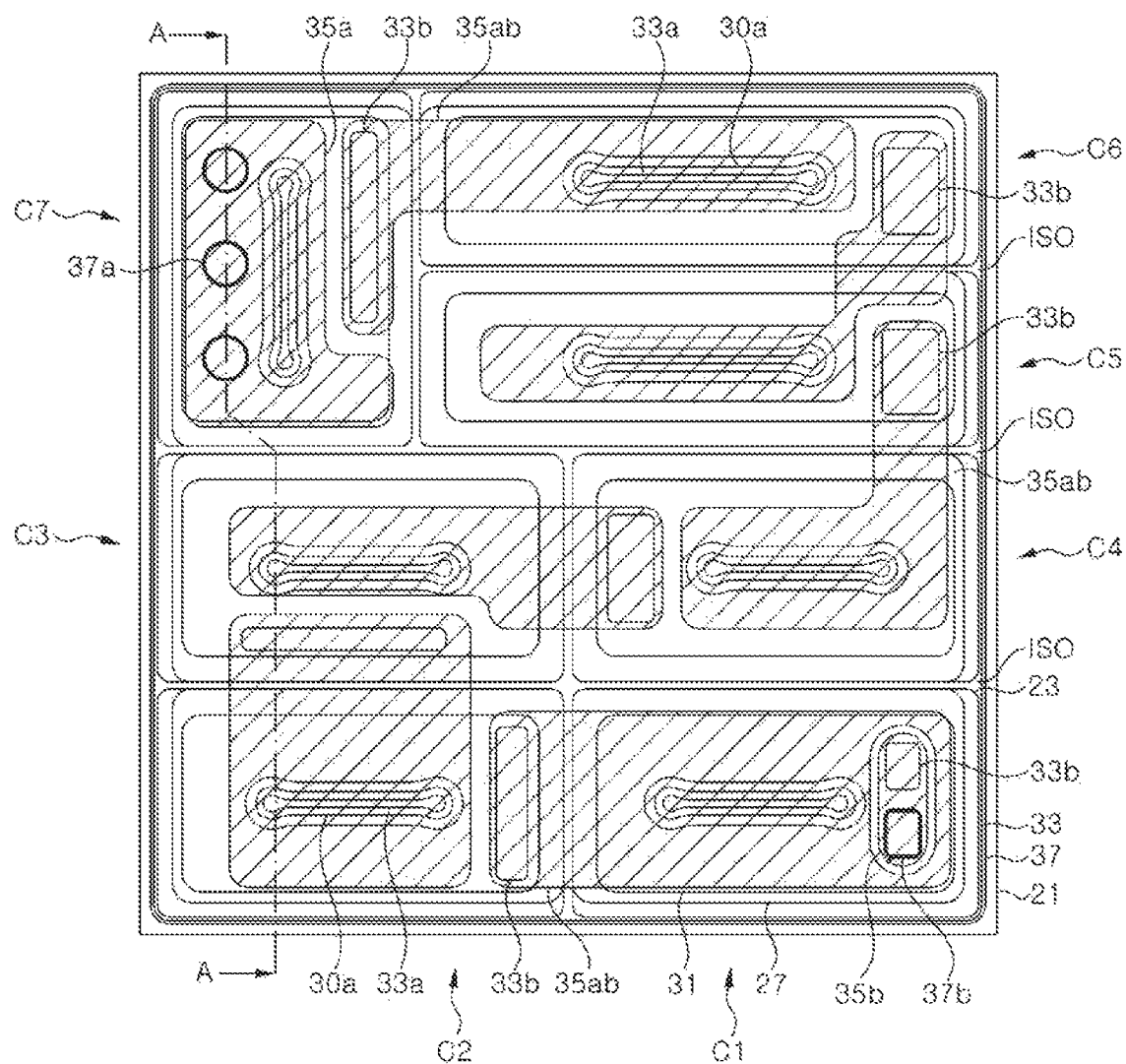
Figure 22B:
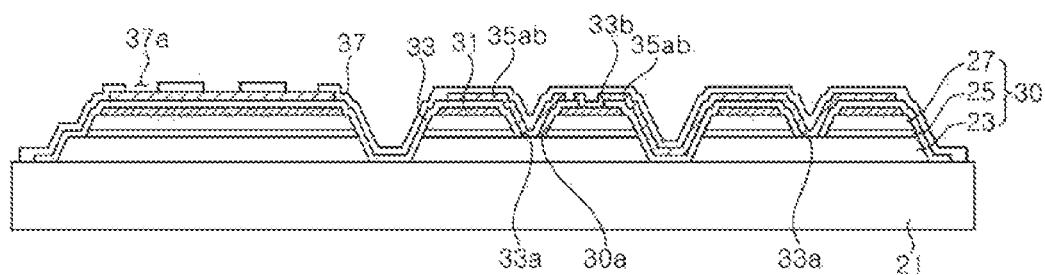

FIG. 15 is a schematic plan view of a light emitting diode according to seventh exemplary embodiment of the present disclosure, FIG. 16 is a schematic cross-sectional view taken along the line A-A of FIG. 15, and FIG. 17 is a schematic circuit diagram of the light emitting diode of FIG. 15.

Referring to FIG. 15, FIG. 16, and FIG. 17, the light emitting diode includes a substrate 21, a plurality of light emitting cells C1 to C7, an ohmic reflection layer 31, a lower insulation layer 33, a first pad metal layer 35a, a second pad metal layer 35b, an upper insulation layer 37, a first bump pad 39a, and a second bump pad 39b. Each of the light emitting cells C1 to C7 include a semiconductor stack 30 including a first conductivity type semiconductor layer 23, an active layer 25, and a second conductivity type semiconductor layer 27.

The light emitting diode according to the present exemplary embodiment is generally similar to the light emitting diode described with reference to FIGS. 1 to 3, but there is a difference in relative locations of the light emitting cells C1 to C7 and the first and second bump pads 39a and 39b. Therefore, detailed description of the light emitting diode according to the present embodiment will be omitted for the same contents as those described with reference to FIGS. 1 to 3.

In the present embodiment, seven light emitting cells C1 to C7 are shown, but the present disclosure is not limited thereto, and the number of light emitting cells may be variously adjusted. In particular, the number of light emitting cells may be three or more.

Meanwhile, each of the first bump pad 39a and the second bump pad 39b may be continuously disposed over the light emitting cells connected to each other in series. For example, in FIG. 15, the first bump pad 39a is disposed over upper regions of the fifth, sixth, and seventh light emitting cells C5, C6, and C7, and the second bump pad 39b is disposed over upper regions of the first, second, third, and fourth light emitting cells C1, C2, C3, and C4. With this arrangement, a potential difference between the first bump pad 39a or the second bump pad 39b and the second conductivity type semiconductor layer 27 or the first conductivity type semiconductor layer 23 of each light emitting cell may be controlled to be 5 Vf or less, further to be 4 Vf or less. For example, a potential difference between the first bump pad 39a and the first conductivity type semiconductor layer 23, a potential difference between the first bump pad 39a and the second conductivity type semiconductor layer 27, a potential difference between the second bump pad 39b and the first conductivity type semiconductor layer 23, or a potential difference between the second bump 39b and the first conductivity type semiconductor layer 23 may be controlled to be 5 Vf or less, preferably 4 Vf or less.

According to the present exemplary embodiment, by controlling the arrangement of the light emitting cells C1 to C7, the locations of the bump pads 39a and 39b, the potential difference between the semiconductor layer 23 or 27 and the bump pad 39a or 39b disposed on the corresponding light emitting cell may be controlled to 5 Vf or less. Accordingly, insulation breakdown of the upper insulation layer 37 disposed between the bump pads 39a and 39b and the connector 35ab may be effectively prevented.

On the contrary, in a case that the first bump pad 39a is disposed over the second light emitting cell C2 (for example, FIG. 1), a maximum potential difference of 6 Vf may be formed between the first bump pad 39a and the second light emitting cells C2, thereby easily generating the insulation breakdown of the upper insulation layer 37.

Meanwhile, since the connector 35ab is connected to the first conductivity type semiconductor layer 23 in each light emitting cell, a potential difference between the bump pads 39a or 39b and the connector 35ab should be mainly considered. Since both the lower insulation layer 33 and the upper insulation layer 37 are generally interposed between the bump pads 39a and 39b and the first conductivity type semiconductor layer 23, a potential difference therebetween may not have a great influence on the insulation breakdown. However, since only the upper insulation layer 37 is interposed between each of the bump pads 39a and 39b and the connector 35ab, the upper insulation layer 37 may be easily damaged due to the potential difference therebetween.

Therefore, to further prevent the insulation breakdown of the upper insulation layer 37, the bump pads 39a and 39b and the connector 35ab may be disposed not to overlap each other in a region where the potential difference is high.

For example, the connector 35ab connected to the first conductivity type semiconductor layer 23 of the fourth light emitting cell C4 is partially overlapped with the second bump pad 39b in FIG. 15. In this case, a potential difference of 4 Vf is generated between the second bump pad 39b and the connector 35ab, and this potential difference is generated with the upper insulation layer 37 interposed therebetween. Therefore, in a case that the second bump pad 39b and the connector 35ab are spaced apart from each other so as not to overlap with each other, a distance between the second bump pad 39b and the connector 35ab may be increased, thereby further preventing the insulation breakdown of the upper insulation layer 37.

FIGS. 18A to 23B are plan views and cross-sectional views illustrating a method of manufacturing the light emitting diode according to the seventh exemplary embodiment of FIG. 15. In each of the drawings, drawings labeled "A" illustrate a plan view and drawings labeled "B" illustrate a cross-sectional view taken along the line A-A of each plan view for convenience of explanation.

Since the light emitting diode according to the present exemplary embodiment is generally similar to the light emitting diode described with reference to FIGS. 4 to 9, the same constituent elements are denoted by the same reference numerals and the detailed description thereof is omitted.

Figure 23A:
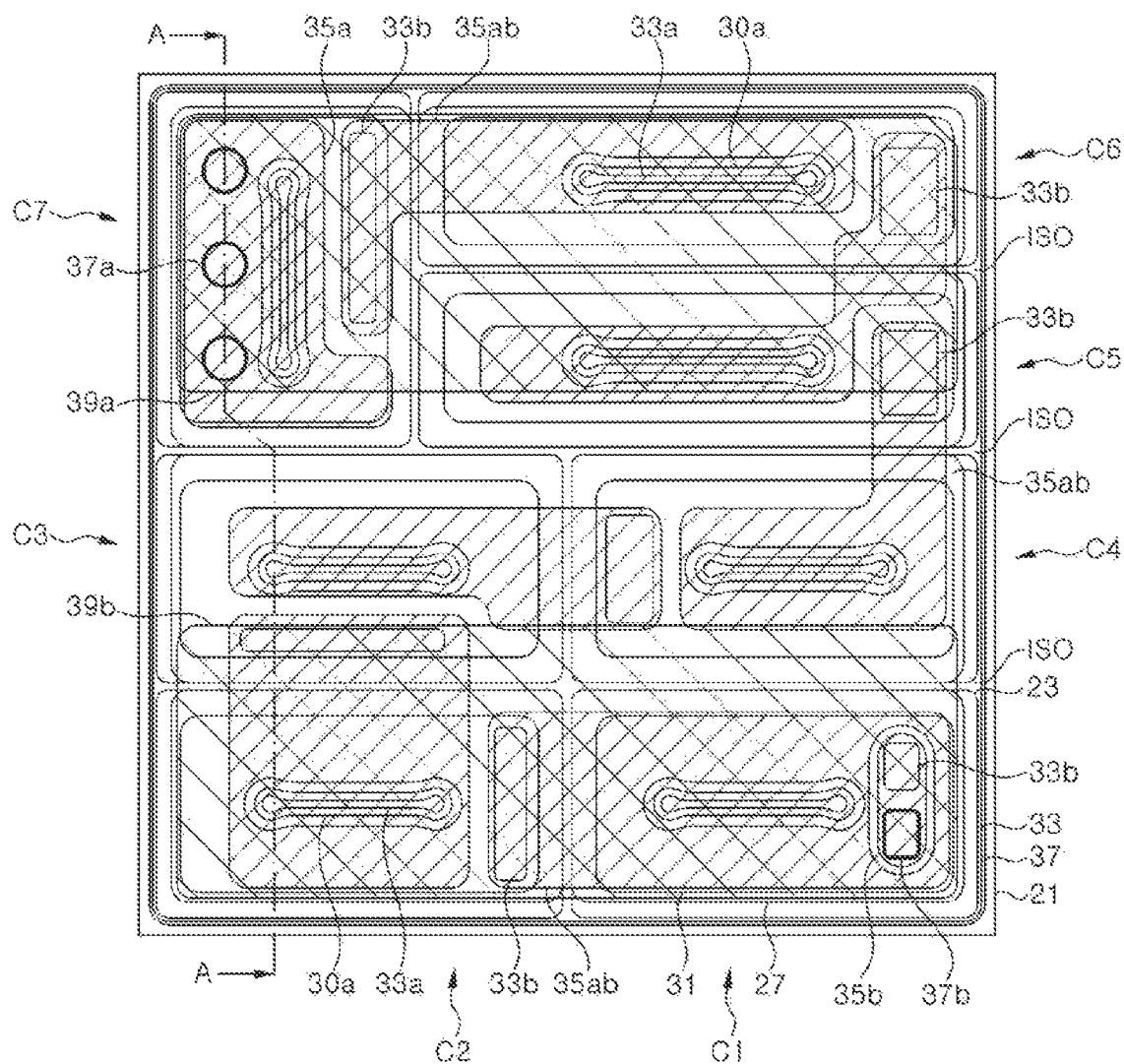
Figure 23B:
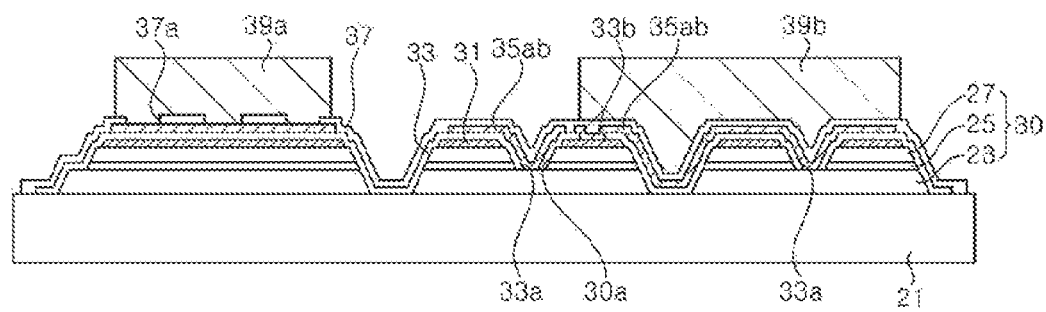

As shown in FIGS. 23A and 23B, in the present exemplary embodiment, each of first and second bump pads 39a and 39b is formed to be disposed over the plurality of light emitting cells connected in series as described with reference to FIGS. 15 to 17. Accordingly, the first and second bump pads 39a and 39b and the connector 35ab may partially overlap, and a potential difference between the first bump pad 39a or the second bump pad 39b and the connector 35ab is controlled to 5 Vf or less, or 4 Vf or less.

Eighth Embodiment

Figure 24:
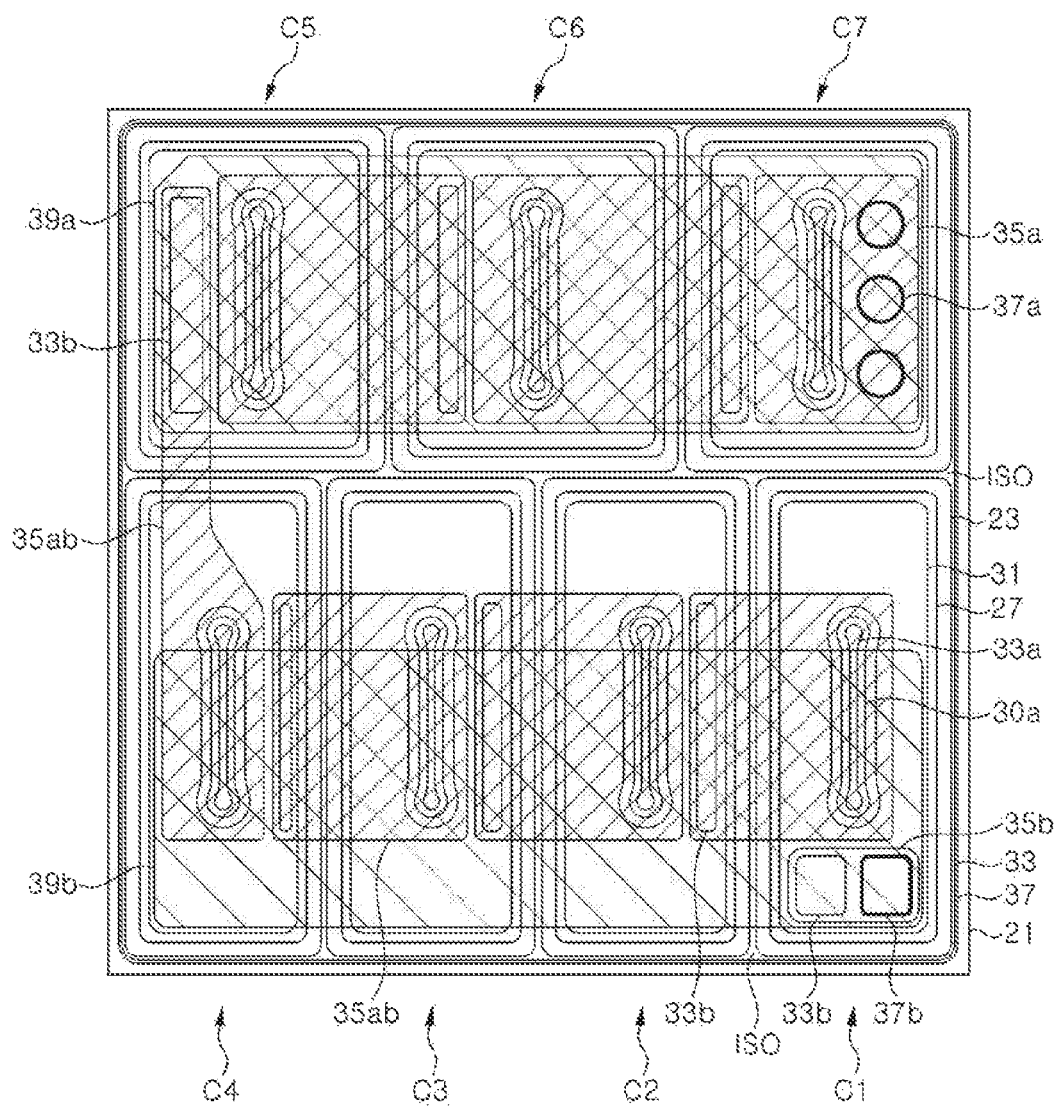
FIG. 24 is a schematic plan view of a light emitting diode according to a ninth exemplary embodiment of the present disclosure.

FIG. 24 is a schematic plan view of a light emitting diode according to an eighth exemplary embodiment of the present disclosure. Hereinafter, the light emitting diode of the present embodiment will be described in detail with respect to the differences from the embodiment of FIG. 15, and the same contents will be briefly described or a description thereof will be omitted.

Referring to FIG. 24, the light emitting diode according to the present exemplary embodiment is generally similar to the light emitting diode described with reference to FIG. 15 except for arrangements and shapes of light emitting cells C1 to C7.

That is, the embodiment in FIG. 15, the first to fourth light emitting cells C1 to C4 are arranged in a matrix of 2×2, the fifth light emitting cell C5 and the sixth light emitting cell C6 are arranged in two rows with a same size, and the seventh light emitting cell C7 is placed near edges of one side of the fifth light emitting cell C5 and the sixth light emitting cell C6. In addition, the seventh light emitting cell C7 to which the first bump pad 39a is connected and a connecting portion of the first light emitting cell C1 to which the second bump pad 39b is connected are disposed in a diagonal direction with respect to each other.

On the contrary, in the present embodiment, the first to fourth light emitting cells C1 to C4 are arranged in one row, and the fifth to seventh light emitting cells C5 to C7 are arranged in another row. In addition, the fifth light emitting cell C5 is adjacent to the fourth light emitting cell C4, and the seventh light emitting cell C7 is adjacent to the first light emitting cell C1. Accordingly, a connecting portion of the first bump pad 39a electrically connected to the seventh light emitting cell C7 and a connecting portion of the second bump pad 39b electrically connected to the first light emitting cell C1 are disposed adjacent to each other.

Meanwhile, with the arrangement that four light emitting cells, i.e., the first to fourth light emitting cells C1 to C4, are arranged in one row, and three light emitting cells, i.e., the fifth to seventh light emitting cells C5 to C7, are arranged in another row, the first to fourth light emitting cells C1 to C4 may have relatively narrow and long shapes as compared with the fifth to seventh light emitting cells C5 to C7. Accordingly, a light emitting area of each light emitting cell may be generally formed in uniform.

Further, in the present embodiment, the first bump pad 39a covers all the openings 33b of the lower insulation layer 33 disposed on an upper portion of the fifth to seventh light emitting cells C5 to C7, and the second bump pad 39b covers at least partially all the openings 33b of the lower insulation layer 33 disposed on an upper portion of the first to fourth light emitting cells C1 to C4. The second bump pad 39b may cover all the openings 33b of the lower insulation layer 33 disposed on the upper portion of the first to fourth light emitting cells C1 to C4. The openings 33b of the lower insulation layer 33 are covered with the first or second bump pads 39a or 39b, thereby more efficiently dissipating heat generated in the light emitting cells C1 to C7 to the outside through the first or second bump pads 39a or 39b.

In the embodiment of FIG. 15, the second pad metal layer 35b is surrounded by the connector 35ab, but the second pad metal layer 35b is disposed outside of the connector 35ab in the present embodiment. As described above, the second pad metal layer 35b may be surrounded by the connector 35ab or may be disposed outside of the connector 35ab.

Ninth Embodiment

Figure 25:
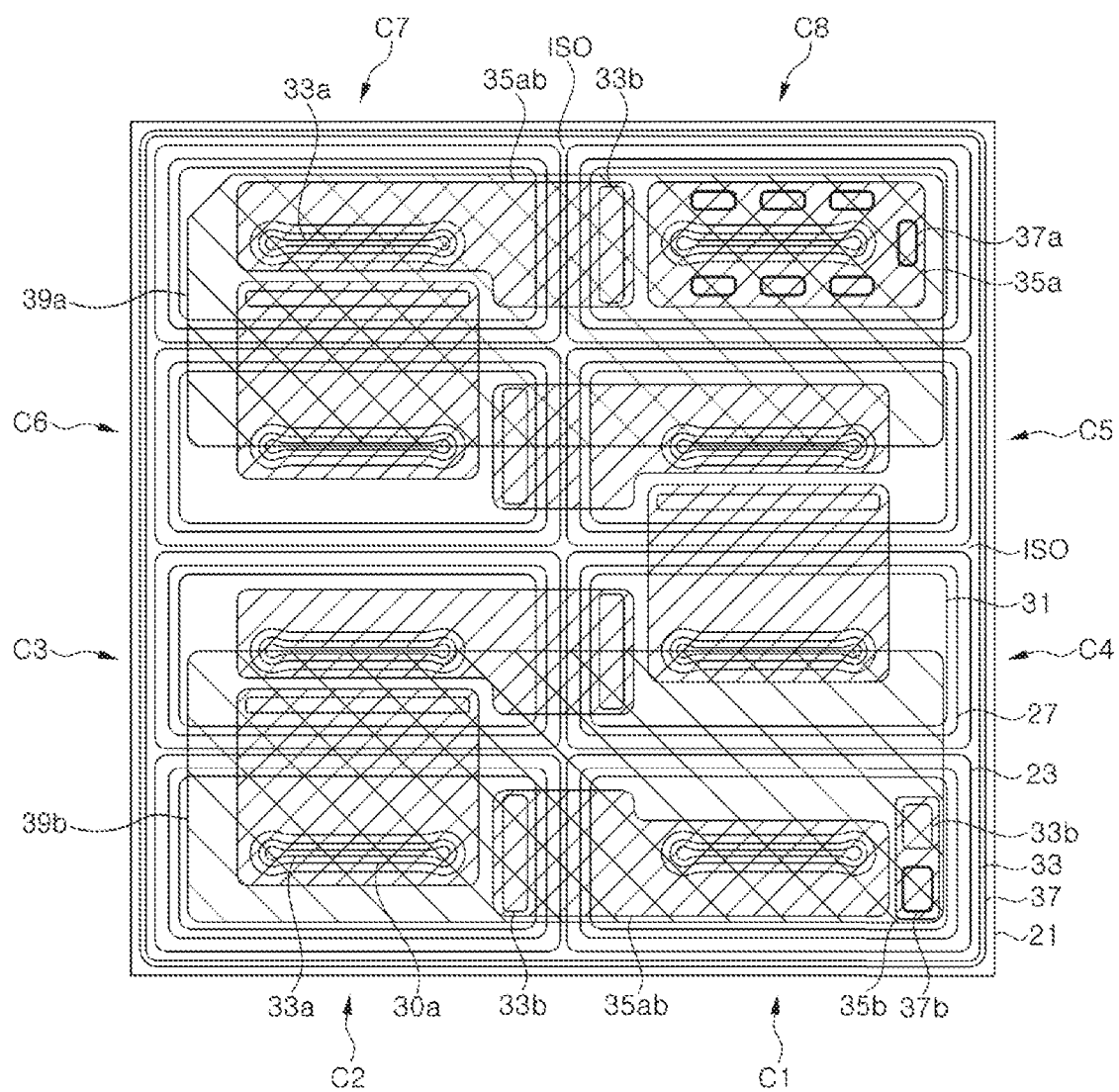
FIG. 25 is a schematic plan view of a light emitting diode according to a tenth exemplary embodiment of the present disclosure.

FIG. 25 is a schematic plan view of a light emitting diode according to a ninth exemplary embodiment of the present disclosure. Hereinafter, the light emitting diode of the present embodiment will be described in detail with respect to the differences from the embodiment of FIG. 15, and the same contents will be briefly described or a description thereof will be omitted.

Referring to FIG. 25, the light emitting diode according to the present exemplary embodiment is generally similar to the light emitting diode described with reference to FIG. 15 except for number, arrangements and shapes of light emitting cells C1 to C8.

That is, in the present embodiment, the light emitting diode includes eight light emitting cells C1 to C8, and the light emitting cells C1 to C8 are arranged in a matrix of 4×2. In other words, two light emitting cells are arranged in each of four rows, and the light emitting cells C1 to C8 have similar cell sizes. Moreover, these light emitting cells C1 to C8 are connected in series to each other by the connectors 35ab.

The first bump pad 39a is disposed over upper regions of the four light emitting cells C5 to C8 connected in series, and the second bump pad 39b is also disposed over upper regions of the four light emitting cells C1 to C4 connected in series. The first bump pad 39a is connected to the first pad metal layer 35a through the first opening 37a of the upper insulation layer 37 in the upper region of the eighth light emitting cell C8 placed at the last terminal of the series array of light emitting cells. The second bump pad 39b is connected to the second pad metal layer 35b through the second opening 37b of the upper insulation layer 37 in the upper region of the first light emitting cell C1 placed at the first terminal of the series array of light emitting cells.

In the present embodiment, the first bump pad 39a may at least partially overlap with the opening 33b of the lower insulation layer 33 disposed over the fifth light emitting cell C5, or the first bump pad 39a may not overlap with the opening 33b at all. In a case that they overlap, heat generated in the fifth light emitting cell C5 may be more efficiently dissipated through the first bump pad 39a. In a case that they do not overlap, the first bump pad 39a and the connector 35ab electrically connected to the second conductivity type semiconductor layer 27 of the fifth light emitting cell C5 may also not overlap each other, thereby preventing the insulation breakdown of the upper insulation layer 37 on the fifth light emitting cell C5 by a high potential difference between the first bump pad 39a and the connector 35ab.

In the embodiment of FIG. 15, the second pad metal layer 35b is surrounded by the connector 35ab, but the second pad metal layer 35b is disposed outside of the connector 35ab in the present embodiment. As such, the second pad metal layer 35b may be surrounded by the connector 35ab or may be disposed outside of the connector 35ab.

Tenth Embodiment

Figure 26:
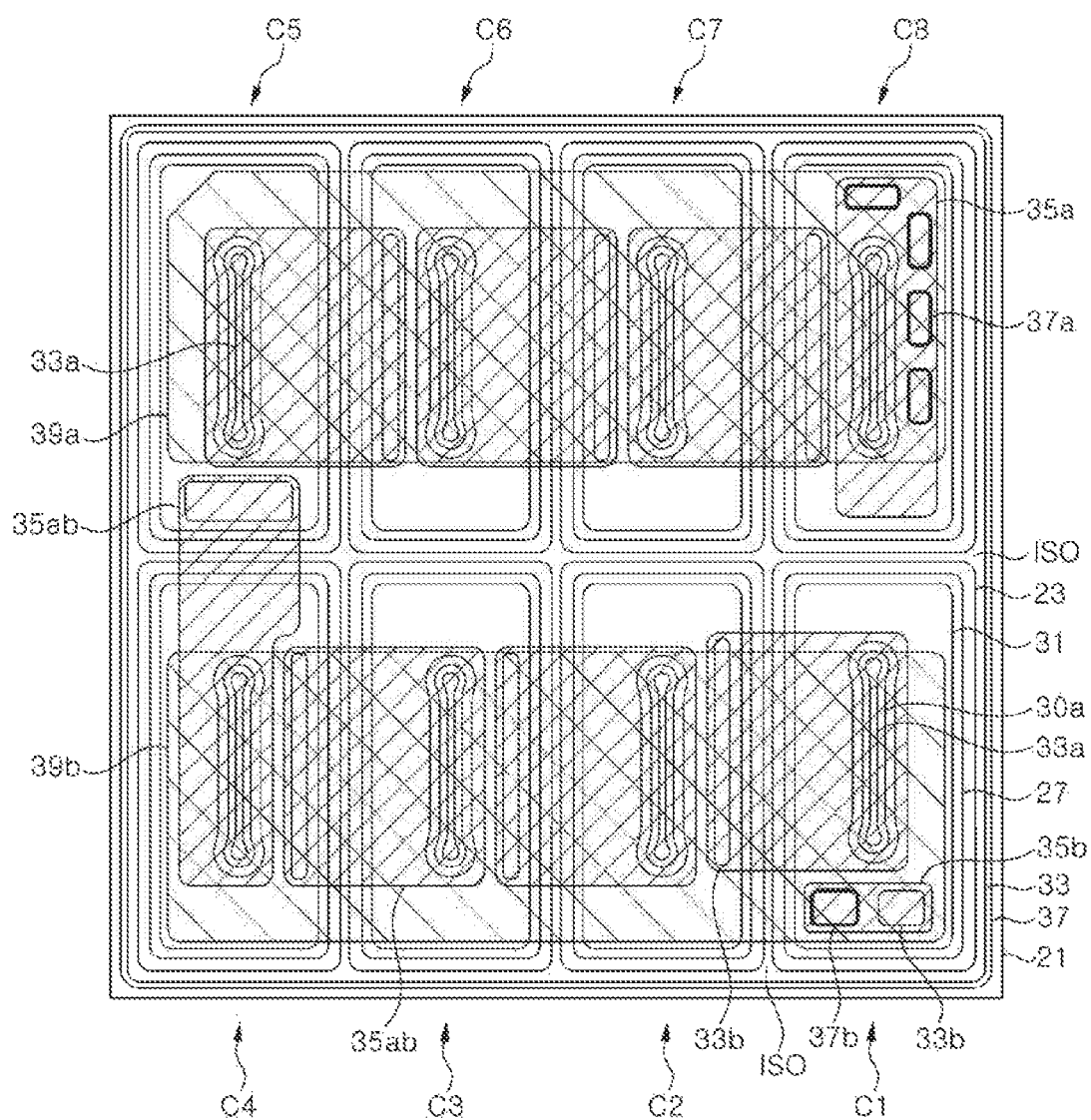
FIG. 26 is a schematic plan view of a light emitting diode according to an eleventh exemplary embodiment of the present disclosure.

FIG. 26 is a schematic plan view of a light emitting diode according to a tenth exemplary embodiment of the present disclosure.

Referring to FIG. 26, the light emitting diode according to the present exemplary embodiment is generally similar to the light emitting diode described with reference to FIG. 24 except for number and shapes of light emitting cells C1 to C8.

That is, in the present embodiment, the light emitting diode includes eight light emitting cells C1 to C8, and the light emitting cells C1 to C8 are arranged in a matrix of 2×4. In other words, four light emitting cells are arranged in each of two rows, and the light emitting cells C1 to C8 have similar cell sizes. Moreover, these light emitting cells C1 to C8 are connected in series to each other by the connectors 35ab.

The first bump pad 39a is disposed over upper regions of the four light emitting cells C5 to C8 connected in series, and the second bump pad 39b is also disposed over upper regions of the four light emitting cells C1 to C4 connected in series. The first bump pad 39a is connected to the first pad metal layer 35a through the first opening 37a of the upper insulation layer 37 at the upper region of the eighth light emitting cell C8 placed at the last terminal of the series array of light emitting cells. The second bump pad 39b is connected to the second pad metal layer 35b through the second opening 37b of the upper insulation layer 37 at the upper region of the first light emitting cell C1 placed at the first terminal of the series array of light emitting cells.

In the present embodiment, the first bump pad 39a may at least partially overlap with the opening 33b of the lower insulation layer 33 disposed over the fifth light emitting cell C5, or the first bump pad 39a may not overlap with the opening 33b at all. In a case that they overlap, heat generated in the fifth light emitting cell C5 may be more efficiently dissipated through the first bump pad 39a. In a case that they do not overlap, the first bump pad 39a and the connector 35ab electrically connected to the second conductivity type semiconductor layer 27 of the fifth light emitting cell C5 may also not overlap each other, thereby preventing the insulation breakdown of the upper insulation layer 37 on the fifth light emitting cell C5 by the high potential difference between the first bump pad 39a and the connector 35ab.

Eleventh Embodiment

Figure 27:
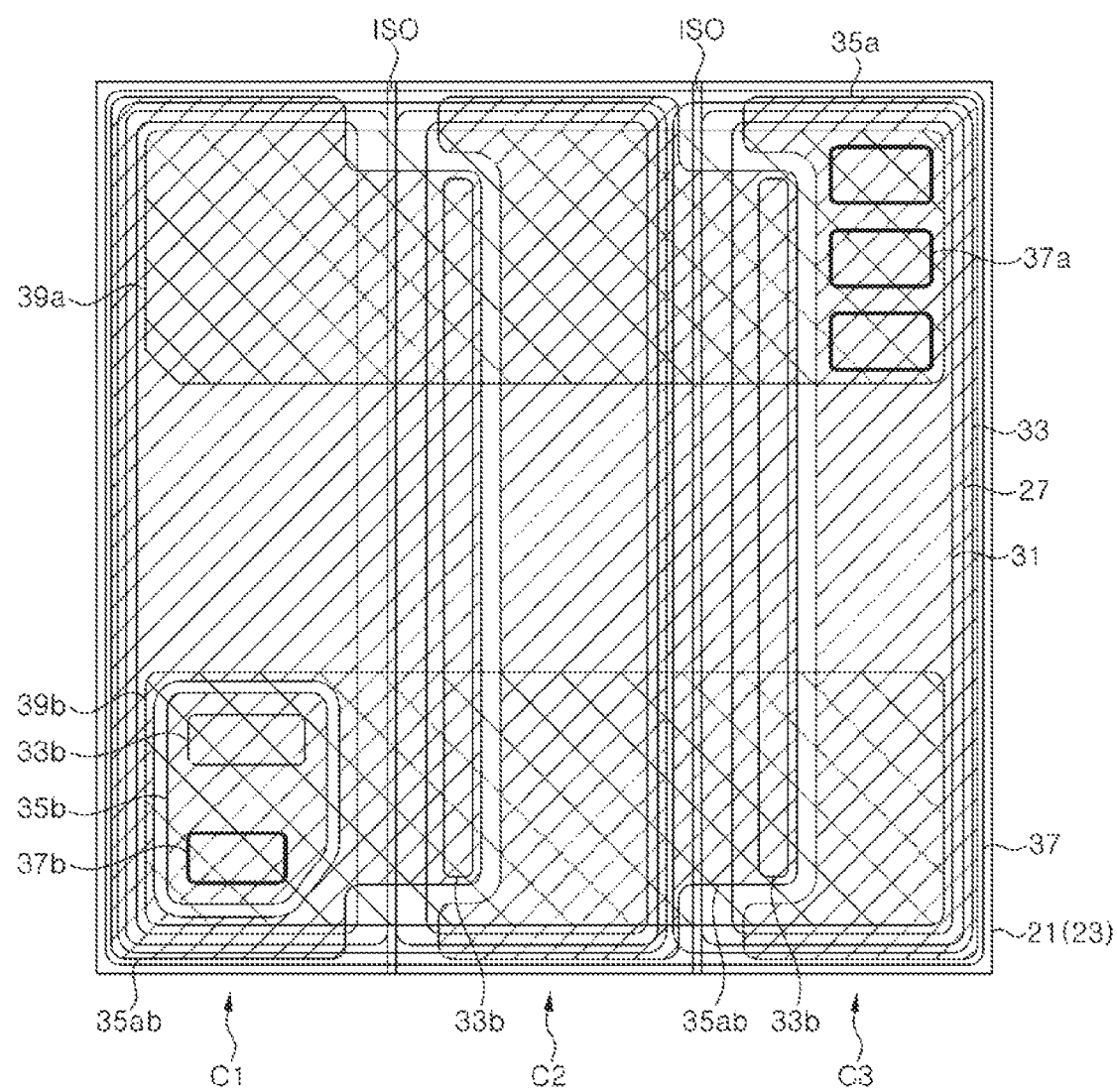
FIG. 27 is a schematic plan view of a light emitting diode according to a twelfth exemplary embodiment of the present disclosure.

FIG. 27 is a schematic plan view of a light emitting diode according to an eleventh exemplary embodiment of the present disclosure. The light emitting diode of the present embodiment will be described in detail with respect to the differences from the embodiment of FIG. 15, and the same contents will be briefly described or a description thereof will be omitted.

Referring to FIG. 27, the light emitting diode according to the present embodiment includes three light emitting cells C1, C2, and C3 disposed on the substrate 21, and the light emitting cells are connected in series by the connectors 35ab. The light emitting cells C1, C2, and C3 are separated from each other by the cell isolation region ISO. Although the upper surface of the substrate 21 is exposed to the periphery of the light emitting cells along the edge of the substrate 21 in the previous embodiment, edges of the substrate 21 in the present embodiment are covered with the first conductivity type semiconductor layer 23. However, the present disclosure is not limited thereto, and in other embodiments, the upper surface of the substrate 21 may be exposed along the edge thereof.

Further, the first pad metal layer 35a and the connectors 35ab are electrically connected to the first conductivity type semiconductor layer 23 through the via-holes 30a of the light emitting cells in the embodiments above, in the present embodiment, however, the first pad metal layer 35a and the connectors 35ab are electrically connected to the first conductivity type semiconductor layer 23 exposed to outside of the mesa.

To do this, the lower insulation layer 33 covers most of the light-emitting cells C1 to C3 and covers the cell isolation region ISO. The lower insulation layer 33 has openings 33b exposing the ohmic reflection layer 31, and exposes the first conductivity type semiconductor layer 23 around the second conductivity type semiconductor layer 27. Accordingly, the first conductivity type semiconductor layers 23 are exposed in edge regions of each of the light emitting cells C1, C2, and C3, and the ohmic reflection layer on each of the light emitting cells C1, C2, and C3 is exposed through the lower insulation layer 33.

The first pad metal layer 35a is connected to the first conductivity type semiconductor layer 23 exposed around the second conductivity type semiconductor layer 27 of the third light emitting cell C3, and the connectors 35ab are connected to the first conductivity type semiconductor layer 23 exposed around the second conductivity type semiconductor layers 27 of the first and second light emitting cells C1 and C2 and connected to an adjacent ohmic reflection layer 31.

The second pad metal layer 35b is disposed on the first light emitting cell C1, and is electrically connected to the ohmic reflection layer 31 through the opening 33b of the lower insulation layer 33.

Meanwhile, the upper insulation layer 37 covers the first and second pad metal layers 35a and 35b and the connectors 35ab, and covers an edge of the lower insulation layer 33. The upper insulation layer 37 has first openings 37a exposing the first pad metal layer 35a and second openings 37b exposing the second pad metal layer 35b.

Each of the first bump pad 39a and the second bump pad 39b is disposed over all three light emitting cells C1, C2, and C3. The first bump pad 39a is connected to the first pad metal layer 35a through the first openings 37a of the upper insulation layer 37. Moreover, the second bump pad 39b is connected to the second pad metal layer 35b through the second opening 37b of the upper insulation layer 37.

In the present embodiment, the count of the first openings 37a is three. However, a different count of the first openings 37a may be selected, or may be one first opening 37a. Although the second opening 37b is illustrated as being one, the count of the second opening 37b may be one or more. Meanwhile, the second opening 37b is disposed apart from the second openings 33b of the lower insulation layer 33 in the lateral direction.

Twelfth Embodiment

Figure 28:
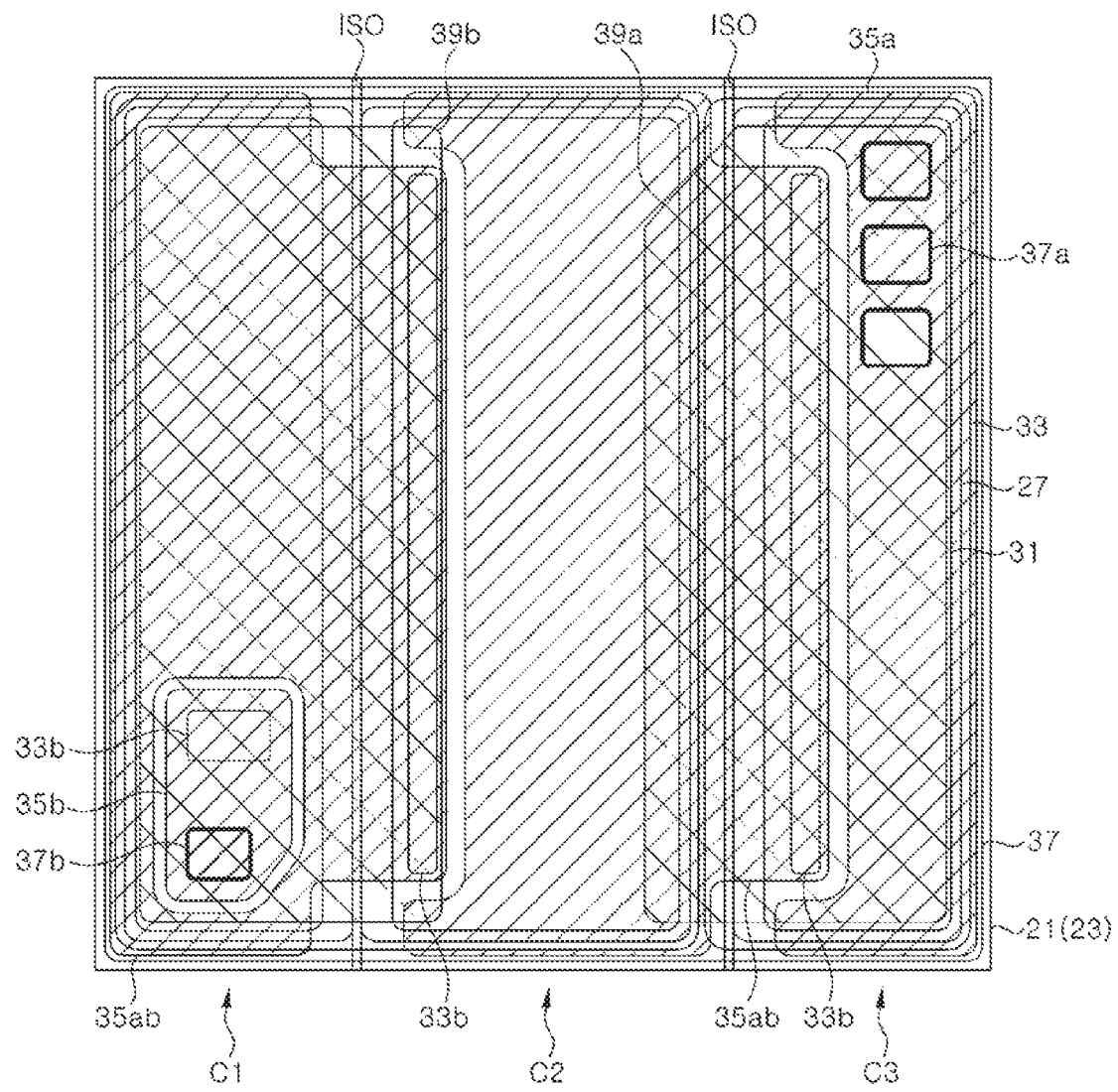
FIG. 28 is a schematic plan view of a light emitting diode according to a thirteenth exemplary embodiment of the present disclosure.

FIG. 28 is a schematic plan view of a light emitting diode according to another exemplary embodiment of the present disclosure.

Referring to FIG. 28, the light emitting diode according to the present exemplary embodiment is generally similar to the light emitting diode described with reference to FIG. 27 except for an arrangement of the first bump pad 39a and the second bump pad 39b.

In the present embodiment, the first bump pad 39a is disposed over the second light emitting cell C2 and the third light emitting cell C3, and the second bump pad 39b is disposed over the first light emitting cell C1 and the second light emitting cell C2.

Accordingly, the second light emitting cell C2 partially overlaps with both the first bump pad 39a and the second bump pad 39b, but each of the first light emitting cell C1 and the third light emitting cell C3 partially overlap with one of the bump pads 39b and 39a.

A potential difference of about 3 Vf is generated between the second bump pad 39b and the first pad metal layer 35a on the third light emitting cell C3. In the embodiment of FIG. 27, a potential difference of 3 Vf is generated between the second bump pad 39b and the first pad metal layer 35a with the upper insulation layer 37 interposed therebetween. In contrast, the potential difference of about 3 Vf is generated between the second bump pad 39b and the first pad metal layer 35a on the third light emitting cell C3 in the present embodiment, but the upper insulation layer 37 may be prevented from being damaged by the potential difference since the second bump pad 39b and the third light emitting cells C3 do not overlap with each other.

As described above, the reliability of the light emitting diode may further improve by placing the first or second bump pads 39a and 39b on a portion of the light emitting cells.

Thirteenth Embodiment

Figure 29:
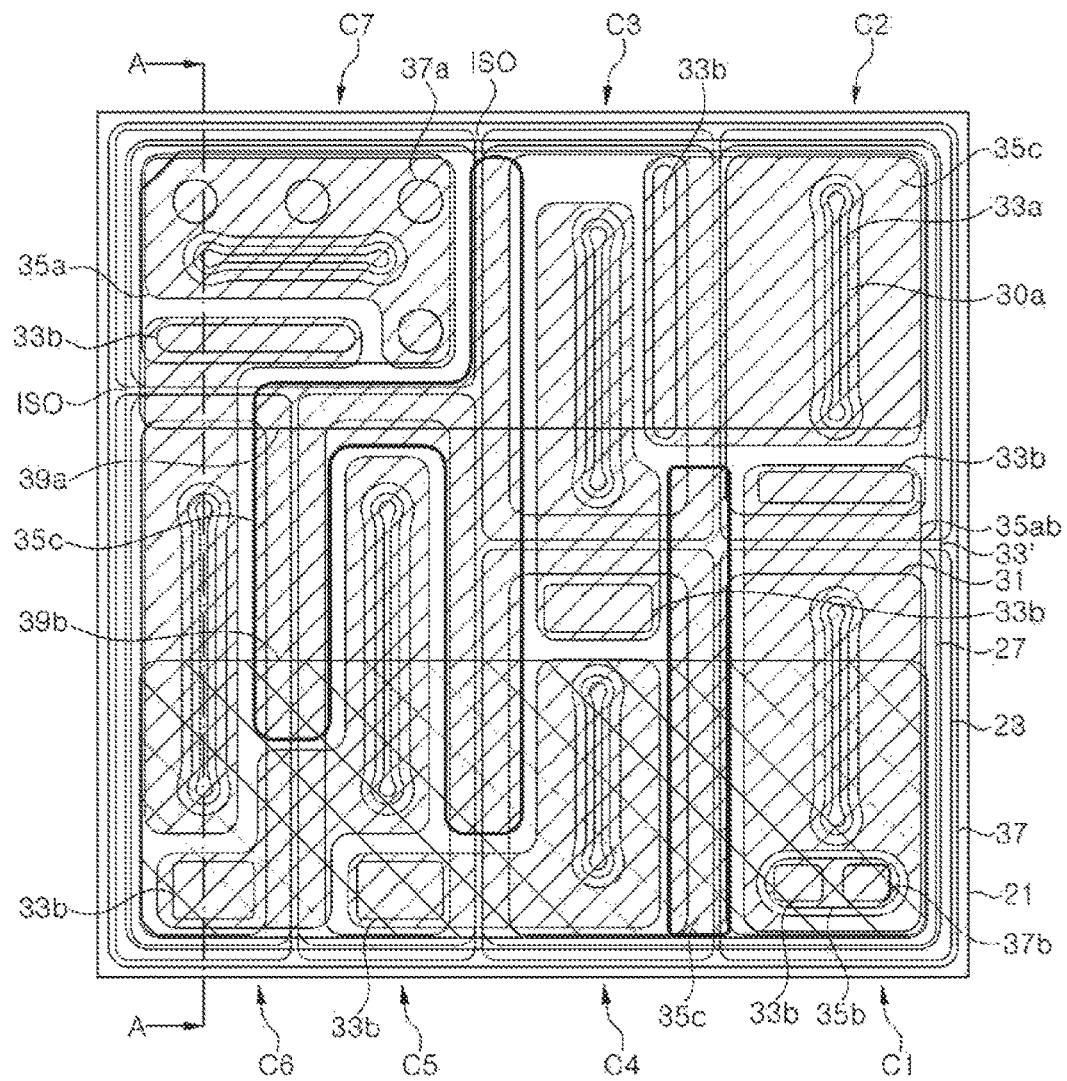
FIG. 29 is a schematic plan view of a light emitting diode according to a fourteenth exemplary embodiment of the present disclosure.
Figure 30:
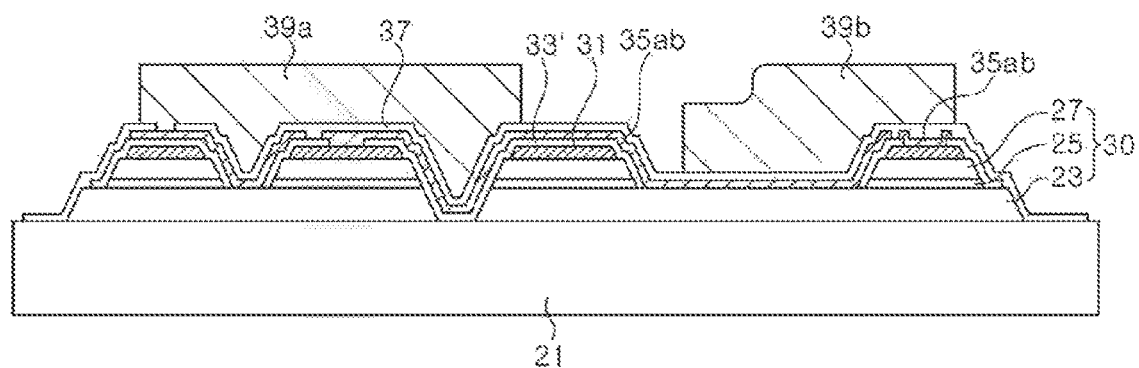
FIG. 30 is a schematic cross-sectional view taken along the line A-A of FIG. 29.

FIG. 29 is a schematic plan view of a light emitting diode according to a thirteenth exemplary embodiment of the present disclosure, and FIG. 30 is a schematic cross-sectional view taken along the line A-A of FIG. 29.

Referring to FIG. 29 and FIG. 30, since the light emitting diode according to the present exemplary embodiment is generally similar to the light emitting diode described with reference to FIGS. 1 to 3, detailed description about the same contents will be omitted.

In addition, the light emitting diode according to the present embodiment may further include a floating reflection layer 35c as described with reference to FIGS. 10A and 10B. The floating reflection layer 35c is disposed in a region between the light emitting cells. The floating reflection layer 35c according to the present embodiment is somewhat different in shape from the floating reflection layer 35c of the light emitting diode described with reference to FIG. 10A, but a location and a shape of the floating reflection layer may be variously modified.

In the present exemplary embodiment, a lower insulation layer 33' includes a distributed Bragg reflector. For example, the lower insulation layer 33' may include a distributed Bragg reflector in which $SiO_2$ and $TiO_2$ are repeatedly stacked on above another.

Meanwhile, a location of an edge of the lower insulation layer 33' in the light emitting diode according to the present embodiment differs from a location of the edge of the lower insulation layer 33 of the light emitting diode described with reference to FIGS. 1 to 3. In the present embodiment, the lower insulation layer 33' covers edges of the connectors 35ab, and the edges of the lower insulation layer 33' are further spaced inwardly apart from an edge of the substrate 21 than outer edges of the first conductivity type semiconductor layer 23 of the light emitting cells C1 to C7. That is, the edges of the lower insulation layer 33' are mainly disposed on the exposed first conductivity type semiconductor layer 23.

An edge of the upper insulation layer 37 is disposed between the edge of the substrate 21 and the light emitting cells, and thus the lower insulation layer 33' according to the present embodiment is spaced further apart from the edge of the upper insulation layer 37 as compared with the embodiment of FIG. 1. As a result, the lower insulation layer 33' may be prevented from being damaged by moisture penetration from the outside through surface layers of the upper insulation layer 37 and the substrate 21, thereby improving the reliability of the light emitting diode.

In a case that the lower insulation layer 33' is formed of a single layer such as $SiO_2$ or $Si_3N_4$, the single layer is relatively highly stable against moisture, but in a case that the lower insulation layer 33' is formed of a multilayer structure like the distributed Bragg reflector, the distributed Bragg reflector may be susceptible to moisture. In particular, since a moisture penetration path is relatively short near the edge of the substrate 21, the distributed Bragg reflector may be easily damaged by moisture in a case that the distributed Bragg reflector is disposed close to the edge of the substrate 21.

However, according to the present embodiment, the connectors 35ab are disposed away from the edge of the substrate 21, and the lower insulation layer 33' including the distributed Bragg reflector is disposed away from the edge of the substrate 21, thereby greatly improving the reliability of the light emitting diode under high temperature and high humidity conditions.

Figure 31:
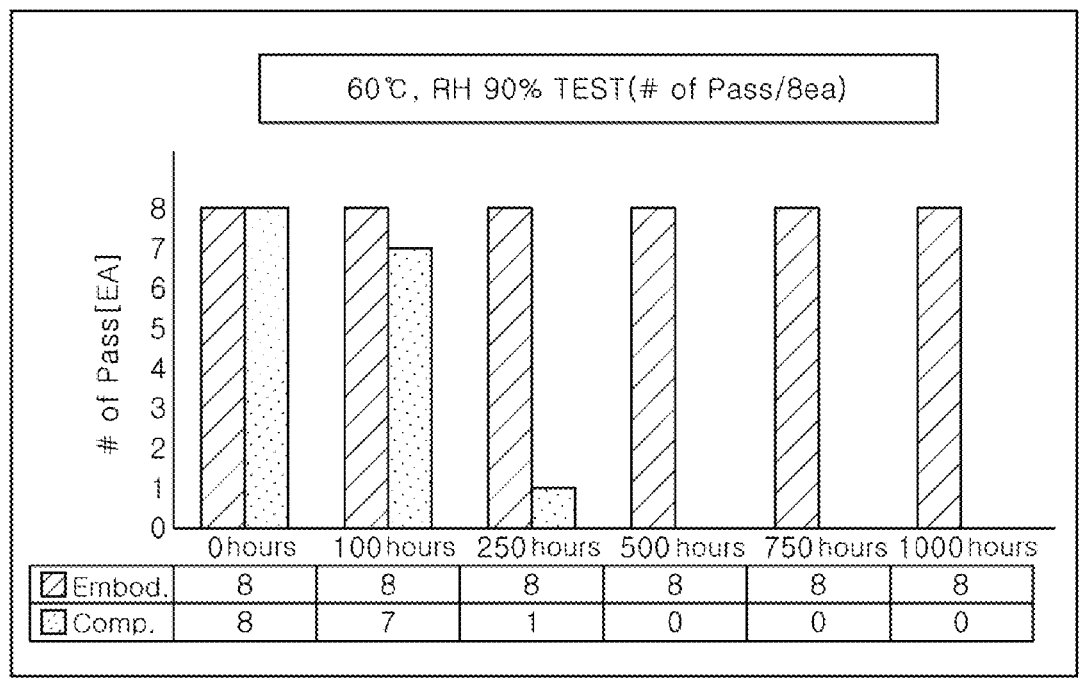
FIG. 31 is a schematic graph illustrating reliability test results under high temperature and high humidity conditions.

FIG. 31 is a schematic graph illustrating reliability test results under high temperature and high humidity conditions. As described with reference to FIGS. 29 and 30, a lower insulation layer 33' includes a $TiO_2/SiO_2$ distributed Bragg reflector, and eight samples of the embodiment where edges of the lower insulation layer 33' are disposed on the first conductivity type semiconductor layer 23 and eight samples of the comparative example where the edges of the lower insulation layer are disposed on the substrate 21 were prepared. A forward voltage Vf of the light emitting diode in those samples was measured with a current of 25 mA under conditions of a temperature of 60° C. and a relative humidity RH of 90%. A decrease of the forward voltage Vf was treated as a pass, and samples exceeding 5% of an initial value were treated as defective.

Referring to FIG. 31, the samples of the comparative example where the edge of the lower insulation layer was disposed on the substrate 21 and relatively close to the edge of the upper insulation layer 37, which almost all failed after 250 hours. On the other hand, the samples of the embodiment where the edge of the lower insulation layer was disposed on the first conductivity type semiconductor layer 23 and relatively far from the edge of the upper insulation layer 37 did not a large change in the forward voltage and remained in good state.

The samples in which the lower insulation layer was formed of the single layer of $SiO_2$ did not have a large change in the forward voltage in the high temperature and high humidity test even when the edge of the lower insulation layer was disposed on the substrate 21, but the samples were susceptible to moisture when the lower insulation layer was formed of the distributed Bragg reflector. However, by moving the edge of the lower insulation layer to an inner side of the light emitting diode and separating from the edge of the upper insulation layer 37 as in the present embodiment, it was possible to prevent defects due to moisture.

Fourteenth Embodiment

Figure 32:
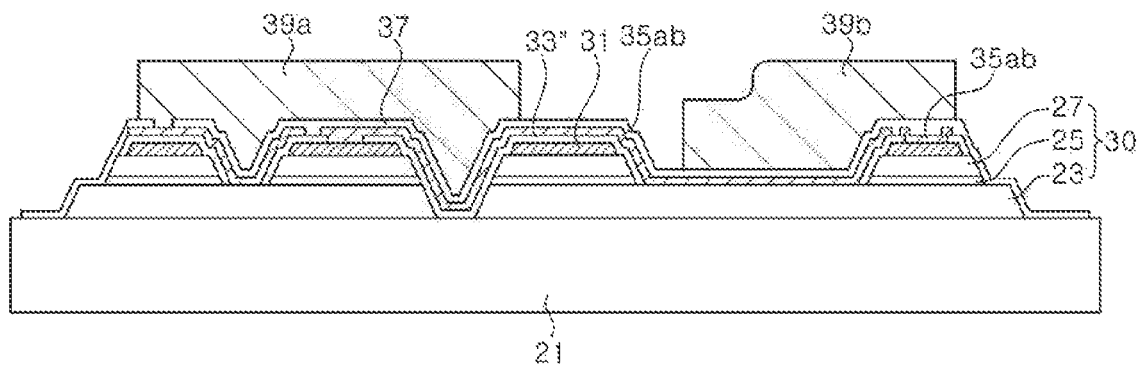
FIG. 32 is a schematic cross-sectional view of a light emitting diode according to a fifteenth exemplary embodiment of the present disclosure.

FIG. 32 is a schematic cross-sectional view of a light emitting diode according to a fourteenth exemplary embodiment of the present disclosure.

Referring to FIG. 32, the light emitting diode according to the present exemplary embodiment is generally similar to the light emitting diode described with reference to FIGS. 29 and 30, but edges of a lower insulation layer 33" are placed further inwardly than the thirteenth embodiment. In the present embodiment, the edges of the lower insulation layer 33" are illustrated as being mainly placed on the second conductivity type semiconductor layer 27, but may be mainly placed on a side surface thereof.

By further placing the edges of the lower insulation layer 33" inwardly from the edge of the substrate 21, the moisture penetration path may be further increased, and it is expected that the reliability may be further improved.

Fifteenth Embodiment

Figure 33:
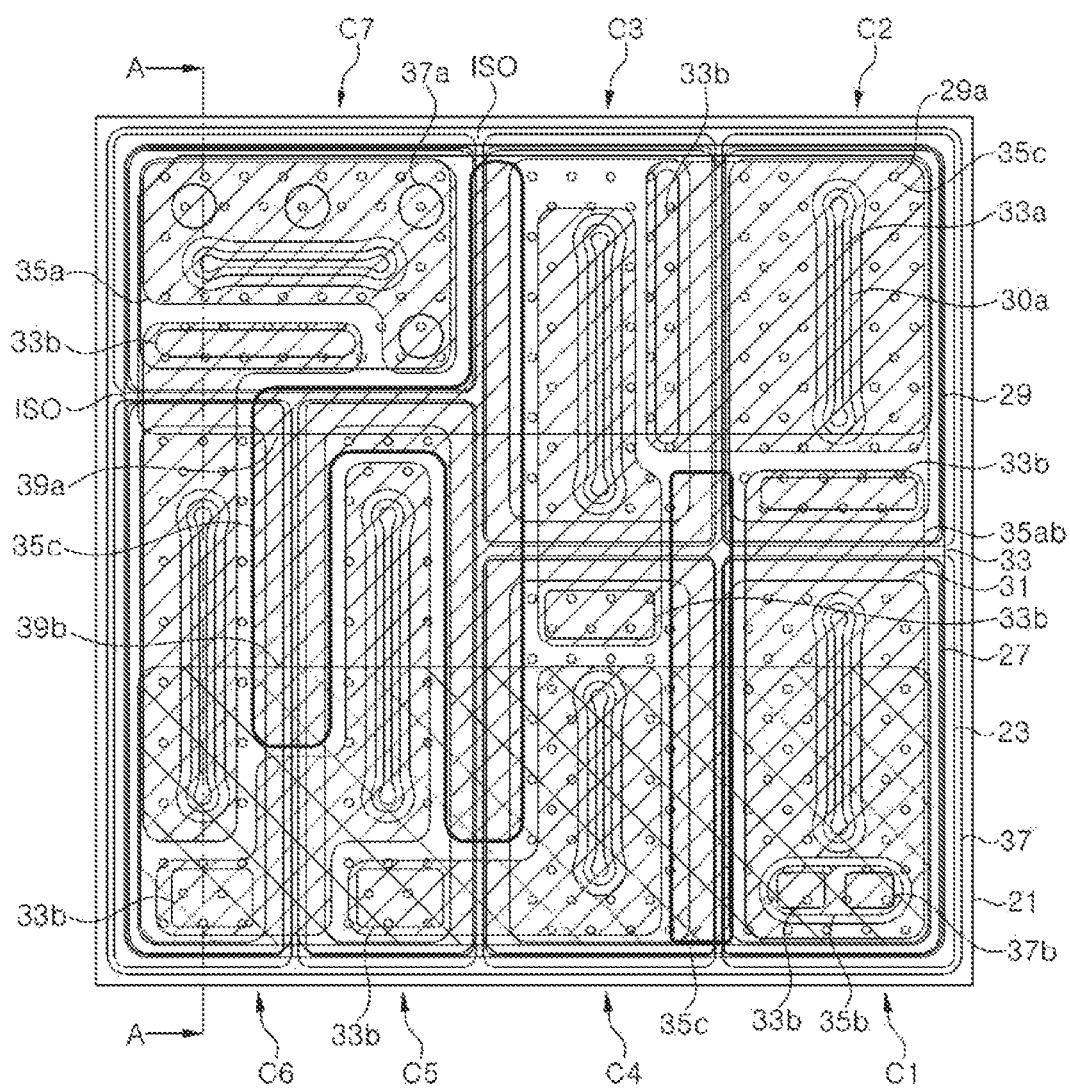
FIG. 33 is a schematic plan view of a light emitting diode according to a sixteenth embodiment of the present disclosure.
Figure 34:
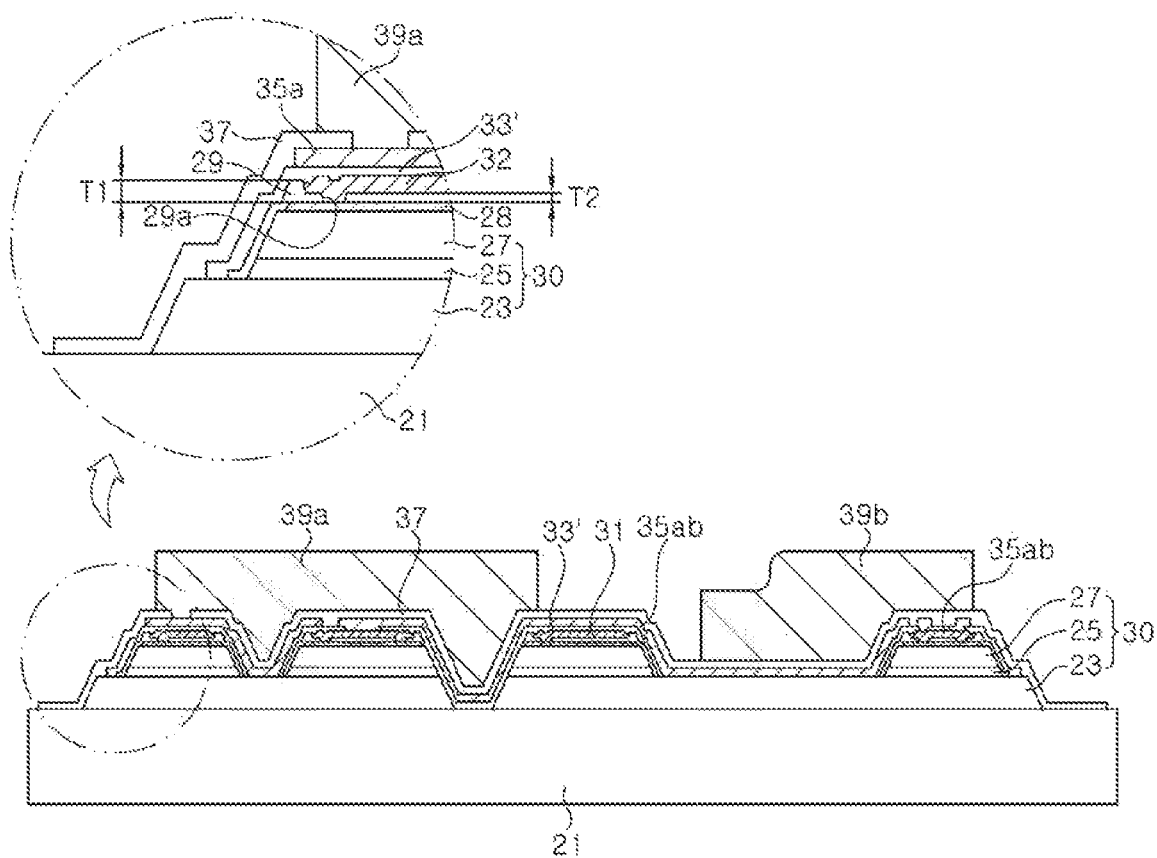
FIG. 34 is a schematic cross-sectional view taken along the line A-A of FIG. 33.

FIG. 33 is a schematic plan view of a light emitting diode according to a fifteenth exemplary embodiment of the present disclosure, and FIG. 34 is a schematic cross-sectional view taken along the line A-A of FIG. 33.

Referring to FIGS. 33 and 34, the light emitting diode according to the present exemplary embodiment is generally similar to the light emitting diode described with reference to FIGS. 29 and 30 except for a structure of the ohmic reflection layer 31. To avoid redundancy, the detailed description of the same components will be omitted, and differences will be described.

The light emitting diode according to the present embodiment includes an ohmic contact layer 28, a transparent insulation layer 29, and a metal reflection layer 32. The ohmic contact layer 28 is formed of a transparent conductive oxide layer such as ITO or ZnO. The ohmic contact layer 28 may be limitedly disposed on the second conductivity type semiconductor layer 27 and may be in ohmic contact with the second conductivity type semiconductor layer 27.

Meanwhile, the transparent insulation layer 29 may cover the ohmic contact layer 28 and may further cover side surfaces of the second conductivity type semiconductor layer 27 and the active layer 25. An edge of the transparent insulation layer 29 may be covered with the lower insulation layer 33' as shown in FIG. 34. Accordingly, the edge of the transparent insulation layer 29 is placed farther from the edge of the substrate 21 than that of the lower insulation layer 33'. However, the present disclosure is not limited thereto, and a portion of the transparent insulation layer 29 may be exposed to outside of the lower insulation layer 33'. In addition, the cell isolation region ISO may be formed after the transparent insulation layer 29 is patterned first, and thus the transparent insulation layer 29 may be removed from the cell isolation region ISO as shown in the drawings.

The transparent insulation layer 29 has openings 29a exposing the ohmic contact layer 28. A plurality of openings 29a may be disposed over the ohmic contact layer 28. The transparent insulation layer 29 may be formed of, for example, $SiO_2$.

Meanwhile, the metal reflection layer 32 is disposed on the transparent insulation layer 29 and connected to the ohmic contact layer 28 through the openings 29a. The metal reflection layer 32 includes a reflective metal and may include, for example, Ni/Ag. Further, the metal reflection layer 32 may include a barrier layer for protecting the reflective metal material layer, and may include an Au layer for preventing oxidation of the metal layer.

In addition, as shown in the drawings, the transparent insulation layer 29 may include a recessed region over the second conductivity type semiconductor layer 27, and the metal reflection layer 32 may be disposed within an upper region of the recessed region. The transparent insulation layer 29 may be formed with a thickness of T1 on the ohmic contact layer 28, and may be thinned to a thickness of T2 as the transparent insulation layer 29 is recessed. Accordingly, the transparent insulation layer 29 disposed on the second conductivity type semiconductor layer 27 includes a portion having a first thickness of T1 and a portion having a second thickness of T2, and further includes the openings 29a exposing the ohmic contact layer 28. The portion having the second thickness of T2 is placed under the recessed region.

The metal reflection layer 32 covers the transparent insulation layer 29 within the recessed region. The metal reflection layer 32 may be relatively thin in an edge portion of the recessed region, and relatively thick in a center of the recessed region. Accordingly, it is possible to prevent a side surface of the metal reflection layer 32 from being thickened.

A metal reflection layer 32 is formed using a lift-off technique after a photoresist pattern is first formed on the transparent insulation layer 29 having the openings 29a formed thereon. At this time, the recessed region may be formed on the transparent insulation layer 29 by partially etching the transparent insulation layer 29 using the photoresist pattern as an etching mask, and the metal reflection layer 32 is formed in this region. In particular, the transparent insulation layer 29 may be etched using a wet etching technique using BOE or the like.

In a case that the recessed region is not formed in the transparent insulation layer 29, side surfaces of the metal reflection layer 32 may be formed thick along inner walls of the photoresist pattern. In this case, a defective deposition of the lower insulation layer 33' formed on the metal reflection layer 32 may be caused. In contrast, by forming the recessed region on the transparent insulation layer 29 using wet etching, the side surfaces of the metal reflection layer 32 may be formed to be thin, thereby preventing the defective deposition of the lower insulation layer 33'.

Meanwhile, the transparent insulation layer 29 is patterned and edges of the transparent insulation layer 29 are formed first while the openings 29a are formed, and the lower insulation layer 33' is patterned separately. With this patterning, the lower insulation layer 33' may cover the edges of the transparent insulation layer 29 as shown in the drawings. However, the present disclosure is not limited thereto, and a portion of the transparent insulation layer 29 may be formed so as to remain outside of the lower insulation layer 33'.

By using the transparent ohmic contact layer 28, the transparent insulation layer 29, and the metal reflection layer 32, reflectance of light may be improved as compared with the case of using the ohmic reflection layer 31, and thus the luminous efficacy may be improved.

In the present embodiment, the lower insulation layer 33' is used, but the present disclosure is not limited thereto. For instance, the lower insulation layer 33 described with reference to FIGS. 1 to 3 may be used. In particular, in a case that the lower insulation layer 33 is formed of $SiO_2$, the edge of the lower insulation layer 33 may be disposed on the substrate 21.

Lighting Apparatus

Figure 35:
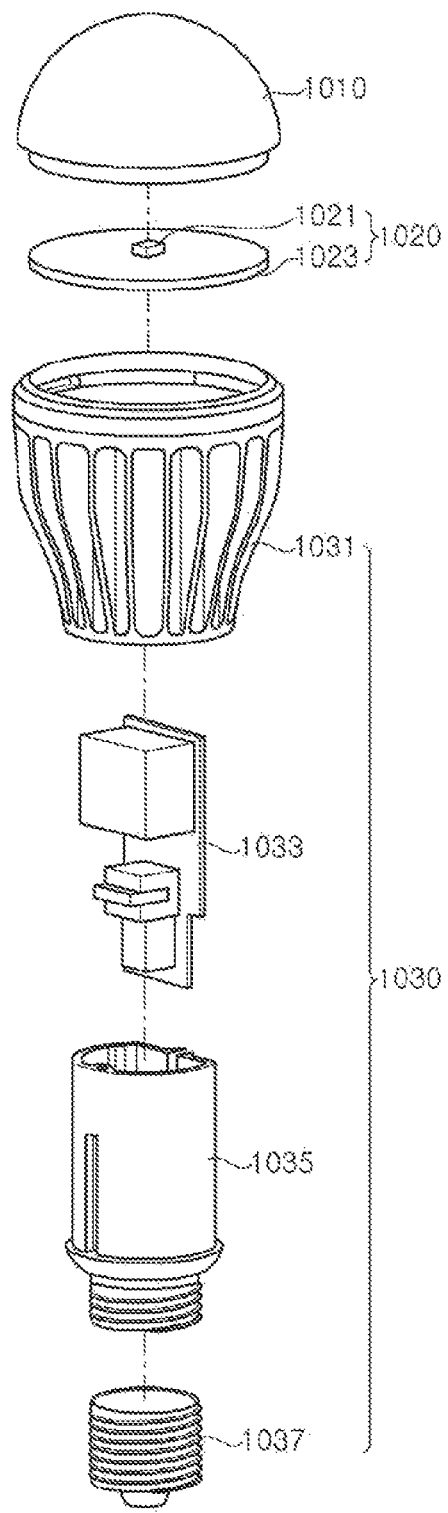
FIG. 35 is an exploded perspective view of a lighting apparatus to which a light emitting diode according to a seventeenth exemplary embodiment of the present disclosure is applied.

FIG. 35 is an exploded perspective view of a lighting apparatus to which a light emitting diode according to one exemplary embodiment of the present disclosure is applied.

Referring to FIG. 35, the lighting apparatus according to the present exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape capable of suppling electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Therefore, the diffusive cover 1010 may be modified to have various shapes depending on usage and applications of the lighting apparatus.

Display Apparatus

Figure 36:
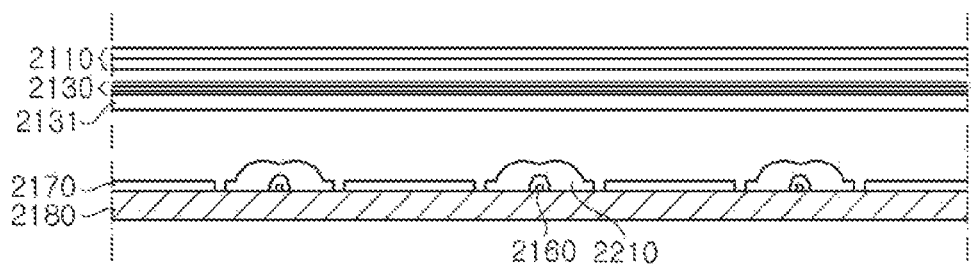
FIG. 36 is a cross-sectional view of one embodiment of a display apparatus to which a light emitting diode according to an eighteenth exemplary embodiment of the present disclosure is applied.

FIG. 36 is a cross-sectional view of one embodiment of a display apparatus to which a light emitting diode according to a first exemplary embodiment of the present disclosure is applied.

The display apparatus according to the present exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, in a case that a reflective material is coated on a surface thereof, the substrate may be disposed on the reflective sheet 2170. Further, a plurality of substrates may be arranged to be flush with one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diode 2160. Light emitted from the light emitting diodes 2160 may be supplied in the form of sheet light to the display panel 2110 through the diffusive plate 2131 and the optical sheets 2130.

As described above, the light emitting diodes according to the exemplary embodiments may be applied to direct type displays like the display apparatus according to the present exemplary embodiment.

Figure 37:
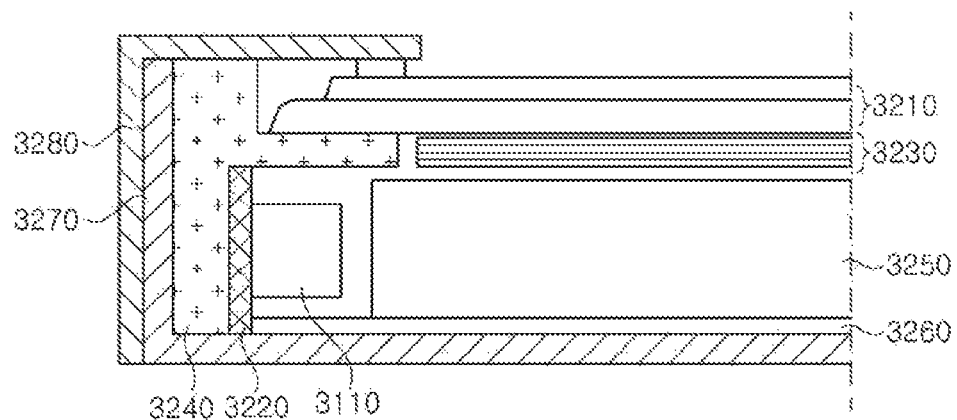
FIG. 37 is a cross-sectional view of one embodiment of a display apparatus to which a light emitting diode according to a nineteenth exemplary embodiment of the present disclosure is applied.

FIG. 37 is a cross-sectional view of one embodiment of a display apparatus to which a light emitting diode according to a second exemplary embodiment of the present disclosure is applied.

The display apparatus according to the present exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed in a periphery of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at an inner side of the lower cover 3270, and a light guide plate 3250 disposed to be flush with the light source module and converting spot light into sheet light. In addition, the backlight unit according to the present embodiment may further include optical sheets 3230 disposed on the light guide plate 3250 to diffuse and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

As described above, the light emitting diodes according to the exemplary embodiments may be applied to edge type displays like the display apparatus according to the present exemplary embodiment.

Figure 38:
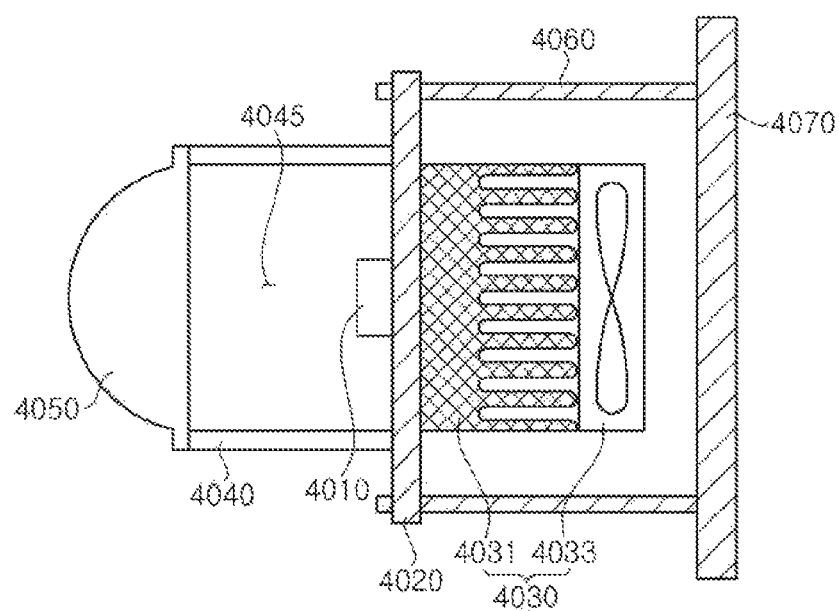
FIG. 38 is a cross-sectional view of a headlight to which a light emitting diode according to a twentieth another exemplary embodiment of the present disclosure is applied.

FIG. 38 is a cross-sectional view of a headlight to which a light emitting diode according to another exemplary embodiment of the present disclosure is applied.

Referring to FIG. 38, the headlight according to the present exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed apart from the lamp body 4070. As the substrate 4020, any substrate capable of supporting the light emitting diode 4010 may be used without limitation. For example, the substrate 4020 may include a substrate having a conductive pattern, such as a printed circuit board. The light emitting diode 4010 may be disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight may be adjusted. Meanwhile, the connection member 4040 is disposed to secure the cover lens 4050 to the substrate 4020 while surrounding the light emitting diode 4010, thereby acting as a light guide providing a luminous path 4045. The connection member 4040 may be formed of a light reflective material or coated therewith. Meanwhile, the heat dissipation unit 4030 may include heat dissipation fins 4031 and/or a heat dissipation fan 4033 to dissipate heat generated upon operation of the light emitting diode 4010.

As described above, the light emitting diodes according to the exemplary embodiments may be applied to headlights, particularly, vehicular headlights, like the headlight according to the present exemplary embodiment.

Although some exemplary embodiments have been described herein, it should be understood that these embodiments are provided for illustration only and are not to be construed in any way as limiting the present disclosure. It should be understood that features or components of one exemplary embodiment may also be applied to other exemplary embodiments without departing from the spirit and scope of the present disclosure. For example, the structure of the ohmic reflection layer described with reference to FIGS. 33 and 34 may be applied to other embodiments including the embodiment described with reference to FIGS. 1 to 3.

We claim:

1. A light emitting diode comprising:
   a substrate;
   a plurality of light emitting cells each including a first conductivity type semiconductor layer, an active layer, and a second conductivity type semiconductor layer;
   an ohmic reflection layer disposed on the second conductivity type semiconductor layer of each of the light emitting cells to form ohmic contact therewith;
   a lower insulation layer covering the light emitting cells and the ohmic reflection layers, the lower insulation layer having a first opening exposing the first conductivity type semiconductor layer and a second opening exposing the ohmic reflection layer of each of the light emitting cells;
   one or more connectors disposed on the lower insulation layer and electrically connecting adjacent light emitting cells to each other to form a series array of light emitting cells;
   a first pad metal layer electrically connected to the first conductivity type semiconductor layer of a last light emitting cell disposed at a last terminal of the series array through the first opening of the lower insulation layer;
   a second pad metal layer electrically connected to the ohmic reflection layer of a first light emitting cell disposed at a first terminal of the series array through the second opening of the lower insulation layer;
   an upper insulation layer covering the one or more connectors and the first and second pad metal layers, the upper insulation layer having a plurality of openings exposing upper surfaces of the first and second pad metal layers, respectively;
   a plurality of floating reflection layers disposed on the lower insulation layer, and covered by the upper insulation layer, the plurality of floating reflection layers being separated from each other; and
   a first bump pad and a second bump pad connected to upper surfaces of the first pad metal layer and the second pad metal layer exposed through the openings of the upper insulation layer, respectively,
   wherein the one or more connectors comprise:
      a first connector associated with the first light emitting cell which is connected in series with a second light emitting cell and the first connector passes one edge of the first light emitting cell and extends to an upper region of the second light emitting cell adjacent to the first light emitting cell, and
   wherein each floating reflection layer is insulated from the first pad metal layer, the second pad metal layer and the one or more connectors;
   wherein a floating reflection layer associated with the first light emitting cell among the plurality of floating reflection layers is disposed along the edge of the substrate and surrounds three sides of the first light emitting cell and a portion of the floating reflection layer extends to the second light emitting cell.

2. The light emitting diode of claim 1,
   wherein the first pad metal layer is disposed within an upper region of the last light emitting cell, and the second pad metal layer is disposed within an upper region of the first light emitting cell.

3. The light emitting diode of claim 2,
wherein the second pad metal layer is surrounded by the first connector electrically connected to the first conductivity type semiconductor layer of the first light emitting cell.

4. The light emitting diode of claim 2,
wherein the first connector is formed of the same material and disposed substantially at the same level as the second pad metal layer.

5. The light emitting diode of claim 1,
wherein the first connector is electrically connected to the first conductivity type semiconductor layer of the first light emitting cell, and comprises at least two segments to pass through an upper edge of the first conductivity type semiconductor layer.

6. The light emitting diode of claim 1,
wherein the second opening of the lower insulation layer exposing the ohmic reflection layer is spaced apart from the openings of the upper insulation layer exposing the second pad metal layer in the lateral direction so as not to overlap each other.

7. The light emitting diode of claim 1,
wherein the first bump pad and the second bump pad are disposed over upper regions of two or more light emitting cells, respectively.

8. The light emitting diode of claim 1,
wherein at least one light emitting cell includes a via-hole formed through the second conductivity type semiconductor layer and the active layer to expose the first conductivity type semiconductor layer, and the connector is electrically connected to the first conductivity type semiconductor layer of the light emitting cell through the via-hole.

9. The light emitting diode of claim 1,
wherein a first conductivity type semiconductor layer of at least one light emitting cell has a region extended beyond the second conductivity type semiconductor layer and the active layer and exposed, and the connector is electrically connected to the exposed region.

10. The light emitting diode of claim 1,
wherein the upper insulation layer covers a region between an edge of the substrate and the light emitting cells, and a distance from an edge of the upper insulation layer to the connector is 15 μm or more.

11. The light emitting diode of claim 1,
wherein the plurality of floating reflection layer is formed of the same material as the one or more connectors and the first and second pad metal layers.

12. The light emitting diode of claim 11,
wherein the plurality of floating reflection layer includes a floating reflection layer covering a region between two adjacent light emitting cells.

13. The light emitting diode of claim 12,
wherein each connector is electrically connected to the first conductivity type semiconductor layer of each light emitting cell associated with each connector, and each connector comprises at least two segments to pass through an upper edge of the first conductivity type semiconductor layer, and
wherein the floating reflection layer covering the region between the two light emitting cells is disposed between the two segments.

14. The light emitting diode of claim 11,
wherein the plurality of floating reflection layer includes a floating reflection layer disposed along an edge of the substrate and covering the first conductivity type semiconductor layer of at least one light emitting cell.

15. The light emitting diode of claim 1,
wherein each connector directly contacts the first conductivity type semiconductor layer and the ohmic reflection layer exposed through the first opening and the second opening of the lower insulation layer.

16. The light emitting diode of claim 1,
wherein the lower insulation layer has morphologies different in elevation depending on locations of the light emitting cells, and
wherein each connector is arranged to have different elevations along a morphology of the lower insulation layer.

17. The light emitting diode of claim 16,
wherein a portion electrically connected to the first conductivity type semiconductor layer among portions of each connector is placed at a lowest elevation with reference to the substrate.

18. A light emitting diode comprising:
a substrate;
a plurality of light emitting cells each including a first conductivity type semiconductor layer, an active layer, and a second conductivity type semiconductor layer;
an ohmic reflection layer disposed on the second conductivity type semiconductor layer of each of the light emitting cells to form ohmic contact therewith;
a lower insulation layer covering the light emitting cells and the ohmic reflection layers, the lower insulation layer having a first opening exposing the first conductivity type semiconductor layer and a second opening exposing the ohmic reflection layer of each of the light emitting cells;
one or more connectors disposed on the lower insulation layer and electrically connecting adjacent light emitting cells to each other to form a series array of light emitting cells;
a first pad metal layer electrically connected to the first conductivity type semiconductor layer of a last light emitting cell disposed at a last terminal of the series array through the first opening of the lower insulation layer;
a second pad metal layer electrically connected to the ohmic reflection layer of a first light emitting cell disposed at a first terminal of the series array through the second opening of the lower insulation layer;
an upper insulation layer covering the one or more connectors and the first and second pad metal layers, the upper insulation layer having a plurality of openings exposing upper surfaces of the first and second pad metal layers, respectively;
at least one floating reflection layer disposed on the lower insulation layer, and covered by the upper insulation layer, and
a first bump pad and a second bump pad connected to upper surfaces of the first pad metal layer and the second pad metal layer exposed through the openings of the upper insulation layer, respectively,
wherein the one or more connectors comprise:
a first connector associated with the first light emitting cell which is connected in series with a second light emitting cell and the first connector passes one edge of the first light emitting cell and extends to an upper region of the second light emitting cell adjacent to the first light emitting cell, and
wherein each floating reflection layer is insulated from the first pad metal layer, the second pad metal layer and the one or more connectors;

wherein the second pad metal layer is surrounded by the first connector electrically connected to the first conductivity type semiconductor layer and the ohmic reflection layer of the first light emitting cell;

wherein the at least one floating reflection layer is formed of the same material as the one or more connectors and the first and the second pad metal layers; and the at least one floating reflection layer includes a floating reflection layer disposed along an edge of the substrate and covering the first conductivity type semiconductor layer of at least one light emitting cell;

wherein a floating reflection layer associated with the first light emitting cell surrounds three sides of the first light emitting cell.

* * * * *